United States Patent
Wood

(10) Patent No.: US 7,609,756 B2
(45) Date of Patent: Oct. 27, 2009

(54) ROTARY CLOCK FLASH ANALOG TO DIGITAL CONVERTER SYSTEM AND METHOD

(75) Inventor: John Wood, Wellingborough (GB)

(73) Assignee: Multigig Inc., Scotts Valley, CA (US)

( * ) Notice: Subject to any disclaimer, the term of this patent is extended or adjusted under 35 U.S.C. 154(b) by 0 days.

(21) Appl. No.: 12/042,322

(22) Filed: Mar. 4, 2008

(65) Prior Publication Data
US 2008/0272952 A1 Nov. 6, 2008

Related U.S. Application Data

(63) Continuation of application No. 11/616,263, filed on Dec. 26, 2006, now abandoned.

(60) Provisional application No. 60/754,224, filed on Dec. 27, 2005, provisional application No. 60/754,778, filed on Dec. 28, 2005.

(51) Int. Cl.
H03M 1/12 (2006.01)
(52) U.S. Cl. .................................. 375/155; 331/17
(58) Field of Classification Search ................ 341/155, 341/118, 137, 122, 139, 164, 157; 250/226; 330/310; 438/70
See application file for complete search history.

(56) References Cited

U.S. PATENT DOCUMENTS

| | | |
|---|---|---|
| 2,801,281 A | 7/1957 | Oliver et. al |
| 2,872,670 A | 2/1959 | Dickinson et al. |
| 3,516,021 A | 6/1970 | Kohn |
| 3,538,450 A | 11/1970 | Andrea et al. |
| 4,246,550 A | 1/1981 | Cohen |
| 4,514,707 A | 4/1985 | Dydyk et al. |
| 4,686,407 A | 8/1987 | Ceperley |
| 4,749,963 A | 6/1988 | Makimoto et al. |
| 4,875,046 A | 10/1989 | Lewyn |

(Continued)

FOREIGN PATENT DOCUMENTS

DE 4322701 8/1994

(Continued)

OTHER PUBLICATIONS

International Search Report from PCT/US06/62626 dated Feb. 15, 2008.

(Continued)

Primary Examiner—Peguy JeanPierre
(74) Attorney, Agent, or Firm—IPxLaw Group LLP

(57) ABSTRACT

System and method for converting an analog voltage to a digital signal. The system includes an input voltage sampler, a ramp generator, a comparator, a time-to-digital converter (TDC), and a multiphase oscillator, preferably a rotary traveling wave oscillator, that provides the critical system timing. The phases of the multiphase oscillator define a sampling interval during which the input voltage is sampled and held and a conversion interval during which the ramp generator, comparator, and TDC operate to convert the sampled voltage to the digital signal. The TDC samples at times provided by the phases of the multiphase oscillator to form the bits of the digital signal. The sampler, ramp generator, and comparator can be constructed from multiple fragments, one of which is selectable for calibration while the rest of the fragments are joined for normal operation. Multiple converters can be interleaved to increase the sampling rate.

23 Claims, 37 Drawing Sheets

U.S. PATENT DOCUMENTS

| | | | |
|---|---|---|---|
| 4,998,109 | A | 3/1991 | LeChevalier |
| 5,117,206 | A | 5/1992 | Imamura |
| 5,235,335 | A | 8/1993 | Hester et al. |
| 5,248,970 | A | 9/1993 | Sooch et al. |
| 5,361,277 | A | 11/1994 | Grover |
| 5,396,247 | A | 3/1995 | Watanabe et al. |
| 5,493,715 | A | 2/1996 | Humphreys et al. |
| 5,584,067 | A | 12/1996 | Buer et al. |
| 5,640,112 | A | 6/1997 | Goto et al. |
| 5,652,549 | A | 7/1997 | Unterricker et al. |
| 5,754,833 | A | 5/1998 | Singh et al. |
| 5,793,709 | A | 8/1998 | Carley |
| 5,825,211 | A | 10/1998 | Smith et al. |
| 5,886,660 | A | 3/1999 | Loewenstein |
| 5,945,847 | A | 8/1999 | Ransijn |
| 5,963,086 | A | 10/1999 | Hall |
| 5,973,633 | A | 10/1999 | Hester |
| 5,976,633 | A | 11/1999 | Mosier |
| 6,002,274 | A * | 12/1999 | Smith et al. ............... 327/19 |
| 6,078,202 | A | 6/2000 | Tomatsuri et al. |
| 6,133,798 | A | 10/2000 | Nagano et al. |
| 6,239,663 | B1 | 5/2001 | Mizutani |
| 6,259,327 | B1 | 7/2001 | Balistreri et al. |
| 6,346,901 | B1 | 2/2002 | Aiura et al. |
| 6,356,218 | B1 * | 3/2002 | Brown et al. ............... 341/120 |
| 6,429,693 | B1 | 8/2002 | Staszewski et al. |
| 6,556,089 | B2 | 4/2003 | Wood |
| 6,636,122 | B2 | 10/2003 | Tsyrganovich |
| 6,683,503 | B2 | 1/2004 | Mizuno et al. |
| 6,707,411 | B1 * | 3/2004 | Poulton et al. ............. 341/155 |
| 2003/0018452 | A1 | 1/2003 | Mawet |
| 2003/0098731 | A1 | 5/2003 | Tabatabaei et al. |
| 2004/0196939 | A1 * | 10/2004 | Co ........................... 375/376 |
| 2004/0219898 | A1 | 11/2004 | Bult et al. |

FOREIGN PATENT DOCUMENTS

| | | |
|---|---|---|
| EP | 0478134 | 4/1992 |
| EP | 0583839 | 2/1994 |
| EP | 0633662 | 6/1994 |
| EP | 0696843 | 2/1996 |
| EP | 0891045 | 1/1999 |
| GB | 1247199 | 9/1971 |
| GB | 2092846 | 8/1982 |
| WO | 9512263 | 5/1995 |
| WO | 0044093 | 7/2000 |
| WO | 30069452 | 8/2003 |

OTHER PUBLICATIONS

Maatta et al., 1998, "A High-Precision Time-to-Digital Converter for Pulsed Time-of-Flight Laser Radar Applications," IEEE Instrum. Meas., 47(2):521-536.

Wood et al., 2001, "Rotary Traveling-Wave Oscillator Arrays: A New Clock Technology," IEEE J. Solid-State Circuits, 36(11): 1654-1665.

European Supplementary Search Report from EP 05777293.1 (European application corresponding to PCT/US2005126990) dated Feb. 20, 2008.

PCT International Search Report from PCT/US2005/26990 dated Jun. 28, 2006.

A 20-Bit (1 ppm) Linear Slope-Integrating Aid Converter, National Semiconductor Application Note 260, Jan. 1981, (1995).

Bussmann, M. et al. (1992). "Active Compensation of Interconnect Losses for Multi-GHz Clock Distribution Networks," IEEE Transactions on Circuits and Systems -II: Analog and Digital Signal Losses for Multi-GHz Clock Processing, vol. 39(11): 790-798.

Deutsch, Alena et al., "Modeling and characterization of long on-chip interconnections for high- performance microprocessors" IBM J Res. Develop. vol. 39, No5, Sept 1995, pp. 547-567 (p. 549).

Divina et al., "The Distributed Oscillator at 40HZ," May 1998, pp. 1-4, IEEE.

Dunning, Jim, "An All-Digital Phase-Locked Loop with 50-Cycle Lock Time Suitable for High-Performance Microprocessors, "IEEE Journal of Solid-State Circuits, vol. 30, No. 4, Apr. 1995, pp. 412-422.

EE247 Lecture 16: Data Converters, 2004 H.K pp. 1-60.

H. Wu and A Hajimiri, "A 10GHz CMOS Distributed Voltage Controlled Oscillator," Proc. of IEEE Custom Integrated Circuits Conference, pp. 581-584, May 2000.

Hall, L. et al. (1997). "Clock Distribution Using Cooperative Ring OsciJlators,m " Proceedings of the 17th Conference on Advanced Research in VLSI, Ann Arbor, MI (Sep. 15-16, 1997 pp. 62-75.).

Hatsuhiro Kato: "A Dynamic Formulation of Ring Oscillator as Solitary-Wave Propagator," IEEE Transactions on Circuits and Systems-I: Fundamental Theory and Applications, vol. 45, No. I, Jan. 1998 (1998-0 I), pp. 98-10 I, XP002168328, the whole document.

Nagashino et al.: "Generation of Traveling Wave Mode in a Chained Neural Oscillator Network Model," Proceedings of the International Conference on Neural Networks, (ICNN), US, New York, IEEE, vol. -, Mar. 28, 1993 (Mar. 28, 1993), pp. 1550-1557, XP000379507, IS8N: 0-7803-0999-5, the whole document.

International Search Report for PCT/GB01/02069, Jul. 9, 2001.

International Search Report: ref: Pct/GB02/05514, Jan. 29, 2004.

Kim et al., "ISSCC 2000/Session 26/Analog TechniqueS/Paper WP 26.3," 2000, pp. 430-431 & 475,2000 IEEE International Solid-State Circuits Conference.

Kleveland et al., "Mp 4.3 Monolithic CMOS Distributed Amplifier and Oscillator," 1999,9 pages, 1999 IEEE International Solid-State Circuits Conference.

Kleveland, B. et al. (1998). "50GHz Interconnect Design in Standard Silicon Technology," IEEE Standard Silicon Technology, IEEE MIT-S International Microwave Symposium Digest 3:1913-1916.

Kleveland, B. et al. (1999). Line Inductance Extraction and Modeling in a Real Chip With Power Modeling in a Real Chip With Power.

Kral, A., Behbahani, F., and Abidi, A.A., "RF-CMOS Oscillators with Switched Tuning," Proceedings of the IEEE 1998 Custom Illtegrated Circuits Conference, pp. 555-558.

Larrson, H. (1997). "Distributed Synchronous Clocking Using Connected Ring Oscillators,"Master's Thesis in Computer Systems Engineering, Centre for Computer System Architecture, Halmstad University: Halmstad, Sweden 43 pages.

Miller, Brian, "A Multiple Modulator Fractional Divider, "IEEE Transactions on Instrumentations and Measurement, vol. 40, No. 3, Jun. 1991, pp. 578-583.

MultiGiG Ltd: Rotary Explorer VO. 5 User'S Ouide, 'online' Apr. 28, 2001, pp. 1-33.

Porat, Dan I, "Review of Sub-Nanosecond Time-Interval Measurement,"IEEE Trans. on Nuclear Sci, vol. NS-20, No. 5, p. 36-51 (1973).

Patent Abstracts of Japan, vol. 010, No. 079 (E-391), Mar. 28, 1986 (Mar. 28, 1986), & JP60224205 A (OKI DENKI KOOYO KK), Nov. 8, 1985 (Nov. 11, 1985) abstract.

Patent Abstracts of Japan, vol. 016, No. 465 (E-1270), Sep. 28, 1992 (Sep. 28, 1992) & JP 04 165809 A (NEC Corp), Jun. 11, 1992 (Jun. 11, 1992) abstract.

Skvor et al., "Novel decade electronically tunable microwave oscillator based on the distributed ampllifier," IEEE Explore, Aug. 3, 1992, vol. 28, Issue 17 Abstract.

Wood, John et ai, "Rotary traveling-wave oscillator arrays: a new clock technology," IEEE Journal of Solid-State Circuits Conference. Digest of Technical Papers, San Francisco, CA USA, Feb 5-7, 2001. vol. 36. No. II, pp. 1654-1665.

Wu et aL, "A 10GHz CMOS Distributed Voltage Controlled Oscillatorl," 4 pages, submitted to the Department of Electrical Engineering, California Institute of Technology.

Yue, P.C. et al. (1998). "On-Chip Spiral Inductors with Patterned Oround Shields for Si-Based RF IC's," IEEE Journal of Solid-State Circuits 33(5): 743-752.

* cited by examiner

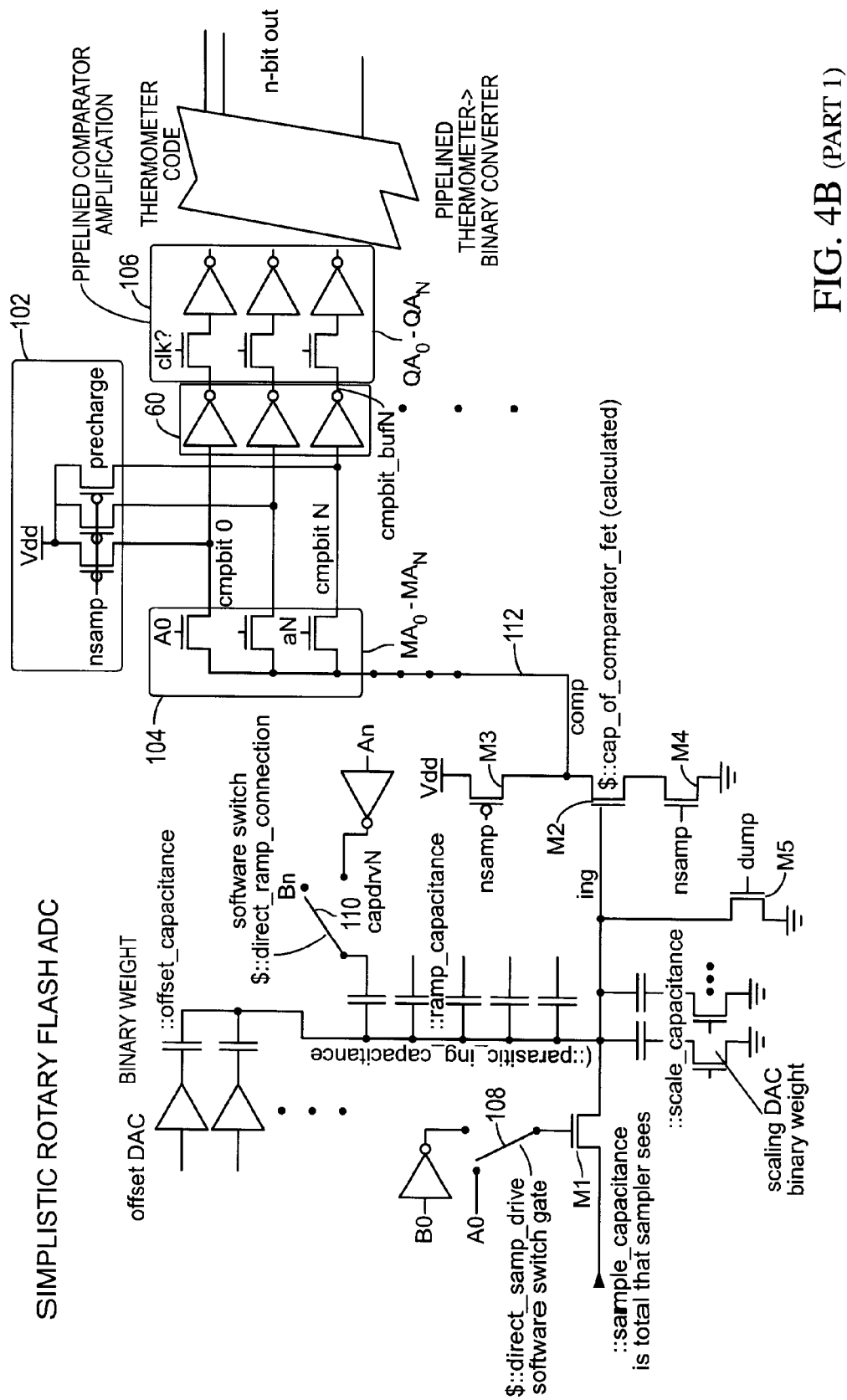
FIG. 4B (PART 1)

FIG. 4B (PART 2)

NOTE, A0=samp, B0=nsamp with links in spice

A0 samp
nsamp B0

THRESHOLD
TIME DEPENDS ON vin SAMPLED ing vin
linear ramp
comp

TIME TO DIGITAL OPERATION:
(EXAMPLE OF 20 PHASE RING)

A0 samp
comp sample period
convert period

FALLING EDGES CAPTURE COMP INTO DIFFERENT BUCKETS
EACH SIGNAL FOLLOWS COMP DOWN FOR A WHILE UNTIL GATE TURNS OFF
cmpbit0..3 = Vdd BECAUSE GATES TURNED OFF BEFORE COMP FELL
cmpbit4
cmpbit5
cmpbit6
cmpbit7
cmpbit8..10 = 0v BECAUSE GATES WERE HIGH FOR THE WHOLE OF THE FALL PERIOD OF COMP SIGNAL threshold for the cmpbit_buf inverters

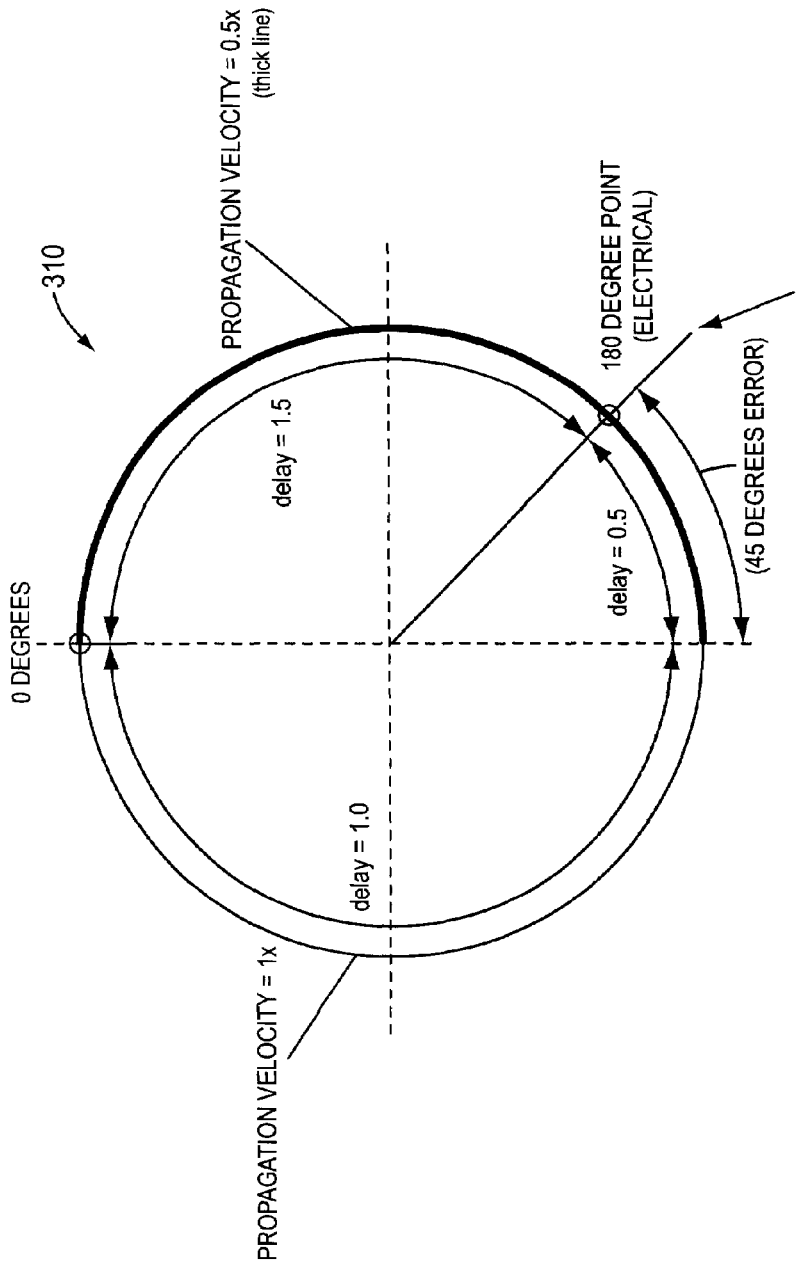

FIG. 7A

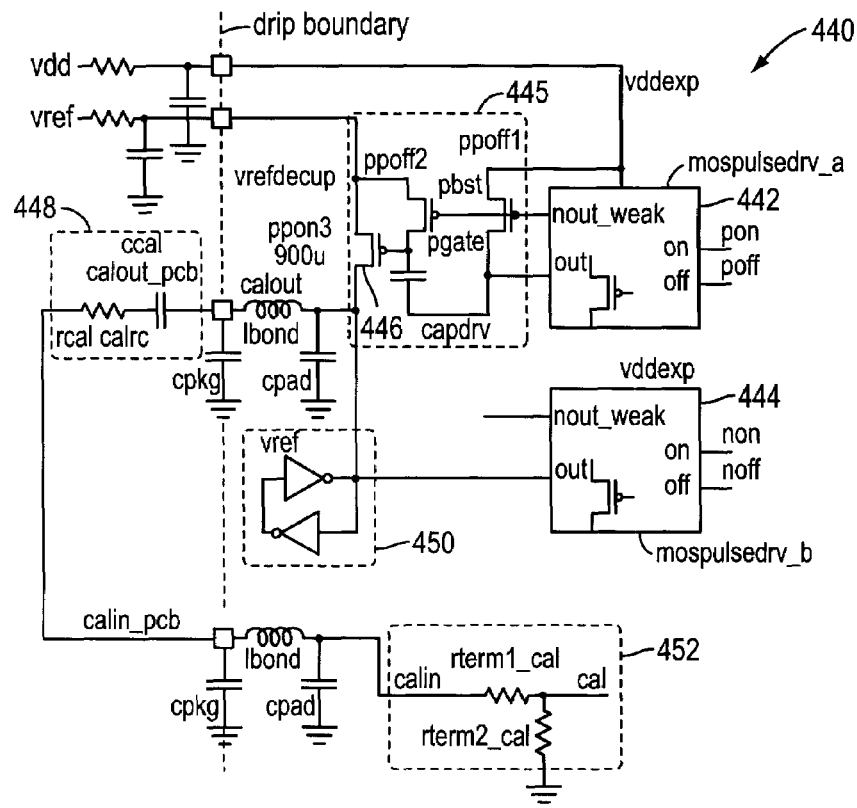
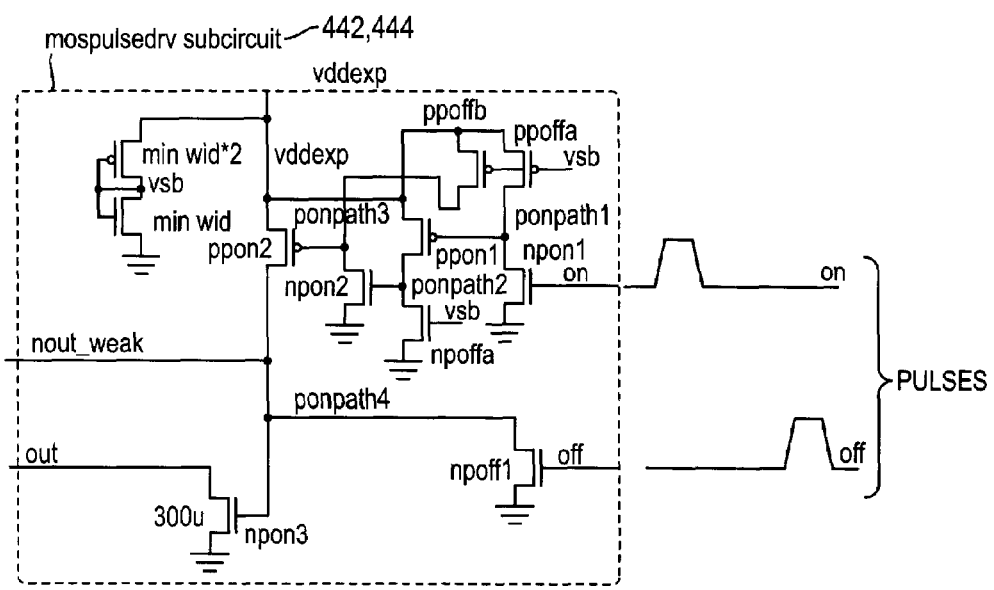
FIG. 7C (Part 1)

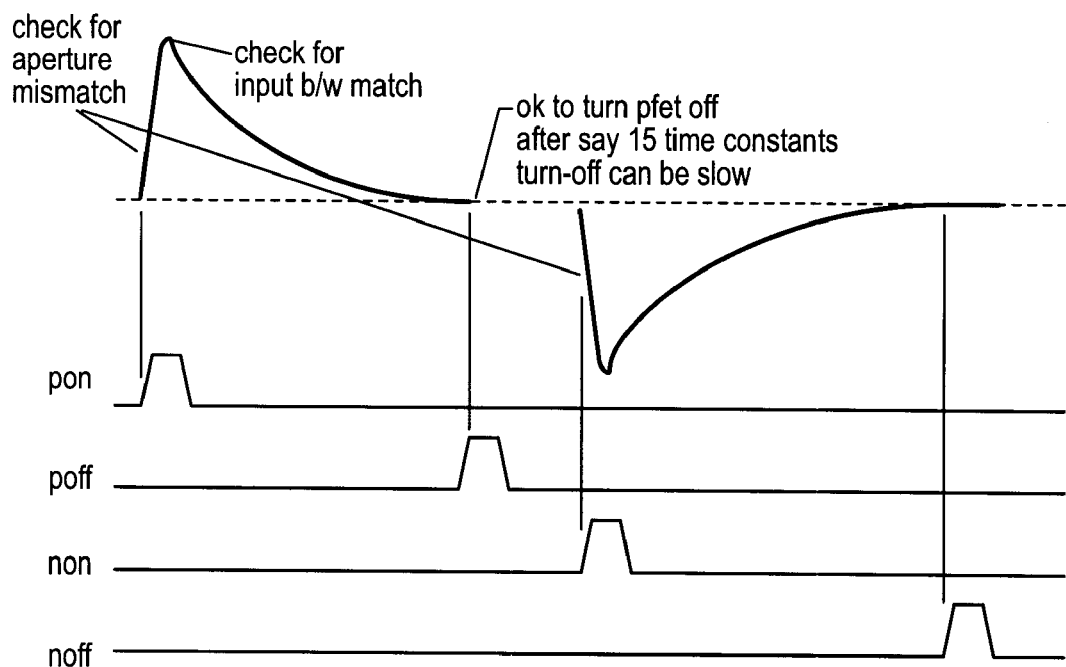
FIG. 7C (Part 2)

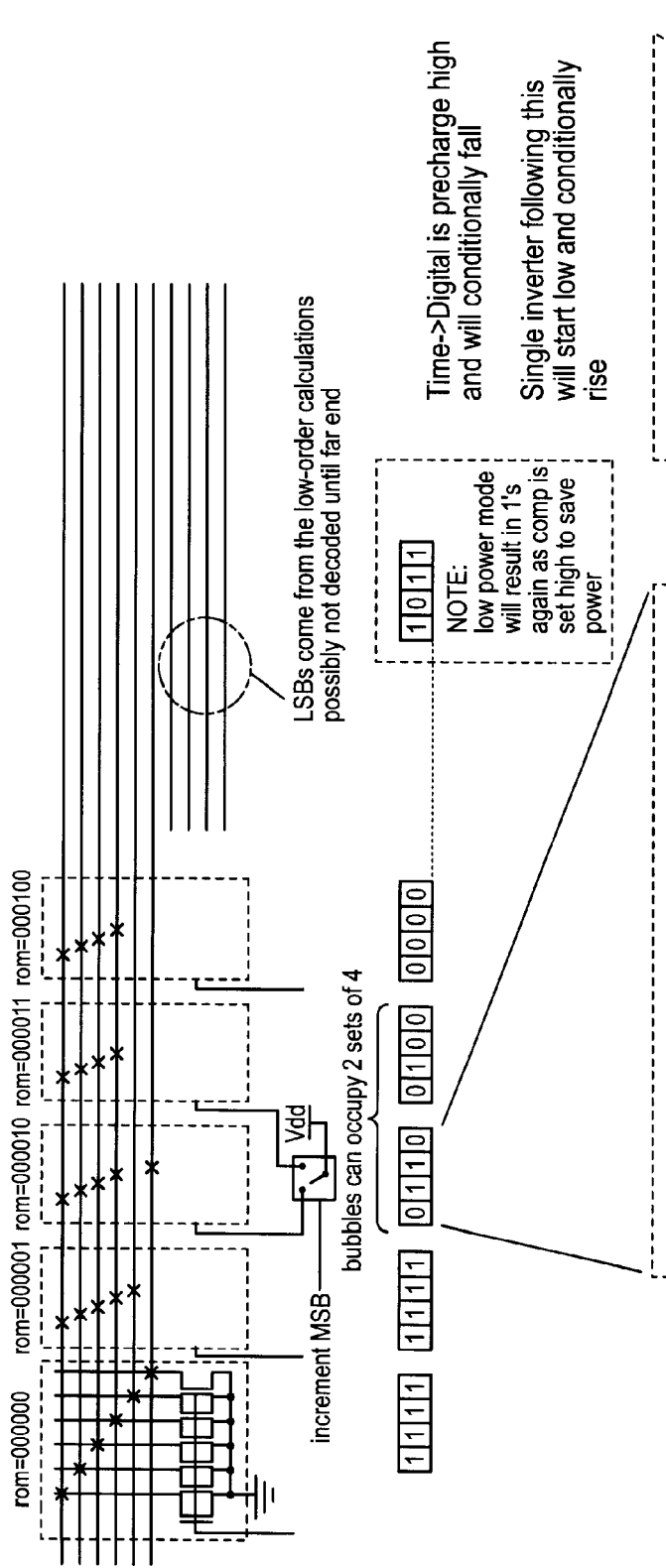
FIG. 14 (Part 1)

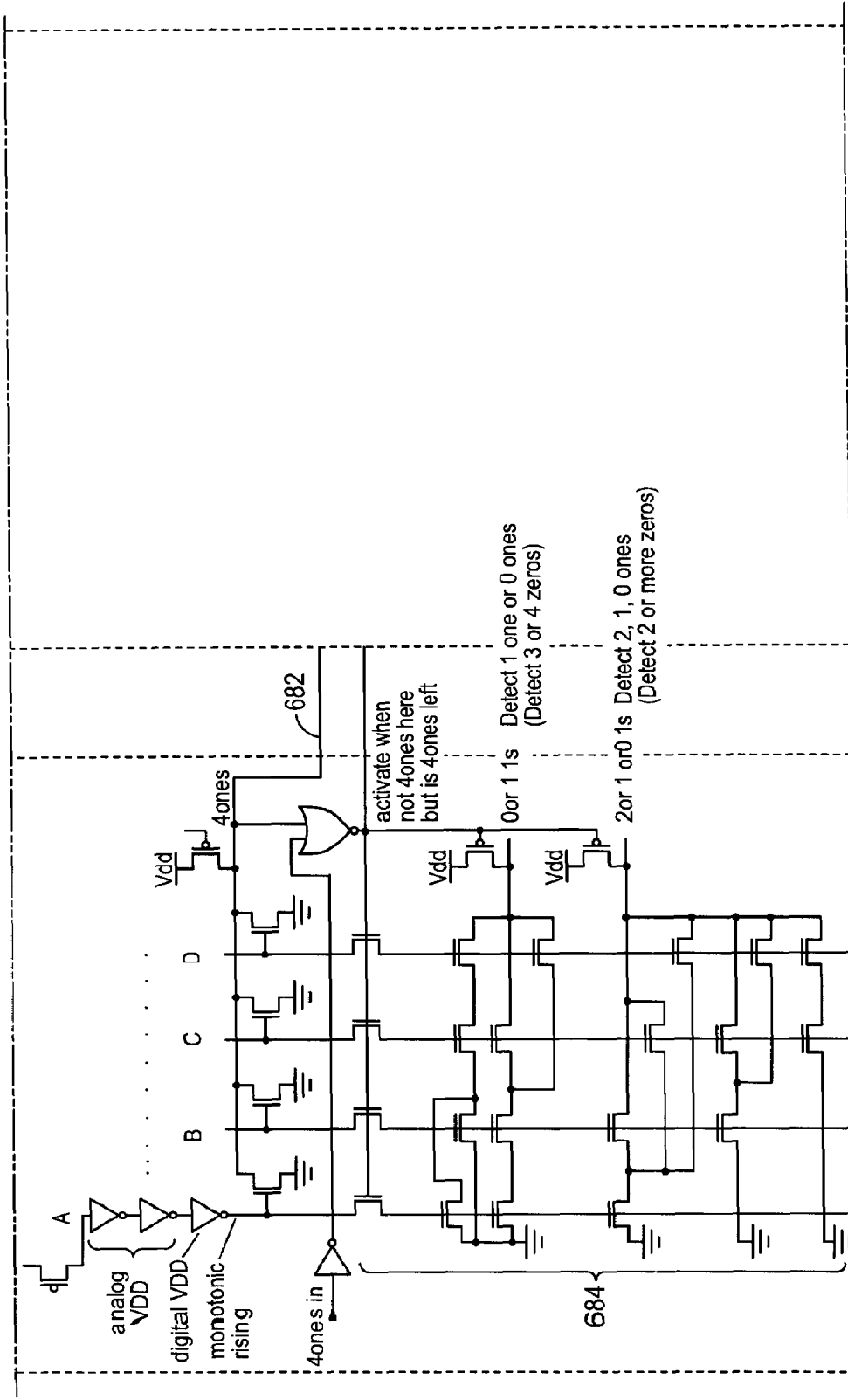
FIG. 14 (Part 2)

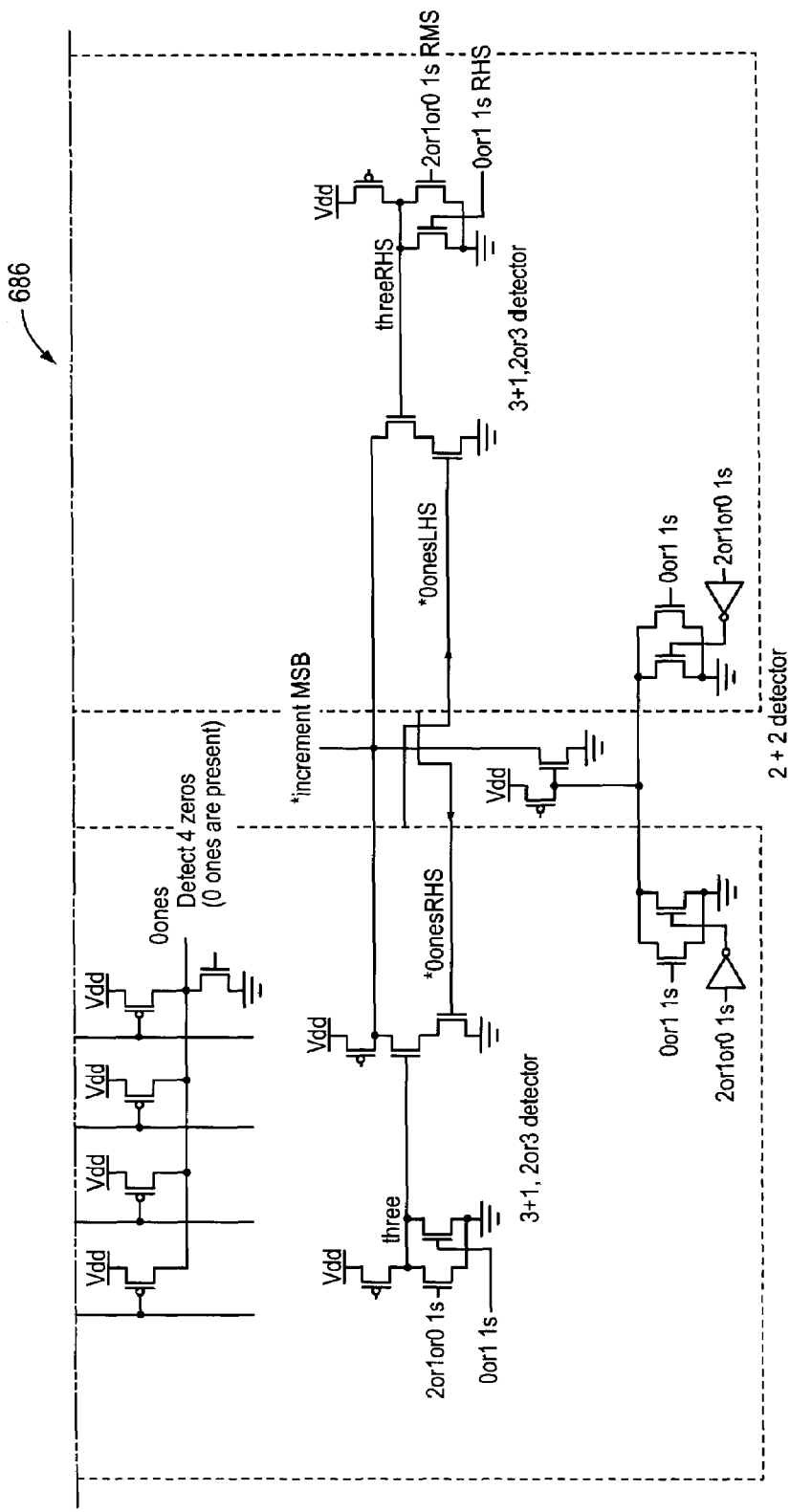
FIG. 14 (Part 3)

688

| ABCD | *A*B*C*D | (number of 1's) |
|---|---|---|
| 0000 | 1111 | 0 |
| 0001 | 1110 | 1 |
| 0010 | 1101 | 1 |
| 0011 | 1100 | 2 |
| 0100 | 1011 | 1 |
| 0101 | 1010 | 2 |
| 0110 | 1001 | 2 |
| 0111 | 1000 | 3 |
| 1000 | 0111 | 1 |
| 1001 | 0110 | 2 |
| 1010 | 0101 | 2 |
| 1011 | 0100 | 3 |
| 1100 | 0011 | 2 |
| 1101 | 0010 | 3 |
| 1110 | 0001 | 3 |
| 1111 | 0000 | 4 |

| (number of 1's) | *0ones | 0or1 1s | 2or1or0 1s |
|---|---|---|---|
| 0 | 0 | 1 | 1 |
| 1 | 1 | 1 | 1 |
| 2 | 1 | 0 | 1 |
| 3 | 1 | 0 | 0 |
| ~~4~~ | ~~1~~ | ~~0~~ | ~~0~~ | addition
0 + 0 = 0 =  0 0 0
0 + 1 = 1 =  0 0 1
0 + 2 = 2 =  0 1 0
0 + 3 = 3 =  0 1 1
1 + 0 = 1 =  0 0 1
1 + 1 = 2 =  0 1 0
1 + 2 = 3 =  0 1 1
1 + 3 = 4 =  1 0 0
2 + 0 = 2 =  0 1 0
2 + 1 = 3 =  0 1 1
2 + 2 = 4 =  1 0 0
2 + 3 = 5 =  1 0 1
3 + 0 = 3 =  0 1 1
3 + 1 = 4 =  1 0 0
3 + 2 = 5 =  1 0 1
3 + 3 = 6 =  1 1 0

FIG. 14 (Part 4)

ROTARY CLOCK FLASH ANALOG TO DIGITAL CONVERTER SYSTEM AND METHOD

CROSS-REFERENCE TO RELATED APPLICATIONS

This application is a continuation of and claims the benefit of U.S. patent application Ser. No. 11/616,263, filed Dec. 26, 2006, titled "ROTARY CLOCK FLASH ANALOG TO DIGITAL CONVERTER SYSTEM AND METHOD," which claims priority to two U.S. Provisional Applications, Ser. Nos. 60/754,224, filed Dec. 27, 2005, and titled "ROTARY CLOCK FLASH ANALOG TO DIGITAL CONVERTER SYSTEM AND METHOD," and 60/754,778, filed Dec. 28, 2005, and titled "ROTARY CLOCK FLASH ANALOG TO DIGITAL CONVERTER SYSTEM AND METHOD."

This application is related to U.S. application Ser. No. 11/191,231, filed Jul. 26, 2005, and titled "ROTARY FLASH ADC," which is incorporated by reference into the present application.

This application incorporates provisional U.S. Application 60/716,552, titled "SERIALIZER DESERIALIZER," Filed Sep. 12, 2005, into the present application.

FIELD OF THE INVENTION

The present invention relates generally to analog to digital converters and more particularly to single slope converters.

DESCRIPTION OF THE RELATED ART

Previous single-slope ADCs are extremely simple; they just turn the unknown analog quantity into a pulse width using a pulse-width modulator PWM (comprising a linear ramp and a voltage comparator 10, shown in FIG. 1) and then measure the length of the pulse digitally, typically by using a fast-running counter driven from a high speed clock. Prior art single slope ADCs have been limited by the speed of the counter as can be seen from the following example. If the conversion rate is 1 G sample per second (1 Gsps) and there are ten bits per sample, then the counter speed must be about 1 TeraHertz (1 THz). Obviously, such a counter is not feasible at this time and even if such a counter could be constructed, it would use too much power.

BRIEF SUMMARY OF THE INVENTION

With a multiphase clock such as a rotary clock, an effective 1 THz (1 pS time resolution) is available at low power by using multiple taps of the rotary clock and building a Time-to-Digital converter (TDC).

The present invention allows 2 Gsps, 8 or 9 bit ADC operation with 4 GHz input bandwidth to be fabricated on 0.18 μm standard CMOS at 1.8 v single-supply in around 2 mm². The supply current is less than about 100 mW, including on-chip clock generators and about 200 mW when SERDES interfaces are included. To operate at 8 GSps, four converters are interleaved; these four converters occupy about 6 mm and provide the 8 GSps rate at less than 1 Watt, including I/O circuitry. The input impedance is 50 ohms with ±500 mV full scale voltage range.

One embodiment of the present invention is a system for converting an analog signal to a digital signal. The system includes a multiphase oscillator, a sample and hold circuit, a ramp generator, a comparator and a time-to-digital converter. The multiphase oscillator has a period of oscillation and provides a plurality of phase signals, where each signal oscillates at the period of the multiphase oscillator. The sample and hold circuit is operative to capture during a sampling interval an analog signal in response to a phase signal of the multiphase oscillator and to hold the sampled analog signal at the end of the sampling interval. The ramp generator is connected to the output of the sample and hold circuit at a ramp node and is operative to generate a ramp signal that starts at the voltage of the held analog signal. The comparator provides a transition in an output signal when the ramp signal exceeds the reference voltage during a conversion interval that follows the sampling interval. The time-to-digital converter is connected to the output of the comparator and is operative, during the conversion interval, to sample, using phase signals of the multiphase oscillator, the comparator output signal and to convert the comparator output signal to a multi-bit digital signal.

Another embodiment of the present invention is a method for converting an analog signal to a digital signal. The method includes (i) sampling and holding the analog signal in response to one of a number of phase signals of a multiphase oscillator, (ii) after holding the analog signal, generating a ramp signal starting at the voltage of the held analog signal, comparing the ramp signal to a voltage reference and providing a transition of a comparison signal when the ramp signal exceeds the voltage reference, and converting the comparison signal to a multi-bit digital signal by sampling the comparison signal with phases of the multiphase oscillator.

Yet another embodiment of the present invention is a sample and hold circuit which includes an input attenuator, a capacitor, a sampling transistor, a precharge/discharge circuit and a source follower circuit. The input attenuator is connected between an input signal to be sampled and a first reference voltage and having first and second attenuated signal output. The capacitor is used for holding a sampled signal and has one electrode connected to the first reference voltage. The sampling transistor has its channel connected between the second signal output of the input attenuator and the other electrode of holding capacitor. The precharge/discharge circuit is connected between the first and second supply voltages, and has an output connected to the gate of the sampling transistor and an input connected to a signal defining a sampling interval. The precharge/discharge circuit pulls the gate of the sampling transistor towards a second supply voltage during the sampling interval and discharges the gate of the sampling transistor to the first supply voltage otherwise. The source follower circuit has an enable input connected to enabling signal that is activated slightly before the beginning of the sampling interval and deactivated slightly before the end of the sampling interval. The source follower circuit is connected between the first signal output of the input attenuator and the gate of the sampling transistor so that the gate of the sampling transistor follows the voltage of the first output when the source follower circuit is enabled.

ADVANTAGES OF THE PRESENT INVENTION

Aperture jitter in the sampling circuitry is low. Integrated phase-noise plots of even the lowest power 15 mW rotary clocks show about 75 femtoseconds RMS of jitter without buffers needed.

The single slope converter inherently simple and monotonic.

The present invention approximates a flash architecture but uses time instead of voltage as the measurement method. It moves the precision and linearity needed from the voltage and into the time domain, providing apparent voltage gain in the process and is therefore less sensitive to process threshold and voltage variations. A low impedance time reference is furnished at low power with rotary clock and the 'circular constraint' give a better linearity reference than any resistor ladder can achieve.

The time-based architecture minimizes comparator power consumption by driving most of the comparators with the rail to rail inputs (where CMOS has the lowest power) and the few comparators, which are linear-mode only, stay in this mode for a fraction of a converter cycle.

The present invention is easy to calibrate with respect to offset and gain. The core of the converter is basic in that it has only one input (VIN) and one output (comparator output) so that it is possible to fragment and interleave to achieve continuous self-calibration, which entirely reduces noise and drift susceptibility. By careful organization, any cross-coupling between calibrating fragment and a converting fragment can be negligible. Methods are outlined to do fully digital calibration using capacitive DACs, thus avoiding the need for high power analog bias currents or voltages. Linearity calibration at the midpoint of the converter or at multiple points of the response is also practical.

Pipelining of the comparator gain stages (using rotary clocks) can break the fT comparator ambiguity barrier so that only a modest fT is needed.

All digital PLLs are a natural by-product of the present invention. The PLLs phase lock the ADC to an external crystal reference and take care of any "close-in" phase noise. The loop filter is also digital and thus programmable and insensitive to process variation.

The present invention is extendable into higher-bit, lower-rate applications, with a maximum perhaps of about 12 bits. The time-to-digital clock jitter requirement tracks approximately with the aperture jitter requirement.

The I/O power required, because of the number of bits of resolution, can be overcome by the use of a multi-lane serializer/deserializer (SERDES) function implemented at low power with rotary clocks.

The present invention is easily adapted to an integrated circuit. No complex process modifications are needed, though the use of bipolar junction transistors (BJTs) and SiGe would improve the implementation. The present invention can operate at low VDD supply voltages such as 0.9 V in a 65 nm process, as most of the circuitry is either switched or dynamic, i.e., forced to switch one way or another within a short amount of time, thereby minimizing noise susceptibility.

BRIEF DESCRIPTION OF THE DRAWINGS

These and other features, aspects and advantages of the present invention will become better understood with regard to the following description, appended claims, and accompanying drawings where:

FIGS. 4A and 4B show a more complex implementation of an ADC in accordance with an embodiment of the present invention;

FIG. 5 shows a diagram illustrating the immunity of the rotary oscillator to unequal propagation velocities on the ring;

FIG. 7A shows a diagram illustrating the self-calibration circuitry in an embodiment of the present invention;

FIG. 7C shows an alternative embodiment of the exponential ramp generator for calibration of the ADC;

FIG. 14 illustrates a thermometer decoder in accordance with an embodiment of the present invention;

DETAILED DESCRIPTION OF THE INVENTION

Figure 1:
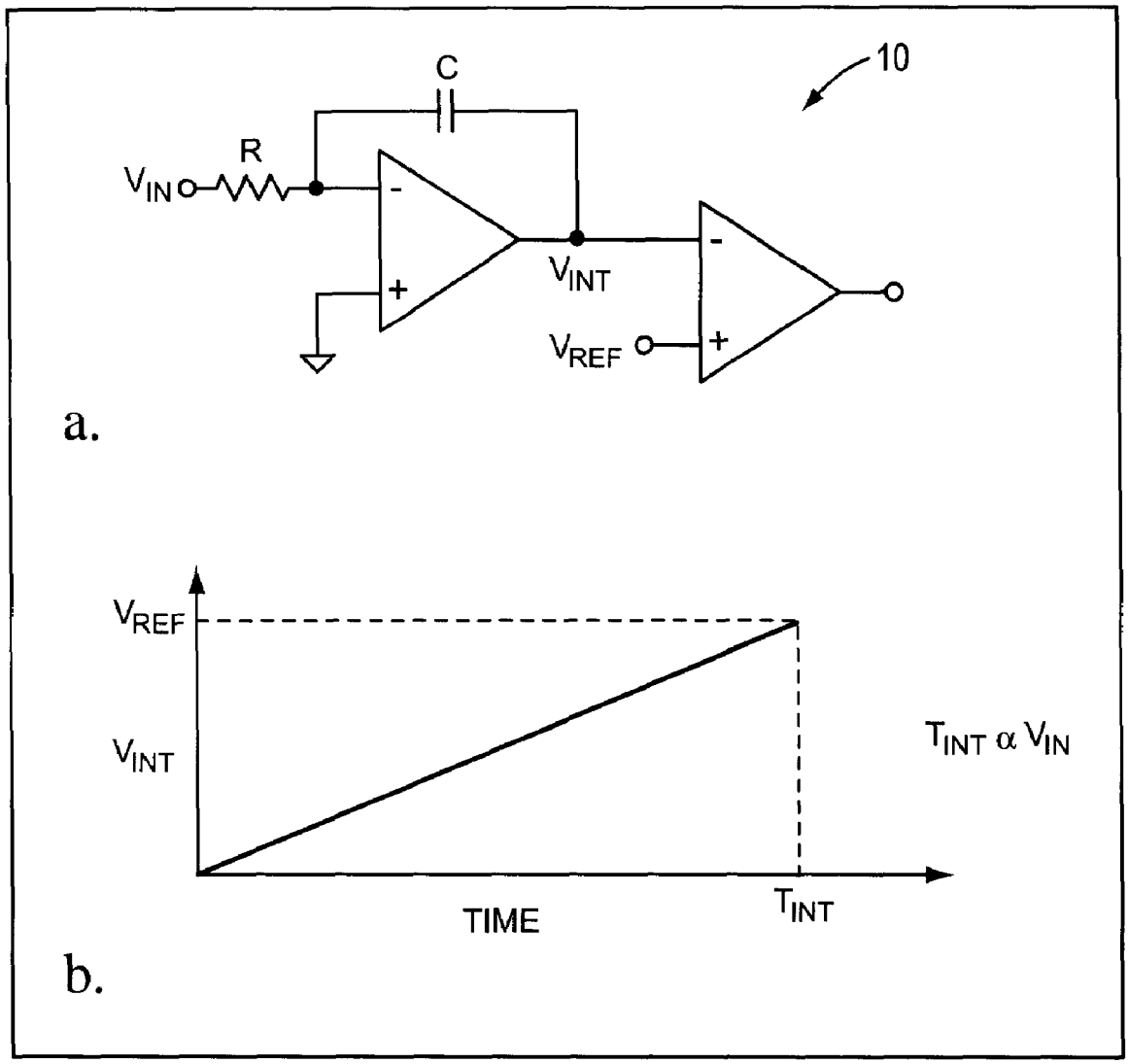
FIG. 1 shows a prior art ADC.
Figure 2A:
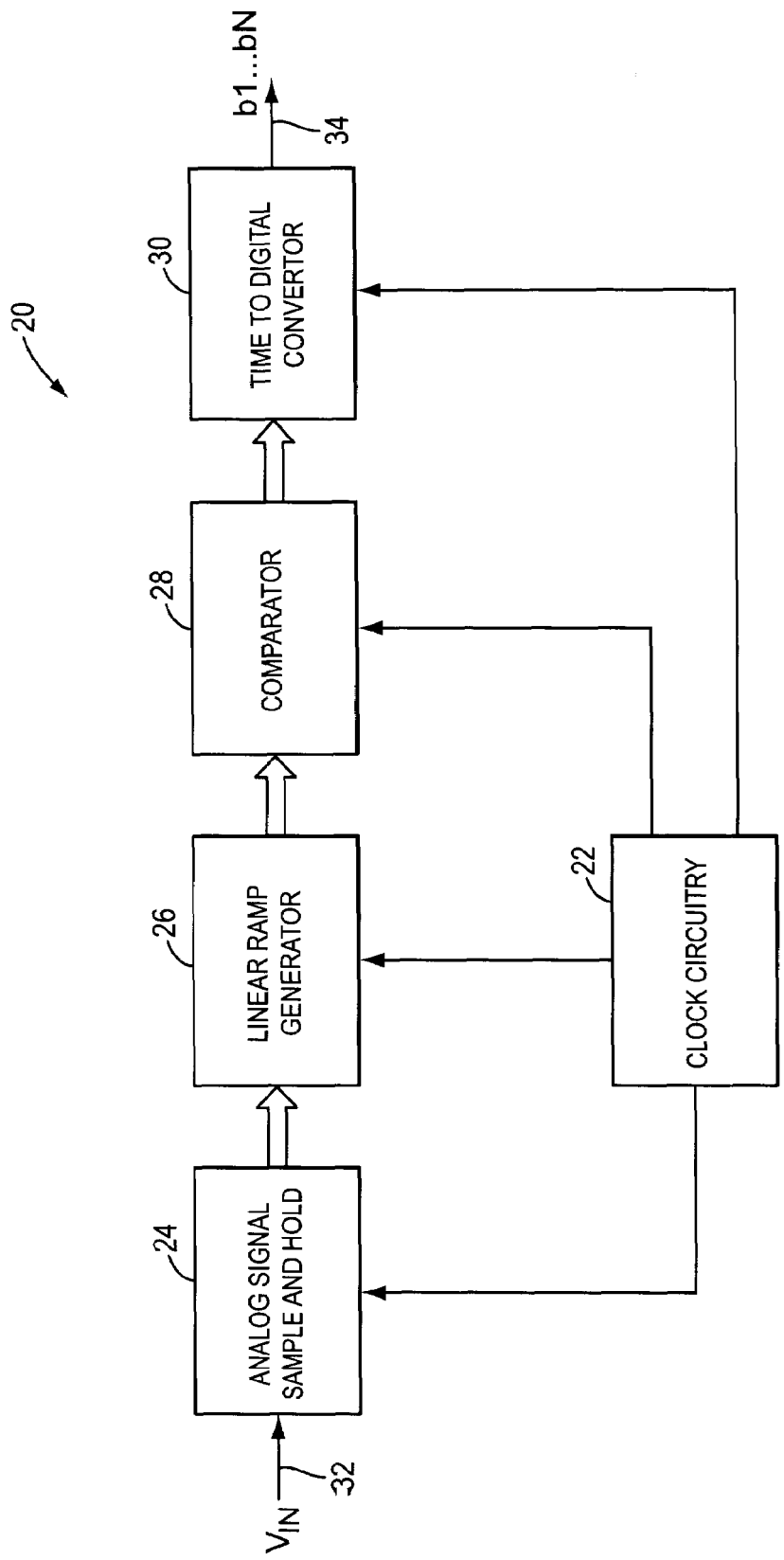
FIG. 2A shows an embodiment in block diagram form the ADC of the present invention.

FIG. 2A shows an embodiment 20 in block diagram form the ADC of the present invention. The embodiment includes a clock circuitry block 22, an analog signal sample and hold unit 24, a linear ramp generator 26, a comparator 28, and a time-to-digital converter (TDC) 30. The analog sample and hold unit 24 receives the signal to be converted VIN 32 and captures the signal during a precisely controlled time interval. The linear ramp generator 26 generates a ramp starting at a particular input voltage. The comparator 28 compares the voltage output of the linear ramp generator 26 against a reference voltage (or a threshold voltage) and the time-to-digital converter 30, converts a time pulse into a digital number 34, which may be coded.

Figure 2B:
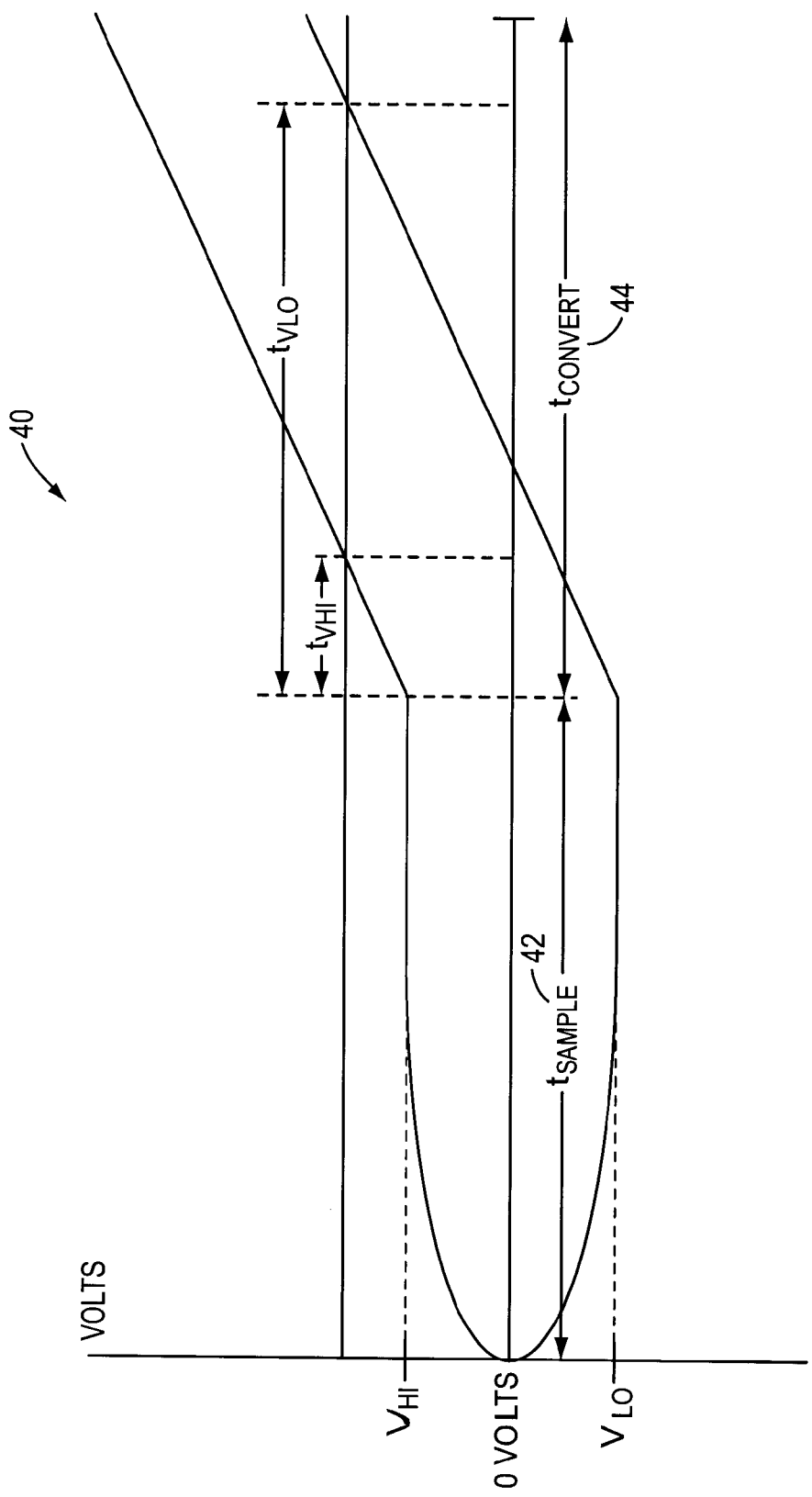
FIG. 2B shows a simplified timing diagram for describing the operation of the block diagram in FIG. 2A.

FIG. 2B shows a simplified timing diagram 40 for describing the operation of the block diagram 20 in FIG. 2A. There are two time periods, tSAMPLE 42 and tCONVERT 44 (although in more complex embodiments, there may be additional time intervals). During the tSAMPLE interval 42, the input signal VIN 32 is captured by the sample and hold block 24. It is expected that when the tSAMPLE interval 42 ends, the sample and hold block 24 has an accurate sample of the input signal.

During the tCONVERT interval 44, a ramp is started by the linear ramp generator block 26, starting at the voltage of the sampled signal. The comparator block 28 receives the ramp from the ramp generator block 26 and detects when the ramp crosses the threshold voltage VTH. When the threshold voltage is exceeded, the comparator block 28 changes state. Concurrently, in the tCONVERT interval 44, the TDC operates to convert the time period from the beginning of the tCONVERT interval 44 until the comparator changes state ($t_{VHI}$ or $t_{VLO}$ in the figure) to a digital number 34, in FIG. 2A. The clock circuitry block 22 of FIG. 2A provides the timing for sample and convert intervals, for the linear ramp generator, and the time-to-digital converter.

Figure 3A:
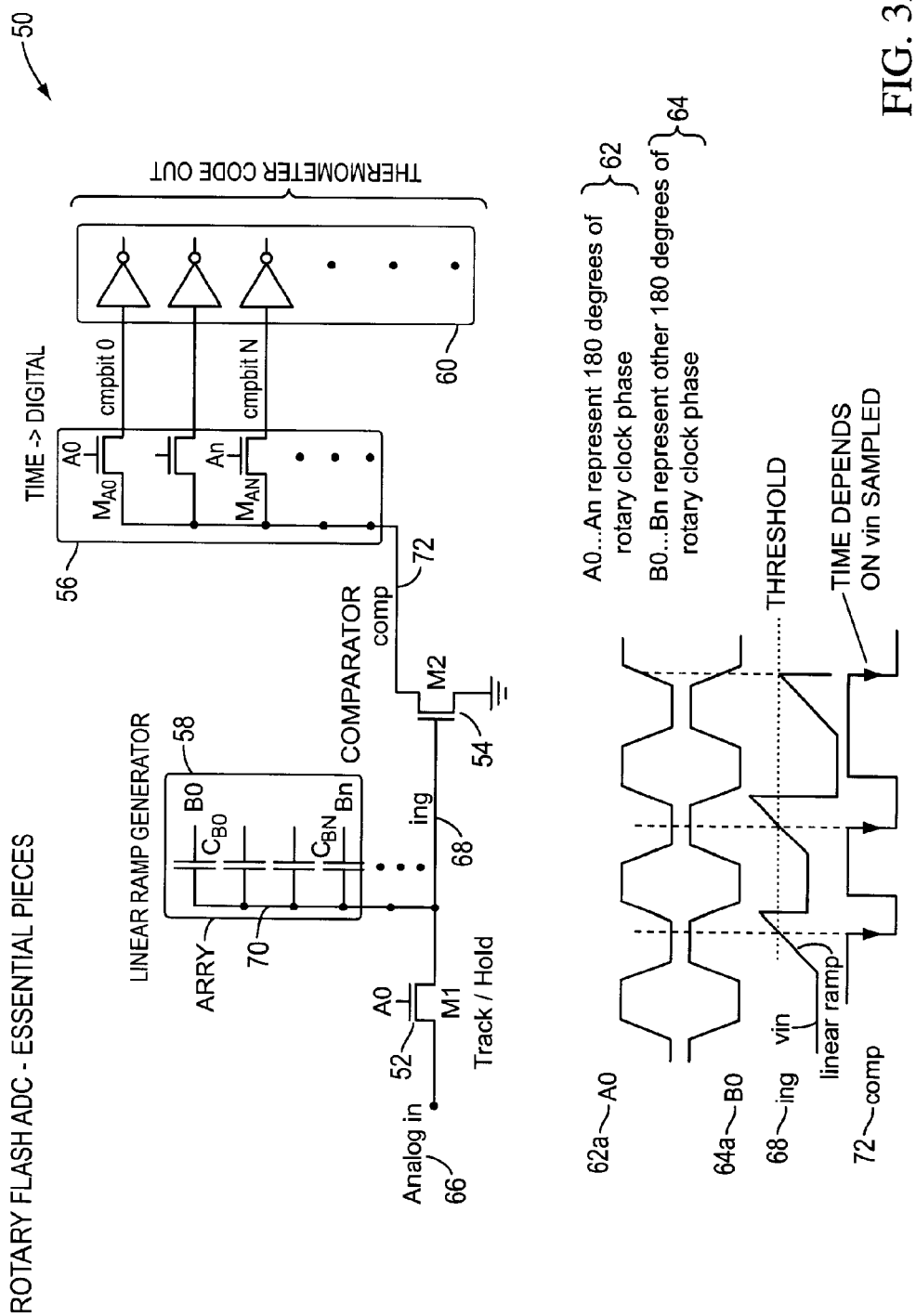
FIG. 3A shows a simplified circuit diagram of an ADC in accordance with an embodiment of the present invention.

FIG. 3A shows a simplified circuit diagram 50 of an ADC in accordance with an embodiment of the present invention. The embodiment includes transistors $M_1$ 52, $M_2$ 54, $M_{A0}$-$M_{AN}$ 56, a capacitor array $C_{B0}$-$C_{BN}$ 58, a set of buffers $B_1$-$B_N$ 60 and a multi-phase clock. The multiphase clock provides a plurality of phases A0-AN 62 spanning 180 degrees and plurality of phases B0-BN 64 spanning an additional 180 degrees of phase, 360 degrees being one cycle of the multi-phase clock. In one embodiment, the multi-phase clock is a rotary traveling wave oscillator, such as is disclosed in U.S. Pat. No. 6,556,089, which is incorporated by reference into the present application. Transistor $M_1$ 52 has its channel connected between the analog input signal 66 and the ing node 68, which stores the sampled analog signal. The gate of transistor $M_1$ 52 is connected to the A0 phase 62a of the multi-phase clock. Also connected to the ing node 68 are the common node 70 of the capacitor array 58 and the gate input of transistor $M_2$ 54. Each capacitor C0-CN of the capacitor array 58 has a plate connected to the common node 70 of the capacitor array and the other plate connected to one of the phases B0-BN 64 of the multi-phase clock. Each of the transistors $M_{A0}$-$M_{AN}$ 56 has a channel connected on one side to the drain of the transistor $M_2$ 54 and on the other side to one of the buffers $B_1$-$B_N$ 60. The buffers $B_1$-$B_N$ 60 drive the digital code that represents the converted time. Alternatively, the ramp generation is possible by means of a digitally controlled current source.

Transistor $M_1$ 52 operates as the sampling device, transistor $M_2$ 54 operates as the comparator, the capacitor array 58 operates to generate the linear ramp, and transistors $M_{A0}$-$M_{AN}$ 56 and buffers $B_1$-$B_N$ 60 operate to convert a time period into a digital signal.

A single NFET ($M_2$ 54) is usable as a comparator in this application. It has a faster response than a differential comparator with a differential to single-ended converter and drives the TDC, which is also single-ended in the interests of power and space. Issues such as threshold drift are counteracted by a fragmentation/self-cal technique, described below, which operates continuously and transparently.

Figure 4A:
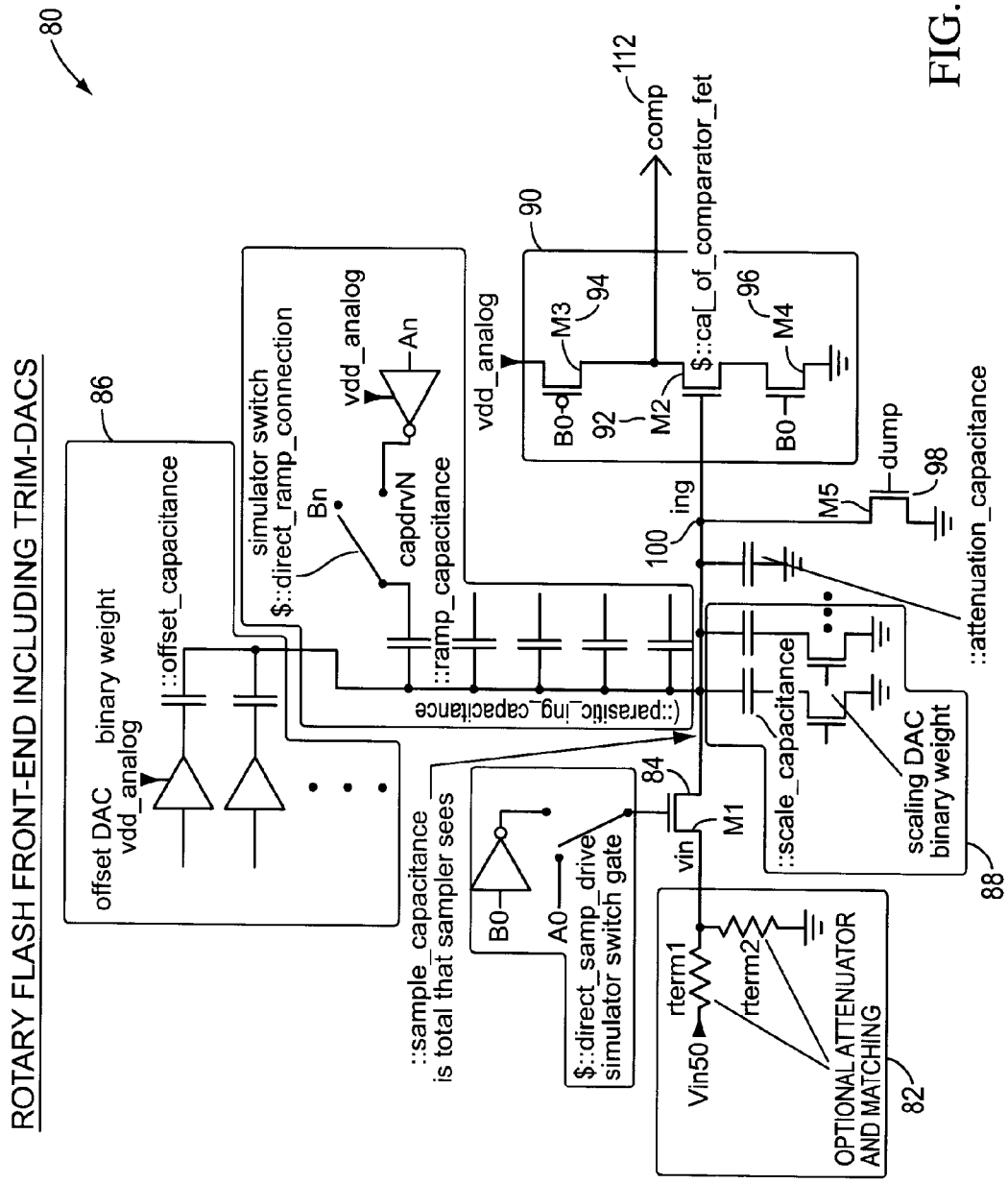

Because the input signal range of the proposed example ADC is chosen as ±0.25 volts (after the attenuator), and NFET threshold (or BJT $v_{BE}$) is higher than this, approximately +0.4 volts (+0.65 volts), the comparator does not conduct during the sample interval. During the sample interval, the comp node 72 can therefore be precharged high with a PFET (not shown). The initial voltage on ing node 68 is just the voltage sampled during the sampling interval. This voltage is then slewed by the progressive multiphase switch-capacitor linear ramp more positively until it approaches the threshold of the NFET ($M_2$ 54). When the signal on ing node 68 exceeds the threshold voltage of the NFET (typically about 0.4 volts) the signal on the comp node 72 begins to transition low, slowly at first. Only at significant overdrive does the slew rate of the signal on the comp node 72 increase, at which point it is sampled by the TDC. The pulse width of the signal on ing node 68 depends on three things, the initial sampled the signal on ing node 68 (common node of the sample/ramp C), the ramp rise time (set by Vdd_analog, capacitor ratios, rotary oscillator period), and the threshold of the NFET ($M_2$ 54). All but first above are fixed by design, so the pulse period depends to first order only on the input voltage sampled during sample time. Higher input voltages result in shorter pulse widths (since the ramp has less distance to travel to reach the threshold). Lower input voltages translate to longer pulse widths. The signal on the comp node 72 is routed to the TDC using a low capacitance wire as shown in FIGS. 4A and 4B.

The sampling NFET is expected to have a certain input capacitance due to its oxide capacitance. Also, there is significant Miller (feedback) capacitance effect from drain to gate and this affects the comparator 72 as it switches. The ramp current is reduced because of capacitive feedback from signal on the comp node 72 feeding back to the gate (the signal on ing node 68). This reduces the slew rate at the gate of the NFET. The effect isn't serious; it just adds a fixed delay to the delay of the comparator, but does not affect linearity since it is independent of the starting point of the ramp. The same comp node slew feedback event happens for every conversion cycle so that it can be removed by self-trim.

Figure 3B:
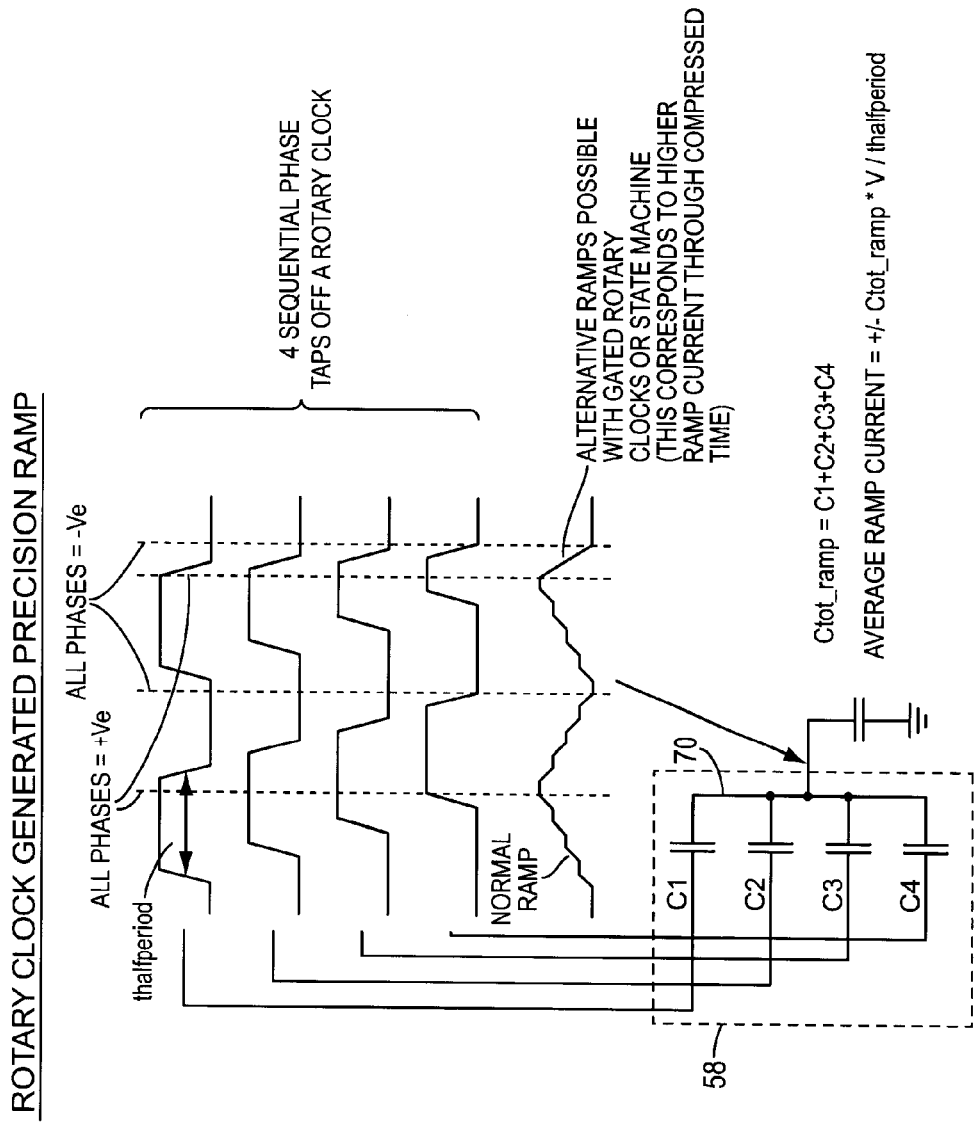
FIG. 3B shows how the capacitor array generates a linear ramp.

FIG. 3B shows how the capacitor array 58 generates a linear ramp with four sequential phase taps from a rotary clock being used as the multi-phase oscillator. As described above, each capacitor in the array is connected to one of the phases of the rotary oscillator. Upon the occurrence of the rising portion of each phase signal from the clock, a small step is produced on capacitance at the common node 70 of the capacitor array, due to the action on the phase signal of a voltage divider formed by the array capacitor and the capacitance at the common node. The ramp is thus built from the successive voltage steps and has negligible amounts of amplitude modulation (AM) noise. The number of taps of the rotary oscillator needed to make a smooth ramp is generally not very large. As soon as the taps are spaced (in time) closer together than the rise/fall time of the rotary clock, the edges merge and the ramp appears smooth. Given a certain ramp rate $\Delta V/\Delta T$ on the common node, the average ramp current is $I \approx C \Delta V / \Delta T$, where $\Delta T$ is one-half cycle of the oscillator.

The circuit shown generates a dual ramp with equal duty cycle. With this setup, at one point in the cycle all the taps happen to be at the +Ve clock potential and exactly ½ cycle later all taps are at their most –Ve potential. At those two times in the oscillation cycle, the capacitor could be thought of as non-distributed, i.e., as one large capacitor made up of all the tap capacitors in parallel for the purposes of calculating the peak-to-peak swing at the common point. At intermediate times, the taps transition one after another and cause a step in the slope either up or down.

If the capacitors in the array 58 are instead attached to signals provided from state machines, then the equal duty cycle restriction is overcome and ramps with arbitrary rise/fall times can be synthesized, even with periods greater than one rotary clock cycle. The more rapid negative slew rate shown (right hand side of the waveform) is necessary for the multi-rotation versions of the present invention where benefit is taken of the essentially constant-current that the circuit presents to a low impedance node such as is in the circuit of FIG. 9 discussed below.

It is possible to alter the ramp rate by using gated clocks from the multiphase oscillator or a state machine. A faster ramp corresponds to a higher ramp current.

As mentioned above, an alternative to the capacitor array 58 current source is a digitally controlled current source. In this alternative, a variable current source or a plurality of current sources are controlled digitally to provide the current to generate the ramp. In some embodiments, this gives increased control over the linearity of the ramp. In one version, the digitally controlled current source is binary weighted, the selectable outputs having a ratio that is a factor of two. In another version, a thermometer code is used to set the magnitude of the current source.

Operation of the circuitry shown in FIG. 3A is as follows. Upon the occurrence of the A0 phase signal 62a from the multi-phase oscillator, the transistor M1 52 opens to cause the ing node 68 to track the analog input signal 66. At the end of first 180 degrees of phase (the end of the sample interval), the A0 signal 62a turns off, and the ing node 68 now holds the sampled signal. The conversion interval follows, during which the linear ramp generator 58 produces a ramp from the phase signals of the multi-phase oscillator during the second 180 degrees of phase. At some point during the rise of the linear ramp signal, which starts at the voltage left on the ing node 68 at the end of the sample interval, the comparator transistor M2 54 turns on because the ramp has exceeded the threshold of the transistor 54. This causes the drain of the M2 54 transistor to fall to ground. Concurrently, during the convert interval, the pass transistors $M_{40}$-$M_{AN}$ 56 sample the drain voltage of the M2 transistor 54. Each sample occurs at one of the phase times during the second 180 degrees (which corresponds to the ends of the phases that occur during the first 180 degrees, in the figure shown). At the beginning of the convert interval, the drain voltage of the M2 54 transistor is high and the sampled state is high. At the end of the convert interval, the drain voltage of the M2 54 is low, and the sampled state is low. Between these two points, the transistor M2 54 switches and the drain voltage falls (at some rate) from a high voltage to a low voltage. As the drain voltage falls, samples are taken of the falling voltage by the sampling transistors. The result of all of the samples taken by the sampling transistors $M_{40}$-$M_{AN}$ 56 is a digital code at the output of the buffers $B_1$-$B_N$ 60. The digital code is a thermometer code, such as '1111100000', which indicates where the transition of the comparator occurred during the convert interval. This code can be subsequently converted to a binary number. The accuracy of the digital code ultimately depends on the accuracy and stability of the multi-phase clock. A rotary traveling wave oscillator is ideally suited to this task because of its inherent accuracy and stability. In the embodiment shown in FIG. 3A, the gate of the sampling transistor 52 is connected directly to a phase of the rotary traveling wave oscillator, so that the sampling window has the low phase noise and low jitter characteristics of the rotary oscillator.

FIGS. 4A and 4B show a more complex implementation 80 of an ADC in accordance with an embodiment of the present invention. A number of additional features are present. First, an optional attenuator and matching circuit 82 is connected to the channel of the sampling transistor 84. Second, an offset DAC 86 and a scaling DAC 88 along with associated circuitry is present. Third, the comparator 90 includes three transistors, M2 92, M3 94, and M4 96, instead of one. Fourth, a charge dumping transistor M5 98 is added to the ing node 100. Fifth, a set 102 of precharge transistors is added, one for each of the time-sampling transistors $M_{40}$-$M_{AN}$ 104. Sixth, a set of buffers and pass transistors 106 are added to the existing set of buffers to pipeline the digital code. Finally, a number of switches are (i.e., 108, 110) added for testing purposes.

Offset DAC Circuitry

The Offset DAC circuitry 86, in FIG. 4A, includes an offset DAC, described in more detail below, and a number of buffering devices, each of which is connected to an offset DAC output and to the ing node 100 by coupling capacitors. Preferably, the coupling capacitors are binary-weighted. These coupling capacitors are switched just after the sample time is over and before the linear ramp begins. By setting the buffers to drive either a 'one' or 'zero', the starting voltage for the ramp can be trimmed up or down. The goal is to trim the starting voltage so that when there input is at zero volts, the digital code is zero. The resolution of the Offset DAC is such that the smallest increment of offset adjustment is much less than 1 least significant bit (LSB) of the ADC response to ensure that ADC performance is not compromised by this calibration.

Scaling DAC Circuitry

The Scaling DAC circuitry 88, in FIG. 4A, includes a scaling DAC, described in more detail below, and a number of buffering devices, each of which is connected to a scaling DAC output and to the ing node 100 by coupling capacitors. Preferably, the coupling capacitors are binary-weighted. The Scaling DAC circuitry 88 either switches in additional capacitance to the ing node 100 or removes capacitance from the node to adjust the total capacitance on the ing node 100. This has the result of altering the ramp rate of the linear ramp generator. In one alternative, the connection of capacitance to the ing node 100 can be timed so that capacitance is connected or disconnected to the ing node during the ramp time, thus permitting mid-range corrections.

Input Attenuator

The input attenuator 82, in FIG. 4A, includes a pair of resistors, rterm1 and rterm2, arranged as a voltage divider, thus reducing the analog input signal to a fraction of its input value. If the resistor ratio is 2:1, then the analog input signal is reduced by a factor of two. The input attenuator has the purpose of matching the source impedance of the analog signal, which is usually 50 ohms. It reduces the swing of the input signal at the sampling transistor M1 84 so that a single transistor can be used to perform the sampling function with good linearity. It further allows the input analog signal to have an input swing of ±0.50 volts so that the voltage swing on the channel of the sampling transistor M1 84 is ±0.25 volts. This permits the use of a single supply voltage and eliminates the danger of latchup. The attenuator 82 also reduces the impedance at the sampling transistor M1 84 to 18.75 ohms (18.75 is 25∥75) (for a 2:1 attenuator) to give a higher sampling bandwidth and allow for a heavier ESD capacitance. It is expected that the input series resistor is positioned ahead of the ESD protection, at the common-point of the attenuator 82, which permits the input to swing at least −1.0 volt before any clamping occurs. Finally, the input attenuator 82 attenuates noise that flows in the ground resistor back to the input analog signal.

The input impedance is an important parameter as it affects the accuracy of the converter.

In particular, the input time constant RC is determined by the number of output bits desired for the converter, the sampling interval, and noise, such as thermal noise. For example, suppose that it is desired to have a 8-bit converter for an input voltage of 0.5 volt. First, input capacitance C is fixed by the number of conversion bits and thermal noise (voltage) based on the relation $V_{noise} \Box \sqrt{kT/C}$. This means that the least significant bit (LSB) of an eight-bit converter represents about 2 mVolts. To resolve 2 mVolts as the LSB, it is desirable that the peak-to-peak thermal noise be about ¼ of the LSB, which is 500 uV p-p or 80 uV rms. This fixes the input capacitance at about 0.65 pF. The input resistance is fixed by the number of bits and the sampling interval. The sampling interval should be about n*RC where n is the number of bits of the converter. Therefore, if the sampling interval is about 256 pS and eight bits are converted, R is fixed to be no greater than about 256/8 C=50 ohms. An input resistance that is lower than 50 ohms assures that signal is accurately captured during the sampling interval. For AC performance, the RC time constant of the sampling transistor the capacitance on the ing node 100 in FIG. 4A must be low enough to settle to much less than an LSB in the sampling interval. The cutoff frequency of this RC also has to be high enough to meet the ADC bandwidth required.

Limitations on the conversion interval are also present. One of these limitations is phase noise. For example, 100 fS of jitter at the comp node 112 in FIG. 4A equals about 1 pS of p-p jitter, meaning that an eight-bit converter requires about 256 pS of convert-time to comfortably exceed the noise by having 1 pS per LSB.

Limiting the input voltage range of the ADC makes it possible to use a single NFET sample/hold transistor stage. Low voltages centered around 0 v DC work well for an NMOS switch in a bulk process.

Comparator

The comparator circuit 90 includes three transistors, M2, M3, and M4 in the embodiment of FIGS. 4A and 4B. Transistor M3 94 is used to precharge the drain node of the transistor M2 (the transistor 92 acting as the comparator). This can be done because the comparator 92 does not conduct during the sample interval (its threshold voltage is greater than the attenuated input signal range). Transistor M4 96 is used to enable the comparator 92 at the beginning of the conversion interval. It should be noted that transistor M2 92 has a certain input capacitance due to its oxide capacitance and there is a significant Miller (feedback) capacitance effect from the drain to the gate. This affects the comparator as it switches reducing the ramp current. The effect, however, is not serious because it simply adds a fixed delay to the comparator without affecting linearity. Essentially, the effect is independent of the starting voltage of the ramp and happens every conversion cycle so the effect can be removed by circuit calibration.

Charge Dump Transistor

Transistor M5 98, in FIG. 4A is used to restore the ing node 100 to zero volts prior to a capture interval. This prevents the sampling transistor M1 84 from having to drive a new sampled voltage on the ing node 100 against a large voltage on the ing node 100 from a previous cycle. It also is beneficial for implementing an active input impedance, which is described below.

Time-to-Digital Converter

FIG. 4B shows one embodiment of the time-to-digital converter (TDC) portion of the circuit. In addition to the time sampling transistors $M_{A0}$-$M_{AN}$ 104, a set of precharge transistors 102, one for each of the sampling transistors, and a set of pipelined buffers 106 are present. Each of the precharge transistors 102 has a channel connected between the supply voltage and the output of one of the sampling transistors 104. The gates of all of the precharge transistors 102 are connected to the sampling signal that drives the gate of the sampling transistor, M1, so that during the sampling interval, the output nodes of the time-sampling transistors 104 cmpbit0-N are precharged to the supply voltage. During the conversion interval, the output of the comparator 90 is time-sampled by each of the phases A0-AN from the multi-phase oscillator. If the output of the comparator 90 is high at the time of the time sample, then the precharged output of the time sampling transistor (in 104) stays high and the high is input into the buffer 60. If the output of the comparator is low at the time of the time sample, the precharged output is pulled low and the low is input into the buffer 60. As the output of the comparator falls, the time sampling transistors sample the comparator output and some of the sampling transistors sense a high signal and some of the sampling transistor detect a low signal, depending on the threshold of the buffers 60. The precise point at which the comparator output changes state is resolved down to the nearest phase of the multi-phase clock. The code that is obtained by the time-sampling process is then clocked into a second set of buffers 106, via pass transistors QA0-QAN (in 106), and advantageously stored in a latch for further processing.

If accuracy beyond what is available from the multi-phase clock is desired, a set of flash ADCs can be used in a second stage of conversion. The voltage that is captured by each of the time-sampling transistors is a source of additional data from which the additional accuracy can be obtained. Small ADCs, say two-bit converters, connected to the output of each time-sampling transistor, are used to extract the extra bits of accuracy. These additional bits are combined with those of the thermometer code for additional resolution as to the precise time at which a transition of the comp signal occurred. While this involves a number of ADCs, the extra power can be minimal, as only one ADC is enabled based on the thermometer code bits on either side of the transition.

Waveforms for TDC

FIG. 4B shows the waveforms 120 for the time-to-digital conversion process. Signals A0-A10 122 are taken from the multi-phase clock, preferable a rotary traveling wave oscillator. At the falling transition of each of these signals, a time sample of the comparator 112 output is taken. In the figure, cmpbit0 . . . 3 124 are all high because the sampling signals A0-A3 have turned off before the transition of the comparator output, cmpbit4-7 126 sample the transition of the comparator output, with some high and some low, depending on the timing of the sampling signals A4-A7 and the threshold of the buffer, and cmpbit8 . . . 10 128 are all low, because the sampling signals A8-A10 have turned off after the transition of the comparator output. As described above, the output of the buffers is a digital thermometer code, cmpbit0-10 which equals '11111100000', in the figure.

Figure 4C:
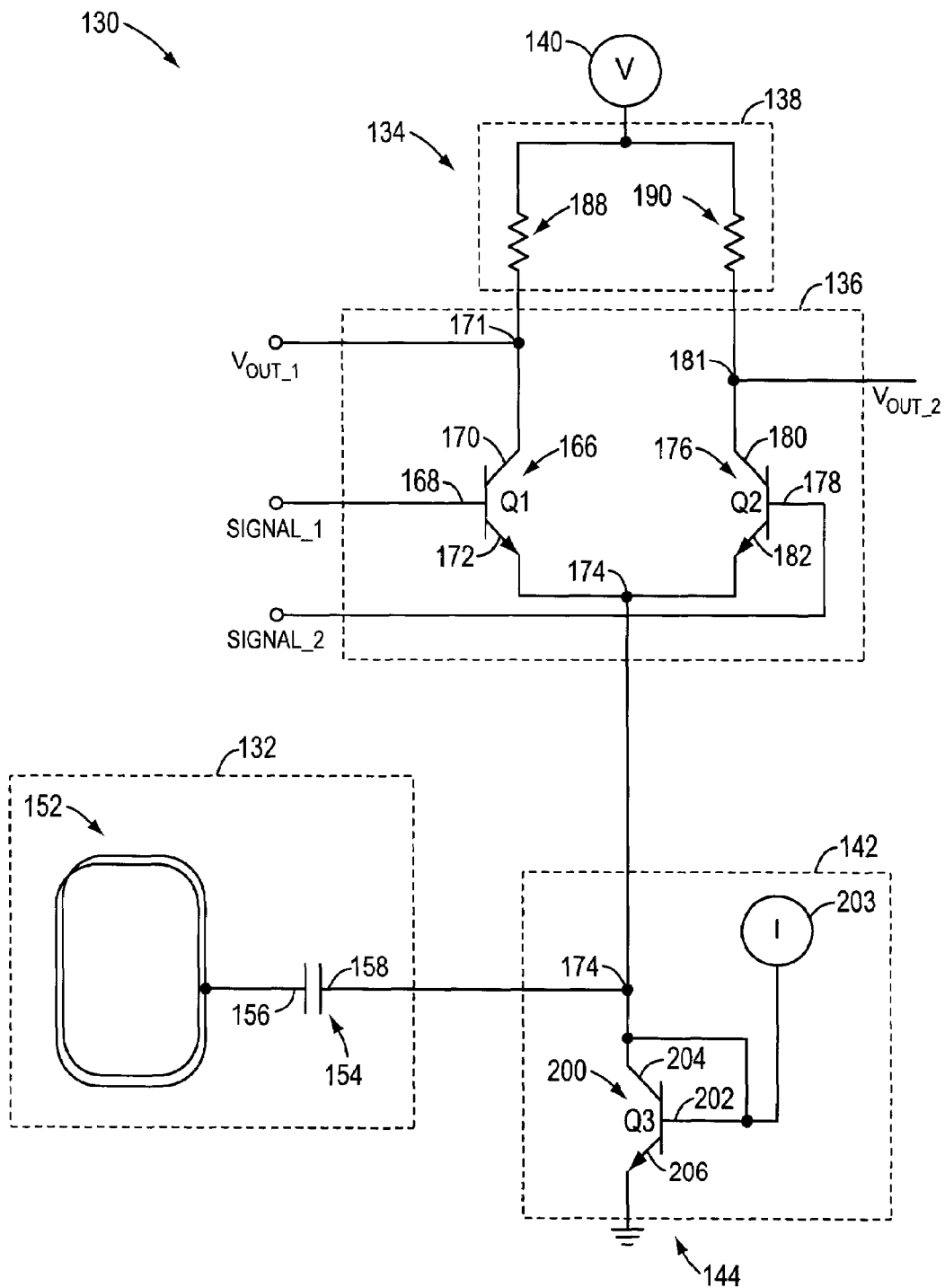
FIG. 4C shows a schematic circuit diagram of a low power comparator device.

FIG. 4C shows a schematic circuit diagram of a low power comparator device 130. The comparator device 130 includes a pulsed current supply circuit 132, and a comparator circuit 134. The comparator device 130 exhibits low power consumption because it consumes power only when needed during very short pulsed intervals carefully controlled by the pulsed current supply circuit 132.

The comparator circuit 134 includes a differential pair 136 having with the two transistors 166, 176 connected via a common node 144 and being operative to compare first and second input signals designated SIGNAL_1 and SIGNAL_2; a load circuit 138 that is coupled between the outputs of the differential pair and a first voltage supply; and a biasing circuit 142 coupled between the common node 174 of the differential pair and a second voltage supply 144. The differential comparator circuit 134 compares SIGNAL_1 to SIGNAL_2, and provides an output signal across output terminals designated $V_{OUT1}$ and $V_{OUT2}$. Optionally, the output signal may be provided to a latch (not shown) to store the results of the comparison.

The pulsed current supply circuit 132 includes a rotary traveling wave oscillator 152 that generates a clock signal having a controlled edge rate and a capacitor 154 having a first terminal 156 for receiving the clock signal and a second terminal 158 connected to the common node 174 of the comparator circuit 134. The capacitor 154 couples a pulse to the comparator circuit 134. As explained below, the pulse provides power to the comparator circuit only when needed. The common node 174 has a very low impedance so that the output of the rotary clock "sees" a real capacitance with very little resistance to ground. This low impedance at the common node allows for better control of the pulsed current source.

The differential pair 136 includes a first bipolar transistor 166 designated Q1 having a base 168 for receiving SIGNAL_1, a collector 170 connected to the first output node 171 designated $V_{OUT\_1}$, and an emitter 172 connected to the common node 174; a second bipolar transistor 176 designated Q2 having a base 178 for receiving SIGNAL_2, a collector 180 connected to the second output node 181 designated $V_{OUT\_2}$, and an emitter 182 connected to the common node 174. A similar circuit can be constructed in CMOS.

The load circuitry 138 includes a first resistor 188 coupled between the first voltage source 140 and the first output node 171 and a second resistor 190 coupled between the first voltage source 140 and the second output node 181. In an alternative embodiment, the resistors 188 and 190 are replaced with metal oxide semiconductor (MOS) loads.

The biasing circuit 142 includes a third bipolar transistor 200 designated Q3 having a base 202 connected to the common node 144, a collector 204 connected to the base 202, and an emitter 206 connected to the second voltage supply 144; and a current source 203 connected to the base 202 of transistor Q3. In the depicted embodiment, the second voltage supply 144 is set to ground. However, in other embodiments, the second voltage supply could be set to any suitable voltage level. Instead of a bipolar transistor Q3, a MOS transistor could be used.

Figure 4D:
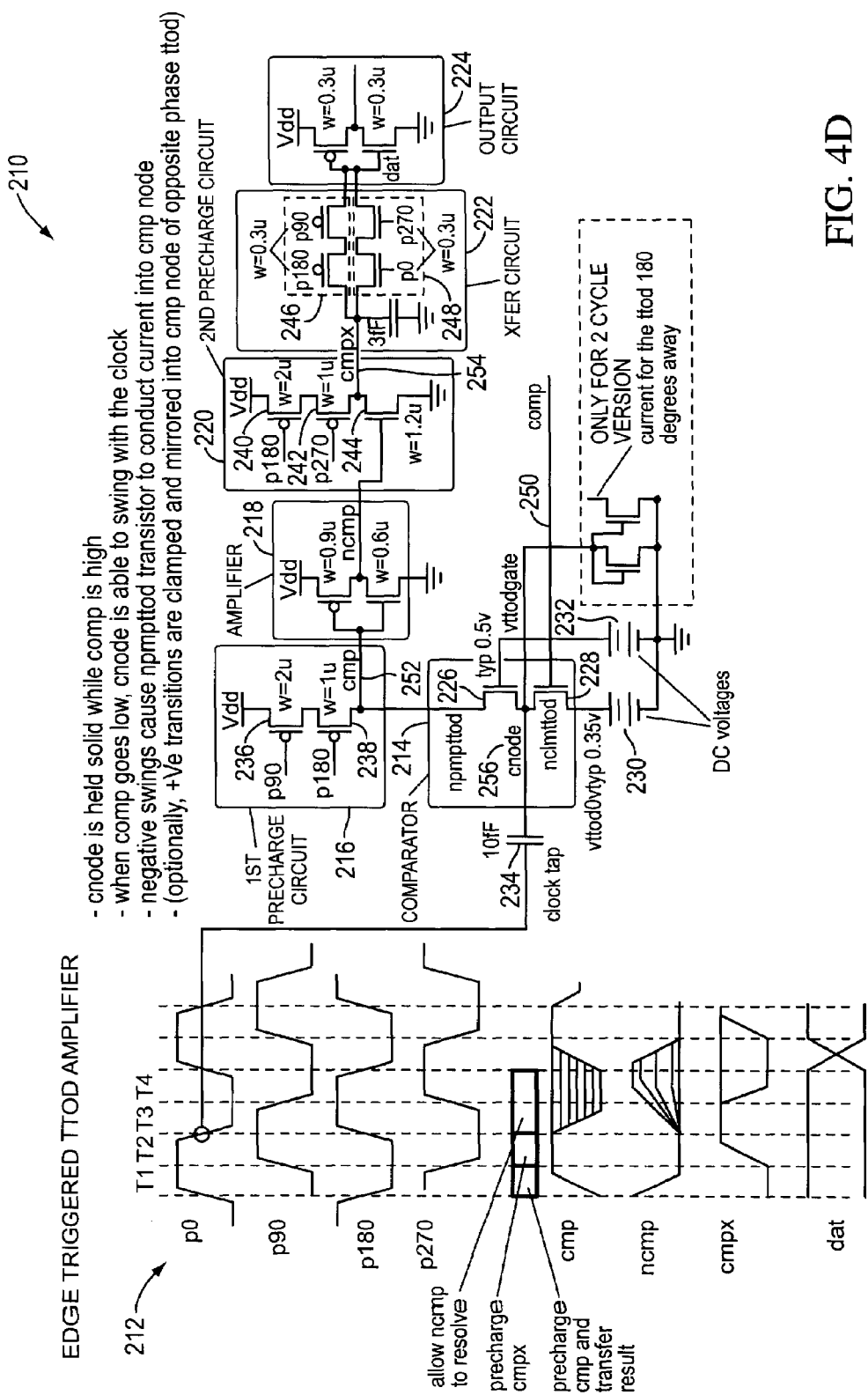
FIG. 4D illustrates an alternate time-to-digital converter and associated waveforms.

Based in part on the circuit of FIG. 4C, FIG. 4D illustrates an alternate time-to-digital converter 210 and associated waveforms 212. In the figure, there are four time intervals T1, T2, T3 and T4 (shown in 212) during which the TDC operates. The TDC in this embodiment includes a comparator 214 (which is similar to the comparator described above), and first precharge circuit 216, a first amplifier 218, a second precharge circuit 220, a transfer circuit 222, and a second amplifier 224. The comparator 214 includes the nclmttod transistor 226 and the npmpttod transistor 228 (which act as the transistors of a differential pair), two biasing voltages 230, 232 (the first being in the range of 0 to 0.35 volts and the second being typically 0.5 volts), and a clock tap capacitor 234. The first precharge circuit 216 includes a pair of PMOS transistors 236, 238 whose channels are connected in series and whose gates are connected to the p90 and p180 clock signals. The amplifier 218 shown is a standard CMOS inverter. The second precharge circuit 220 is a pair of PMOS transistors 240, 242 whose channels are connected in parallel and whose gates are connected to the p180 and p270 clock signals, and a NMOS transistor 244 connected to receive the output of the amplifier. The transfer circuit 222 includes a pair of NMOS 246 and PMOS transistors 248 arranged as a passgate and clocked with the p90, p180, p0 and p270 clock signals. The output amplifier 224 shown is a standard CMOS inverter.

This embodiment 210 of the TTOD operates to resolve the transition of the comp signal 250 based on the occurrence of the falling edge of clock signal p0 (which is the beginning T3_s) of the T3 interval. In interval T1, the first precharge circuit 216 is operative to precharge the cmp node 252. In the interval T2, the second precharge circuit 220 is operative to precharge the cmpx node 254. At the beginning of interval T3, an edge occurs from the p0 signal of the clock. This edge is coupled via the clock tap capacitor 234 to the cnode 256 of the comparator 214. If the edge occurs when the comp signal 250 is higher (by a Vgs) than the first bias voltage 230, then the cmp node 252 is unaffected, because current is pulled from the first bias voltage 230 to the cnode 256. If the edge occurs when the comp signal 250 is low, then current is pulled from the cmp node 252 to the cnode 256, thereby discharging the cmp node 252. This causes the cmp node 252 signal to transition to a low state, which is amplified (and inverted) by the first amplifier 218 and passed to the second precharge circuit 220. The now high logic level (very quickly) discharges the precharged cmpx node 254 to a logic low, and in the next T1 interval (in a pipelined fashion) this logic level is passed to the second amplifier 224, via the transfer circuit 222. If the edge occurs when the comp signal 250 is transitioning from a high to a low, the comparator 214, the first precharge circuit 216, and first amplifier 218 work to resolve the signal on the cmp node 252 into a logic state. The result depends on how far the cmp node 252 has fallen from its precharge state and the threshold of the first amplifier 218. Because of the use of the precharge circuits, the circuit uses very little power, but is very fast at resolving the state of the comp signal 250 at the edge of the clock signal p0.

Figure 4E:
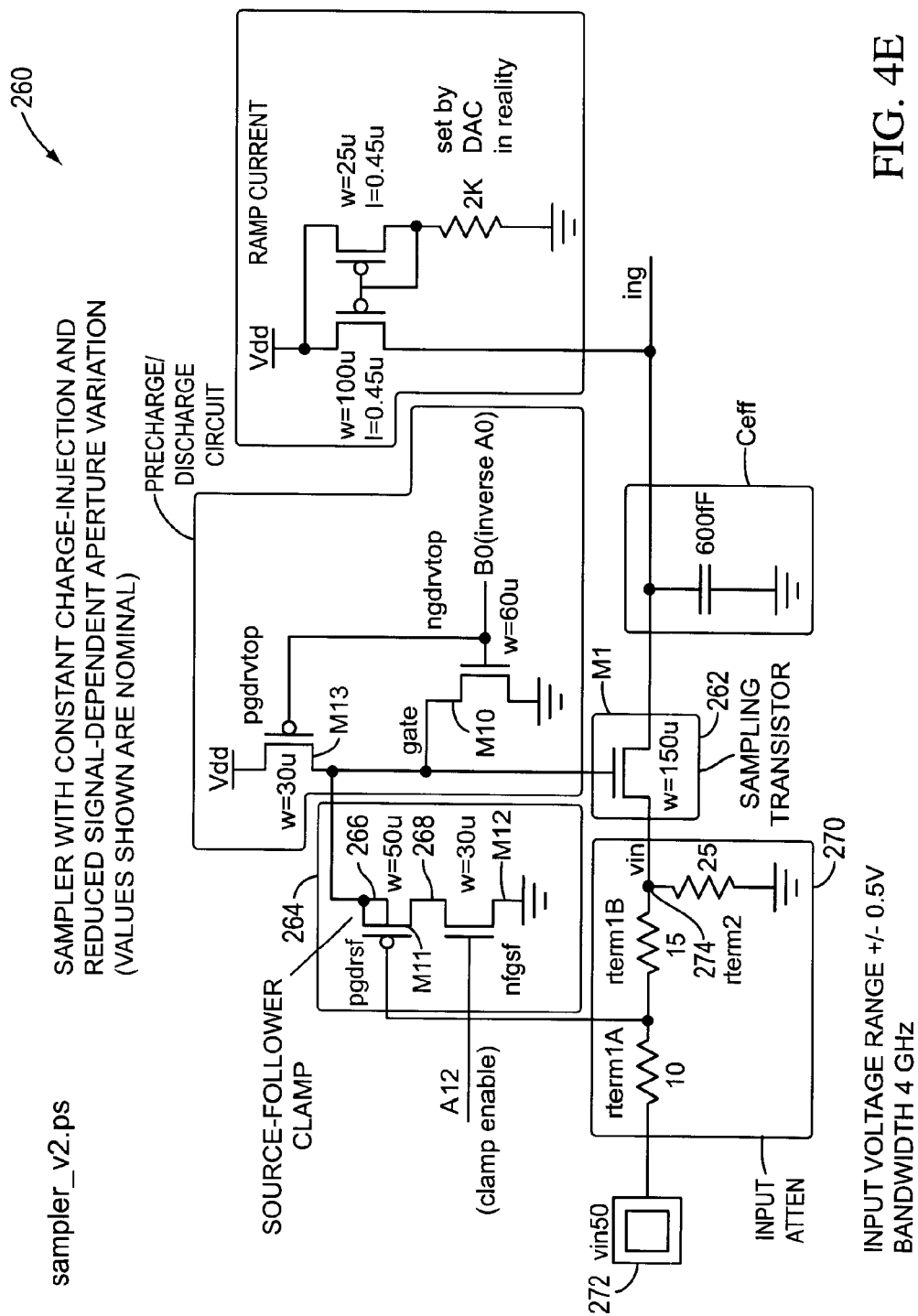
FIG. 4E shows an implementation of a portion of the ADC that reduces signal dependent aperture variation, in accordance with the present invention.

FIG. 4E shows an implementation 260 of a portion of the ADC that reduces signal dependent aperture variation, in accordance with the present invention. In particular, a circuit is added to control gate of the sampling transistor M1 262. The multi-phase clock signal B0 is used as the aperture signal instead of the A0 signal, because the signal is inverted by transistors M10 and M13. Transistor M11 266 is used to set up a source-follower clamp 264 and transistor M12 268 enables the operation of the clamp 264 when the signal A11 is present. The signal A11 is has a slightly earlier phase compared to the B0 signal. In operation, the clamp 264 functions to control the gate-to-source voltage of transistor M1 262, which is critical during the rising transition of the B0 clock signal. When the enable signal is on (slight before the beginning of B0) and B0 rises, the source follower clamp 264 controls the Vgs voltage of M11 266 by tapping a portion of the input voltage at the input attenuator 270 for the gate of transistor M11 266. The tap is set at a point sufficient to overcome the less than unity gain of the source follower M11 266. The result is that the gate voltage of M11 266 follows the input signal during the sampling interval but at a voltage higher than the input voltage vin at the sampling transistor. For example, if the input voltage at vin50 272 is ±0.5 volts peak-to-peak (p-p), then the input voltage vin 274 at the sampling transistor is about ±0.25 volts p-p (given a 2:1 attenuator) and the gate voltage on the pgdrsf transistor 266 is ±0.40 volts p-p (given the resistances rterm1A and rterm1B, as shown). This means that the gate voltage of M11 266 has a range of about 1.1 to 1.6 volts p-p, which is substantially higher than the input voltage at the sampling transistor vin thus assuring substantial gate drive to the sampling transistor 262. Not only does this control the signal dependent aperture variation, but it also controls charge injection that may occur from the gate of M1 262 back to the input signal. It is expected that the aperture jitter is low with the use of a rotary clock.

Integrated phase noise plots of even lowest-power 15 mW rotary clocks show less than about 75 fS of RMS jitter without buffers needed.

Figure 4F:
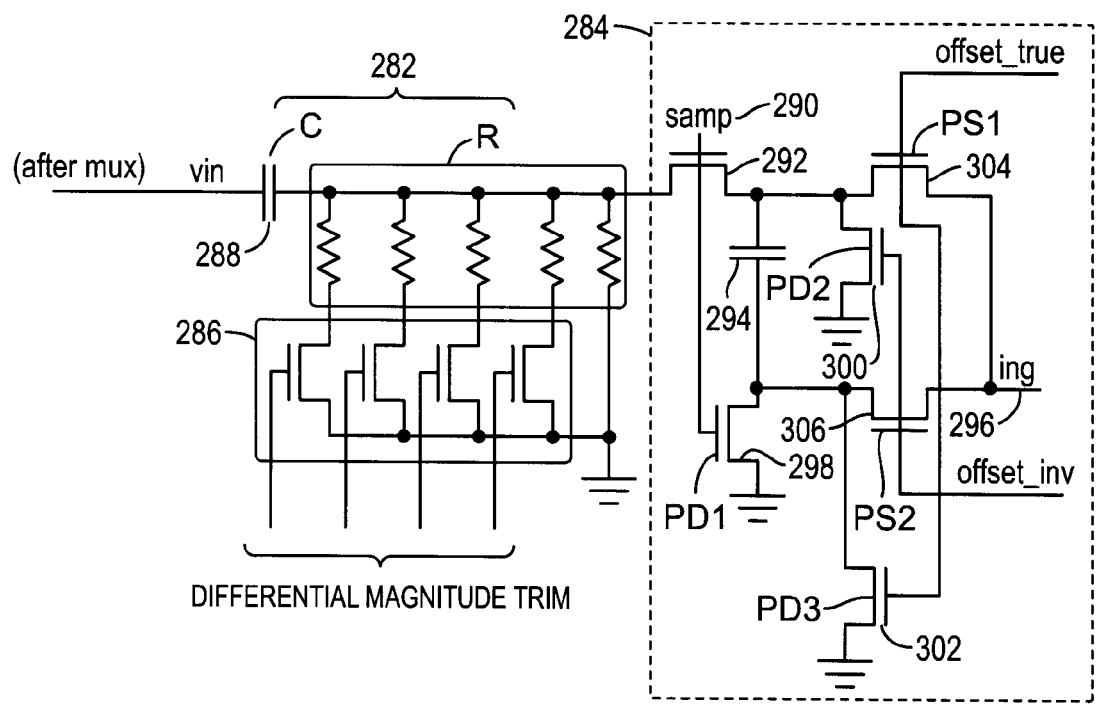
FIG. 4F shows a circuit for sampling the slew rate of the input signal to be converted.

FIG. 4F shows a circuit 280 for sampling the slew rate of the input signal to be converted. The slew rate of the input signal has an effect on the sampling window. If the gate voltage on the sampling device is turning off and the input signal is positive going, the turn off time of the NFET sampler is reduced. However, if the input signal is negative going, the turn off time of the NFET sampler is increased, because both the gate and the input signal are moving in the same direction. This creates a non-linearity in the sampling circuit, one that depends on the slew rate of the input signal (and possibly its direction as well). The circuit in the figure includes a CR circuit 282 arranged as a differentiator and an auxiliary sampling circuit 284 for sampling the output of the CR circuit 282.

The resistance of the CR circuit 282 is made up of a plurality of resistors each connected between a selection transistor (in 286) and the input capacitor 288. Each of the selection transistors 286 is connected between ground and the respective resistor and has a gate connected to a digital signal so as to permit adjustment of the resistance by means of a DAC and therefore the magnitude of the detected slew rate.

The auxiliary sampling circuit 284 includes an auxiliary sampling transistor 292 whose gate is connected to the samp signal 290 (which also operates the main sampling transistor), an auxiliary holding capacitor 294, and selection circuitry having inputs offset_inv and offset_true and a correction output connected to the ing node 296. The selection circuitry includes first, second, and third pull-down transistors 289, 300, 302, and first and second pass transistors 304, 306. The channel of the auxiliary sampling transistor 292 is connected between the differentiator 282 output (the junction of the C and R of the CR circuit) and a first node of the auxiliary holding capacitor 294. The channel of the first pull-down transistor 298 is connected between ground and the second node of the auxiliary holding capacitor 294. The gate of the first pull-down transistor is also connected to the samp signal 290. The channel of the second pull-down transistor 300 is connected between ground and the first node of the auxiliary holding capacitor 294. The channel of the third pull-down transistor 302 is connected between ground and the second node of the auxiliary holding capacitor 294. The channel of the first pass transistor 304 is connected between the first node of the auxiliary holding capacitor 294 and the ing node 296. The channel of the second pass transistor 306 is connected between the second node 294 of the auxiliary holding capacitor and the ing node 296. The gates of the second pass transistor 306 and the second pull-down transistor 300 are connected together and to a signal offset_inv. The gates of the first pass transistor 304 and the third pull-down transistor 302 are connected together and to a signal offset_true.

The circuit works as a passive differentiator (282) sampling the derivative of the input signal at the same time as the main sampler turns off, as follows. When the sampler signal samp turns off, the results of the output of the CR circuit 282 are sampled and held on the auxiliary holding capacitor 294 whose second node was grounded during the sampling interval by the first pull-down transistor 298. The calibration control circuitry then turns on either offset_inv or offset_true to make any needed correction. If a positive correction is needed, then offset_true is turned on, causing the voltage on first node of the auxiliary holding capacitor 294 to be coupled to the ing node 296 and the second node of the auxiliary holding capacitor to be grounded. If a negative correction is needed, the offset_inv is turned on, causing the negative of the voltage on the auxiliary holding capacitor 294 to be coupled to the ing node 296, because the first node of the auxiliary holding capacitor 294 is grounded. The signal coupled to the ing node 296 is then used to correct the main sample as to the slew rate effects.

Load Imbalancing of Rotary Oscillator

In the use of a rotary oscillator 310 as the multi-phase oscillator of the present invention, the rotary oscillator may have a section of transmission line that has a speed very different from the speed of another section of transmission line. FIG. 5 shows a case in which one-half (the left half in the figure) of the rotary oscillator has a speed that is twice the speed of the other half (the right half). In this circumstance, the 180 degree phase point is moved only 25%, i.e. 45 degrees from the 180 degree point if the speed were uniform. Thus, the rotary oscillator is very immune to load imbalancing.

Physical Layout Considerations

Figure 6:
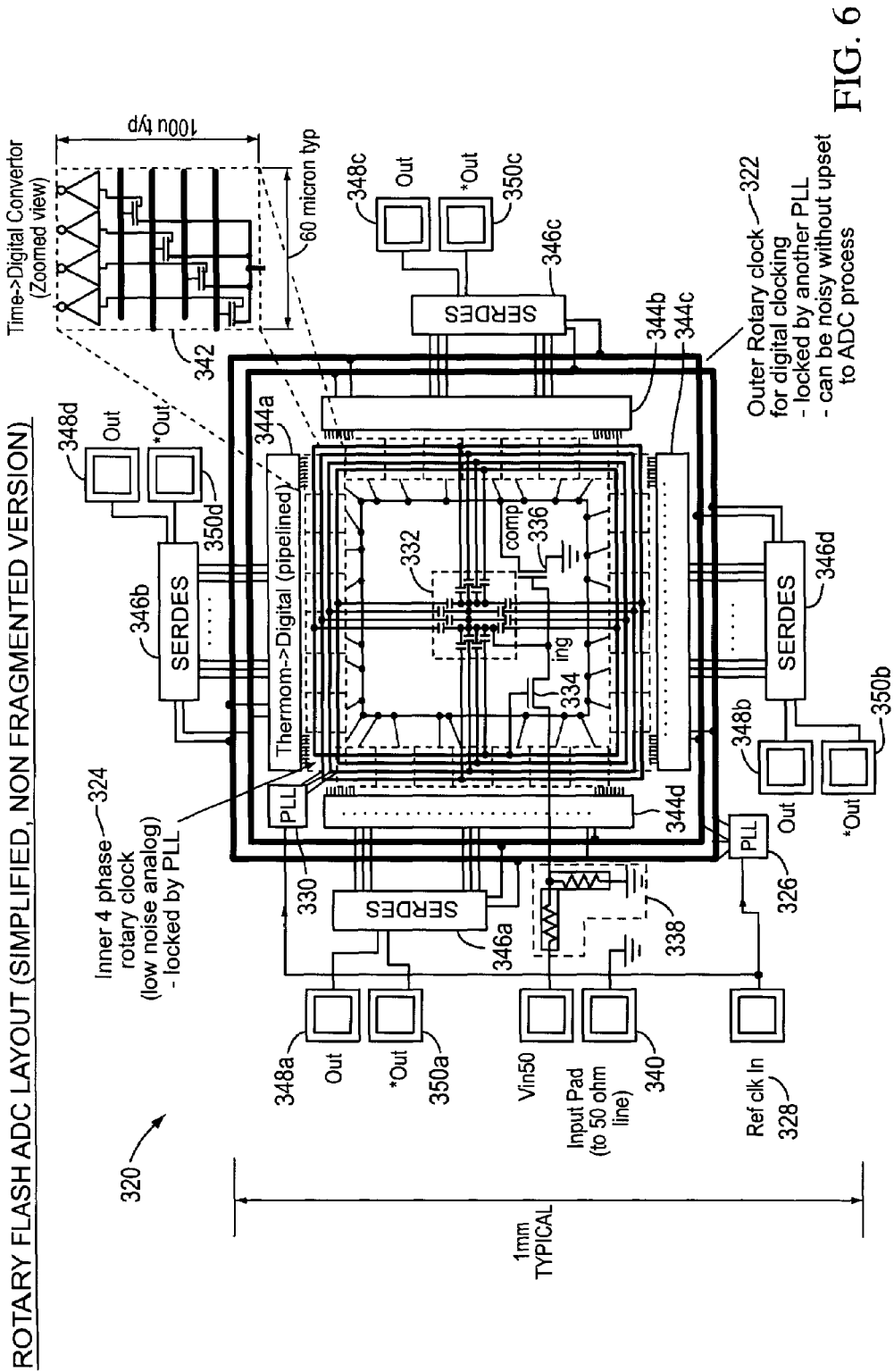
FIG. 6 shows a diagram illustrating a physical layout of an embodiment of the present invention.

FIG. 6 shows a diagram illustrating a physical layout 320 of an embodiment of the present invention. The approximate distance of each dimension is about 1 millimeter. Shown in the figure are two rotary clocks, an outer rotary clock 322 and an inner rotary clock 324. The outer rotary clock 322 is a two-phase loop and the inner clock 324 is a four-phase loop. The outer rotary clock 322 is used for digital clocking and is locked by means of a PLL 326 to a reference clock 328, provided on the REF CLK IN pad. A separate PLL 330 driven from the reference clock is used to set the phase of the inner clock 324.

The capacitor array 332 is shown in the center of the inner clock 324, the capacitors tapping the four phase clocks near the midpoints of each of the sides of the inner loop 324. The sampling transistor 334 and the comparator transistor 336 are also positioned inside the inner clock. The sampling transistor 334 is shown connected to a tap on the four phase inner clock, the ing node being connected to the common node of the capacitor array 332, the sampling transistor 334 and the comparator input 336. The input attenuator 338 is located outside of the outer clock 322 and is connected between an input pad 340 and the sampling transistor 334. The time-to-digital converter sampling transistors 342 are shown in the zoomed view connected along each of the conductors of the inner ring. A typical path of sampling transistors 342 uses an area of about 60 μm by 100 μm. The thermometer code to binary conversion blocks 344a-d are situated between the inner clock 324 and the outer clock 322 and distributed around the loop. On each side and outside of the outer loop is a SERDES block 346a-d which converts the parallel digital code into a bit serial code. Output and output* pads 348a-d, 350a-d are provided to each SERDES block 346a-d which is clocked with the phases from the outer clock 322.

Figure 7A:
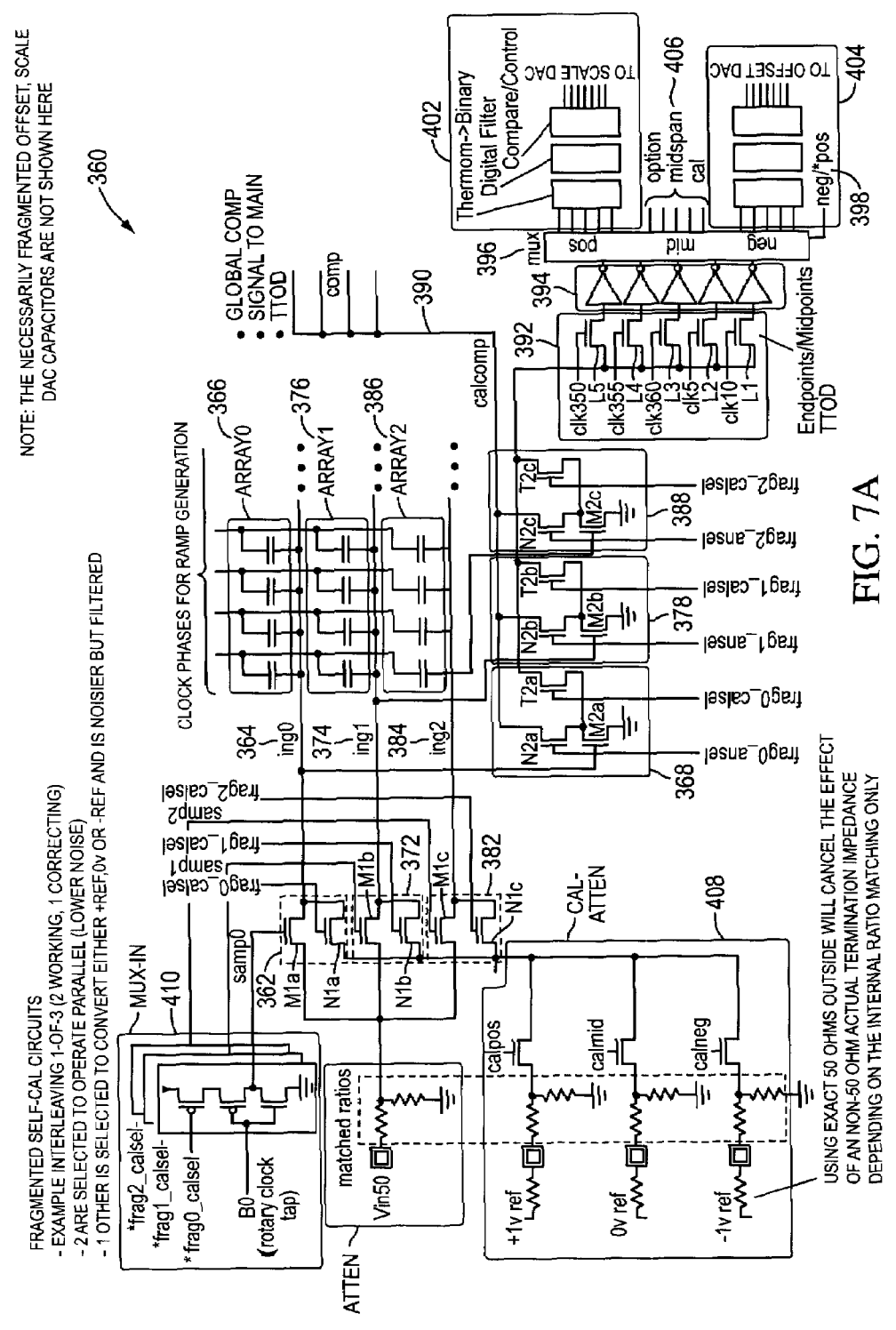

FIG. 7A shows a diagram illustrating the self-calibration circuitry 360 in an embodiment of the present invention. The self-calibration circuitry 360 is based on the concept of implementing the sampling transistor and the comparator as multiple, paralleled devices. In the figure, the sampling transistor and the comparator are divided into three slices or fragments. This arrangement permits two of the fragments to be joined together for normal operation, while one of the fragments is separated from the other two for calibration. Each of the fragments has its own capacitor array which is connected to the phase signal of the multi-phase oscillator and to its own ing node.

In particular, fragment 0 includes sampling transistor M1a, sampling calibration transistor N1a (362) which are connected to the ing0 node 364. Fragment 0 also includes capacitor array ARRY0 366, and comparator transistors M2a, N2a, and comparator calibration transistor T2a (all in 3368). Fragment 1 includes sampling transistor M1b, sampling calibration transistor N1b (372), ing1 node 374, capacitor array ARRY1 376, comparator transistors M2b, N2b and comparator calibration transistor T2b 378. Fragment 2 includes sampling transistor M1c, sampling calibration transistor N1c 382, ing2 node 384, capacitor array ARRY2 386, comparator transistors M2c, N2c and comparator calibration transistor T2c 388.

Each of the comparator calibration transistors is joined at the calcomp node 390, which drives a calibration time-to-digital converter (CTDC) 392. The CTDC 392 includes calibration sampling transistors L1-L5, a set of buffers 394, each connected to one of the calibration sampling transistors, a multiplexer 396 controlled by a neg/*pos signal 398, and a digital conversion block for the scaling DAC 402 and the offset DAC 404. Each digital conversion block 402, 404 includes a thermometer-to-binary conversion block, a digital filter and a compare and control block. Optionally, the multiplexer can include a midspan calibration section 406.

To control the calibration circuitry shown in FIG. 7A, several calibration control signals are needed. These signals include the frag0_calsel, frag1_calsel, and frag2_calsel signals, the frag0_ansel, frag1_ansel and frag2_ansel signals, the calpos, calmid, and calneg signals, and the samp0, samp1, and samp2 signals.

Each of the signals, frag0_calsel, frag1_calsel, and frag2_calsel, selects one of the fragments for calibration, which means taking the selected fragment out of normal circuit operation and applying, via a gating circuit, a multiphase clock signal to the selected calibration sampling transistor N1a, N1b, or N1c.

Each of the signals, frag0_ansel, frag1_ansel and frag2_ansel, selects a fragment for normal circuit operation. Thus, for example, if frag0_calsel is true, then fragment 0 is selected for calibration. This means that frag1_ansel and frag2_ansel are true to join the remaining fragments for normal circuit operation.

Each of the signals, calpos, calmid, and calneg, selects one of the input attenuator circuits 408. The calpos signal selects the input attenuator that has a +1 volt reference signal applied. The calmid selects the input attenuator that has zero volts applied and the calneg signal selects the input attenuator that has −1 volt applied.

The signals, samp0, samp1, and samp2, carry the sampling phase signal for each of the segments. These signals are provided by gating circuitry 410 that receives the frag0_calsel, frag1_calsel, and frag2_calsel signals, so that, when a fragment is selected for normal operation, the phase signal from the multi-phase oscillator is applied to the selected sampling transistor M1a, M1b, or M1c (in 362, 372, 382).

The calibration time-to-digital converter (CTDC) 392, which includes the sampling transistors L1-L5, is connected to the multiphase oscillator phase signals, clk10, clk5, clk360, clk355, and clk350, which are the phases within a narrow range at the minimum and maximum end of the possible digital codes.

Calibration occurs as follows. When fragment 0 is selected for calibration at +1 volt, the +1 volt input attenuator (in 408) is selected. Fragments 1 and 2 are then joined for normal operation at the comparator by frag1_ansel and frag2_ansel to drive the comp signal. The fragment 0 comparator is selected for calibration by the frag0_calsel signal and its output is diverted to the CTDC via the signal calcomp 390. With +1 volt at the input, one of the phases clk350, clock355, or clk360 captures the transition of the calcomp signal and the calibration thermometer code reflects the captured signal. After binary conversion and filtering (described in more detail below), the scaling DAC 402 receives an input code which it uses to control the scaling capacitor array in FIG. 4A. If there is a scaling error, the DAC output adjusts the ramp rate so that the code matches the sampled calibration signal.

When calibration is selected for 0 volts, the 0 volt input attenuator is selected. Again, one of the fragments is singled-out for calibration and the other two are joined for normal operation. With a 0 volt input, one of the phases clk5 or clk10 captures the transition of the calcomp signal 390 and the thermometer code reflects the captured signal. Again, binary conversion and filtering (to avoid the problems of noise associated with using only one fragment) are performed, and the offset DAC 404 receives the input code which it uses to control the offset capacitor array in FIG. 4A. If there is an offset error, the DAC output adjusts the starting voltage of the ramp, so that the code matches the sampled calibration input signal.

Figure 7B:
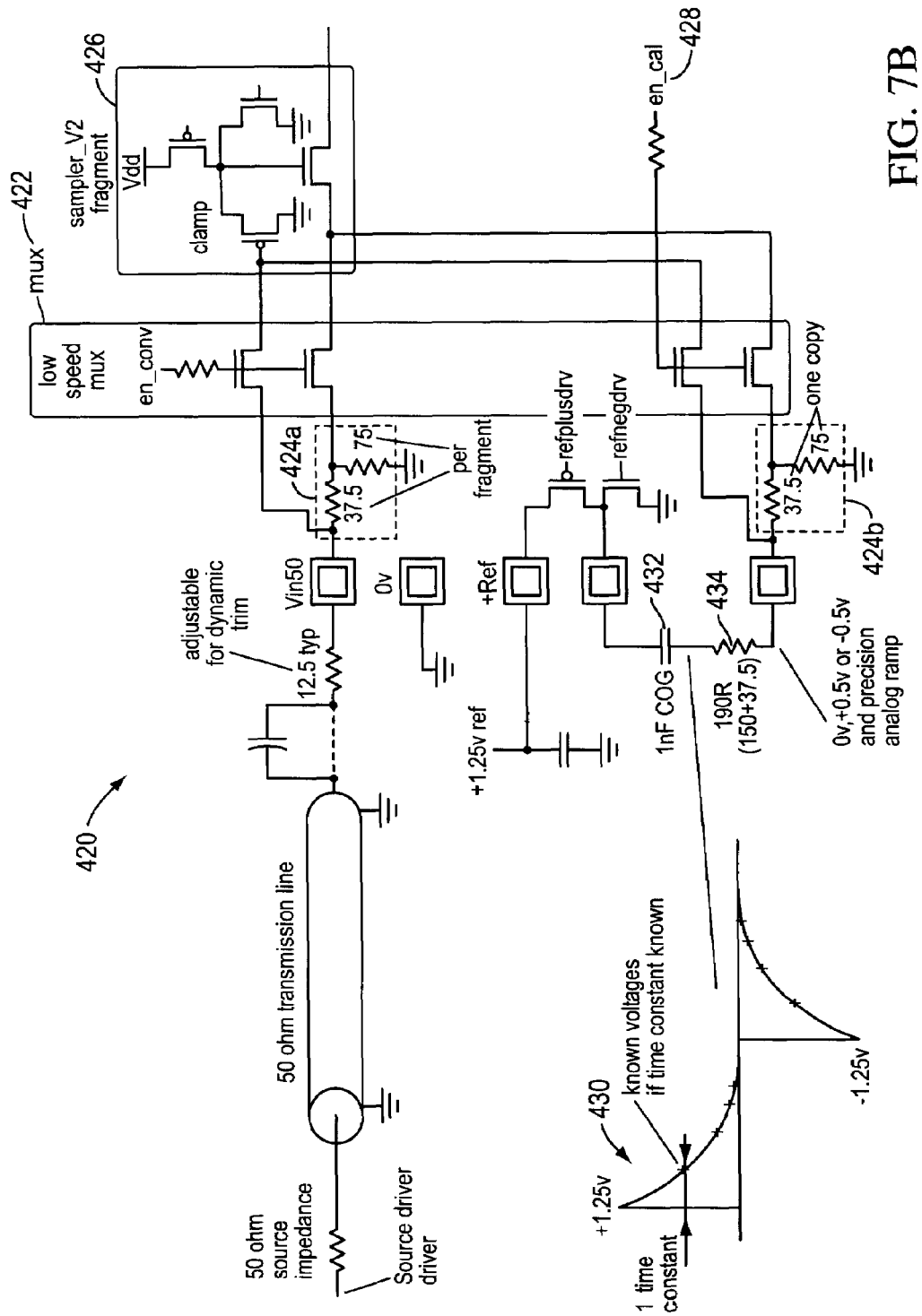
FIG. 7B shows a diagram illustrating alternative to the use of static reference voltages for calibration.

FIG. 7B shows a diagram illustrating an alternative to the use of static reference voltages for calibration. Instead of using static voltages as references for calibration, the system in FIG. 7B shows the use of an exponential waveform for calibration of an ADC fragment. A low speed multiplexer 422 is placed between the input attenuators 424a,b and the sampling transistor circuitry 426 (shown as the sampler_V2 fragment). When calibration is occurring (when en_cal 428 is true), an exponential waveform 430 with a known time constant is selected for sampling by the converter. The exponential waveform 430 results from 1.25 v or a 0 volt reference voltage driving a 1 nF capacitor (of high quality) 432 and 300 ohms 434 (which is the result of the combination of a precision resistor and the input attenuator). When the 1.25 volt reference is connected to the precision RC circuit 432, 434 (refplusdrv is low), the voltage at the junction of the resistor and capacitor jumps to the supply voltage (1.25 volts in this case) and the voltage at the input to the attenuator 424b follows. The voltage then decays exponentially to zero and while decaying is sampled at various points by the converter. When the 0 volt reference is connected to the precision RC circuit 432, 434 (rfnegdriv is high), the voltage at the junction of the resistor and capacitor jumps to the negative of the supply voltage (−1.25 volts) and the voltage at the input to the attenuator 424b follows. The voltage then decays exponentially to zero while again it is sampled by the converter. Because the voltage at various points along the decay of the exponential is known, the converter circuit fragment can be well-calibrated.

FIG. 7C shows an alternative embodiment of the exponential ramp generator for calibration of the ADC. This embodiment includes a pair of pulse driver circuits mospulsedrv_a mospulsedrv_b 442, 444, an implementation of each is shown in the dotted enclosure, a bootstrap circuit 445, a vref driver transistor pp0n3 446, a series RC circuit 448, a vref latch 450, and a calibration attenuator 452.

Each one of the pulse driver circuits 442, 444 receives an on pulse and an off pulse on its inputs and drives the open-drain "out" line. A first 442 of the pair of mospulsedrv_a is used to generate the first part of the exponential waveform and the second 444 of the pair is used to generate the second part of the exponential waveform, shown in the figure. Another output of the pulse driver, nout_weak, is taken from the gate drive of the open drain output transistor and is output is connected to the bootstrap circuit 445.

The bootstrap circuit 445 receives the "out" signal and the nout_weak signal and drives the gate of the vref driver transistor pp0n3. The channel of the vref driver transistor pp0n3

446 is connected between vref 450 and the series RC circuit 448. The output of the second 444 of the pair of the pulse driver circuits mospulsedrv_b is connected to the input of the series RC circuit as well.

The series RC circuit 448 is connected between the calout_pcb and the calin_pcb node, as it is expected to be external to the integrated circuit, whose I/O pads are shown in the figure.

The vref latch 450 is connected to the output of the mospulsedrv_b circuit and to the vref driver transistor 446.

The calibration attenuator 452 is connected to the calin_pcb pad in the same fashion as the input attenuator is connected to the input signal to be converted.

The exponential ramp generator operates as follows, referring also to FIG. 7C. An on-pulse pon is received by the mospulsedrv_a pulse driver 442 and the driver responds by turning on its "out" line. This causes the bootstrap circuit to turn on the vref driver transistor 446, thereby connecting vref 450 to the input of the series RC circuit 448. This causes a quick jump to the +vref voltage on the calibration input. Because the other side of the series RC circuit is grounded, via the calibration attenuator 452, the capacitor in the RC circuit begins to charge, causing the voltage on the calibration input to decay at the RC time constant rate towards ground. At a time when the decay is sufficiently close to ground (say perhaps after about 15 time constants), an off-pulse poff is issued to the mospulsedrv_a pulse driver 442 causing the "out" line to turn off. A short time later, an on-pulse non is issued to the mospulsedrv_b pulse driver 444. This causes the "out" line of that pulse driver to turn on, thereby connecting the input of the series RC circuit to ground. Because the capacitor is completely charged to vref, this produces a negative jump in the waveform to −vref at the calibration input and the beginning of the decay of the RC circuit back to ground. After the decay reaches a state sufficiently close to ground, the noff pulse turns off the mospulsedrv_b pulse driver 444. During the time when the calibration voltage jumps to +vref or −vref, it is convenient to check for aperture mismatch.

The sampler is part of the complete calibration loop and so all DC non-linearity is removed. High frequency effects include apperture mismatch in the interleaving and mismatch in the bandwidth of the input sampler and these are to be corrected by sampler clock interpolating or by adjusting the ring velocity portions. The bandwidth is to be trimmed by adjusting the sampler capacitance.

Limitations of the Simplistic 2-Rotation Converter

There are some limitations that arise with the 2-rotation converter. These include the fact that half a cycle (one rotation) is devoted to sampling, which may be too long, and half a cycle (one rotation) is allowed for the TDC conversion, which may be too short. Also, for an eight bit converter using a rotary traveling wave oscillator, 256 clock phase taps of the oscillator are needed. These 256 taps have to be squeezed within at most 180 degrees of phase (the convert half-cycle). Another limitation is that there is some non-linearity at small output codes. No comparator is instantaneous so that at high input voltages where an almost zero ramp-time is needed to cross the threshold, the comp output is expected to transition low almost as soon as the convert interval begins. Zero delay is also not possible and codes close to zero suffer from non-linearity. These limitations are removed using a multiple interval convert time, described below, which provides enough 'dead time' ahead of the comparator transition to operate in the highly linear region.

Figures 8A, 8B:
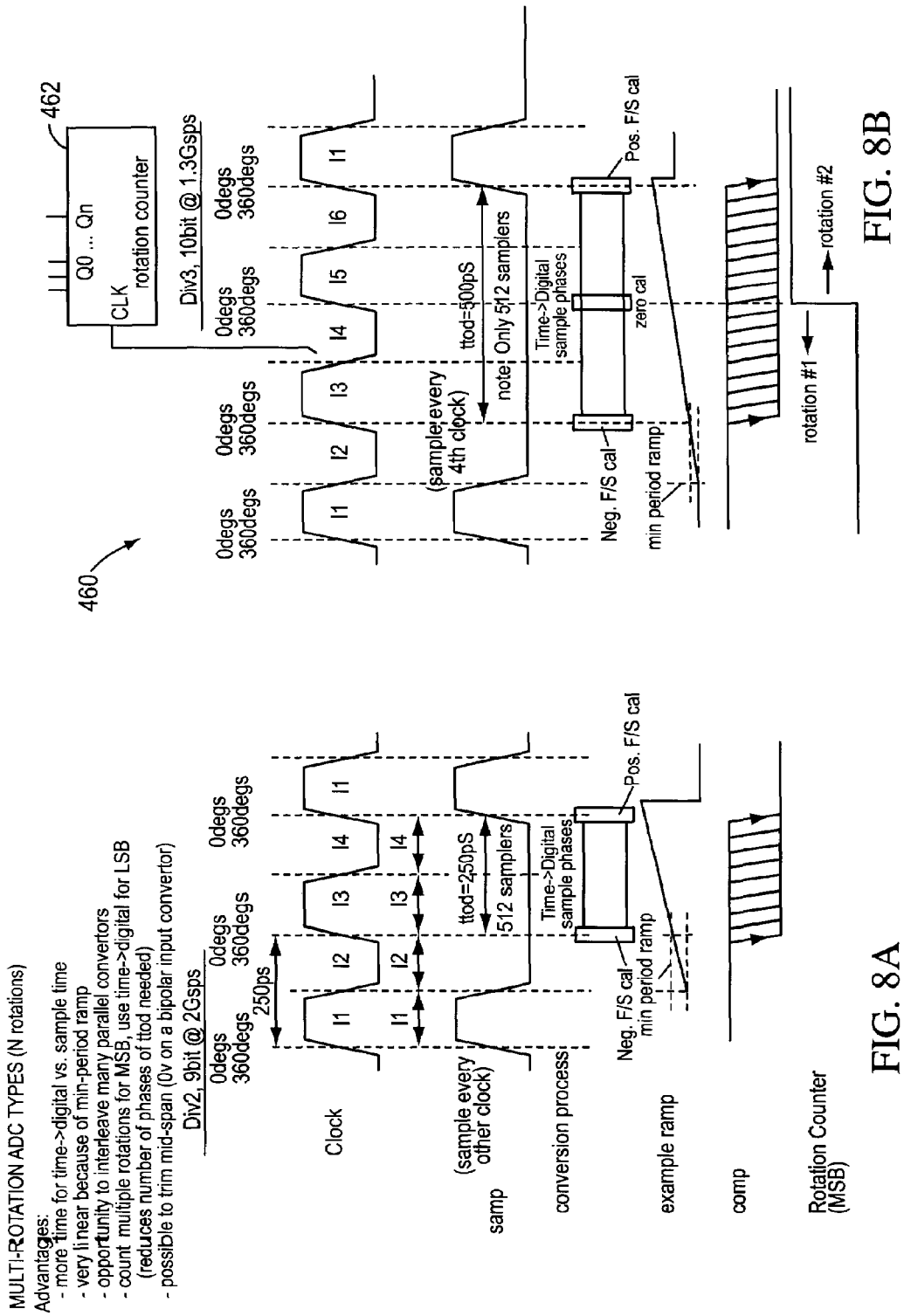
FIGS. 8A and 8B illustrate an embodiment of the present invention in which a multiple rotation rotary oscillator is used.

FIGS. 8A and 8B illustrate an embodiment in which a multiple rotation rotary oscillator is used. In this embodiment, instead of dividing a clock cycle of the multi-phase oscillator into two intervals, tSAMPLE, and tCONVERT, additional intervals are used. For example, in FIG. 8A, the conversion process is divided into four intervals I1-I4, each 125 picoseconds (pS) in the example. A sample occurs in interval I1, a time-to-digital conversion occurs in intervals I3 and I4, and one of the intervals, I2, is dedicated to comparator dead-time. In a rotary traveling wave oscillator, each interval is conveniently one rotation of the oscillator, where a rotation is defined as 180 degrees of a cycle or the time for a wavefront inversion to occur. The determine the rotation in which the conversion occurred, a rotation counter is employed. In FIG. 8A, the sampling rate is 2 Gsps and the resolution is 9 bits.

FIG. 8B shows a six interval converter, which can be conveniently implemented using six rotations of a rotary clock. In this version, a sample occurs in the I1 interval, followed by a dead time interval I2. The TDC conversion occurs over intervals I3-I6, giving even more time for the TDC process. The linear ramp generator starts in interval I2, but the ramp is only used in I3-6, thereby improving the linearity of the system. A mid-ramp calibration in this version is possible. Again, a rotation counter is used to keep track of the multiple rotations. If each interval is 125 pS, the sampling rate is 1.33 Gsps and the resolution is 10 bits.

The arrangements of FIGS. 8A and 8B have a number of advantages. First, there is more time for the TDC portion of the process. Second, a carefully chosen portion of the linear ramp can be used, as the ramp can begin in the dead-time interval, but not be used until the conversion interval starts. Third, rotations can be counted (using the rotation counter 462) for the most significant bits (MSB) of a conversion, while the TDC circuitry can supply the LSBs. This reduces the number of phases needed for the TDC. Fourth, there is an opportunity to interleave multiple converters operating in parallel. Finally, the arrangement permits the midpoint area of the linear ramp to be trimmed.

Figure 8C:
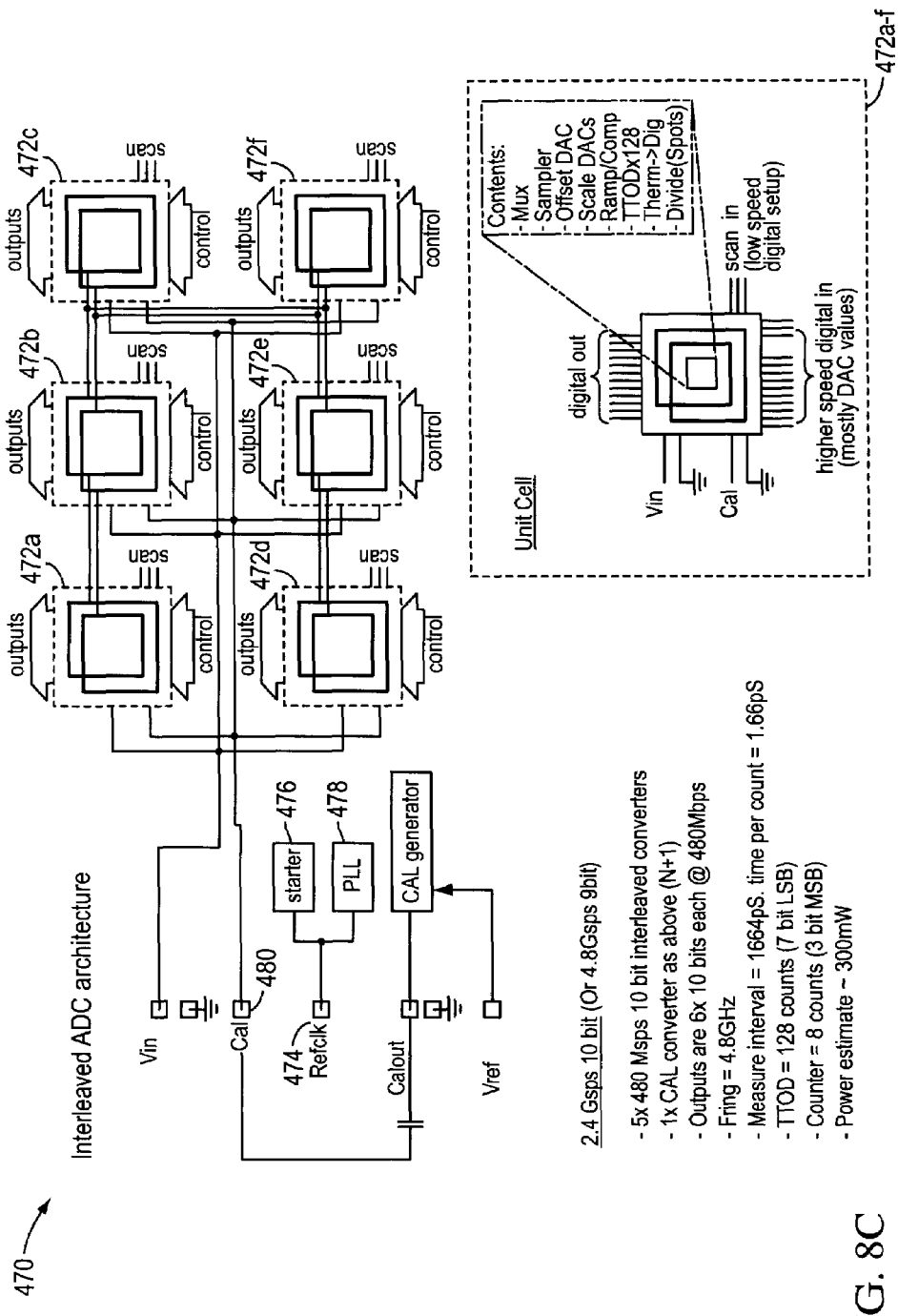
FIG. 8C shows an interleaved ADC architecture.

FIG. 8C shows an interleaved ADC architecture 470. In this architecture, there are a number of identical unit cells 472a-f, one cell of which is selected for calibration and the rest selected for normal conversion. Each unit cell 472a-f includes the previously described conversion components, i.e., a rotary traveling wave oscillator, an analog signal sampler, a ramp generator, a comparator, and a TDC. Additionally, each unit cell includes a multiplexer for allowing the cell to be selected, calibration circuitry that includes an Offset DAC, and a Scaling DAC, a thermometer-to-binary code converter and, optionally, SERDES for transmitting the conversion results.

The rotary traveling wave oscillator in each unit cell, in the interleaved architecture, is a multiple rotation oscillator, as described above. The multiple rotation oscillator, in one version, uses ten (10) rotations of 208 pS each (where a rotation is defined as one lap around the ring, so the ring operates 4.8 GHz and ten rotations is five periods of the oscillator). The ten rotations at 208 pS give a total conversion interval of 2080 pS per ring. Of this time, two rotations (416 pS) are used for the sampling interval and eight (1664 pS) are used for the TDC conversion interval. Each ring 472a-f has an ability to resolve 10 bits, 3 (the MSBs) of which are provided by the eight rotations and 7 (the LSBs) of which are provided by the TDC. Thus, each bit resolvable by the conversion represents about 1.625 pS of time.

The figure shows that five unit cells 472a-e are active at any one time and an additional one 472f is in calibration. With five active rings and each converting a sample in 2080 pS (1 sample/2080 pS=480 Msps, where sps is samples per second), the total sampling rate is 5□480 Msps=2.4 Gsps, each sample being 10 bits. It is estimated that the total power in operation for such a system is about 300 mW.

As is also shown in the figure, the rotary traveling wave oscillators of each ring 472a-f are interconnected such that they are phase synchronized with each other, thus creating an array of rotary oscillators, which enhances their stability and exhibits very low phase noise. This guarantees that the conversion interval in a ring is in almost perfect synchrony with every other ring, thereby making the interleaving of the rings feasible.

A reference clock 474 is provided to a starter circuit 476 that provides the startup mechanism for the rings, and a phase locked loop 478 to assure that the rings are all locked to the reference clock frequency.

Each ring receives a voltage input for conversion or a calibration input for calibration. The calibration input 480 is a preferably the bipolar exponential waveform discussed in regard to FIG. 7B.

When a ring is selected for calibration, an algorithm is run to assure that the conversion is linear and that the TDC codes are monotonic and span the time of one rotation. In the algorithm, first the ramp generator is calibrated, then the TDC is calibrated. Ramp generator calibration includes both ramp offset calibration and ramp slope calibration. Ramp offset calibration is performed with 0 volts as the calibration input. Ramp slope calibration then follows. Because the TDC conversion interval is several, if not many, rotations, multiple adjustments of the ramp slope are possible. FIG. 8E shows mid-ramp corrections during the ten rotations of a ring. If there are a non-linearities in the sampled analog signals after the sampling is completed, then the ramp slope is adjusted to obtain the correct final result. Each correction for a smaller input voltage is retained in the calibration of a larger voltage. In one embodiment, there are four corrections possible, one at every other rotation. In another embodiment, there are eight corrections possible, one at every rotation during the TDC interval. This means that, with good accuracy, non-linearities in the ramp can be removed. As mentioned above, when a digitally controlled current source is used as the ramp generator, it is easier to control the corrections that are needed in mid-ramp. The digital code to the digitally controlled current source is simply altered to make the correction.

After the offset and ramp generator have been calibrated for a selected ring, the TDC must be calibrated. This calibration is possible after the time constant for the calibration bipolar exponential waveform is determined. The bipolar exponential waveform is shown in FIG. 7B and has a maximum positive value of 1.25 volts and a maximum negative value of −1.25 volts and is synchronous to the ring clocks. Samples of the bipolar exponential waveform are stored in a memory device that is part of the calibration circuit so that the precise voltage of the waveform as function of time is known to the circuit. Therefore, the correct converter code output at the end of each rotation during the TDC interval is known by the calibration circuit. The calibration circuit thus needs to determine the monotonicity and span of the TDC between integer rotations. It does this by checking the codes resulting from the sampled signal to make sure that each bit in the code becomes a "one" only after the previous bit does. Corrections to the TDC to maintain monotonicity include adjusting the threshold of each TDC sampling circuit such as that shown in FIG. 4D.

Figure 8D:
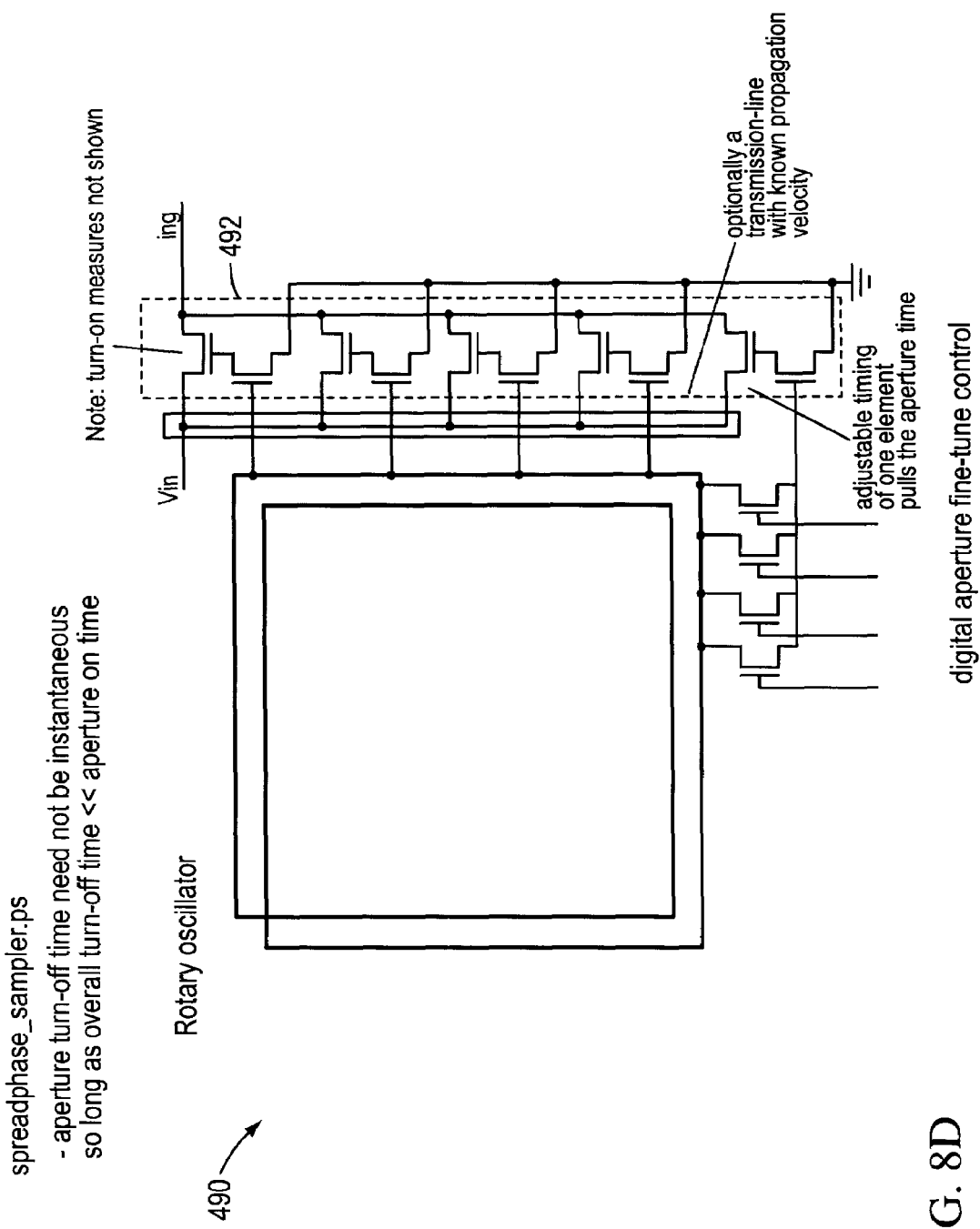
FIG. 8D shows a spread phase sampler circuit.
Figure 8E:
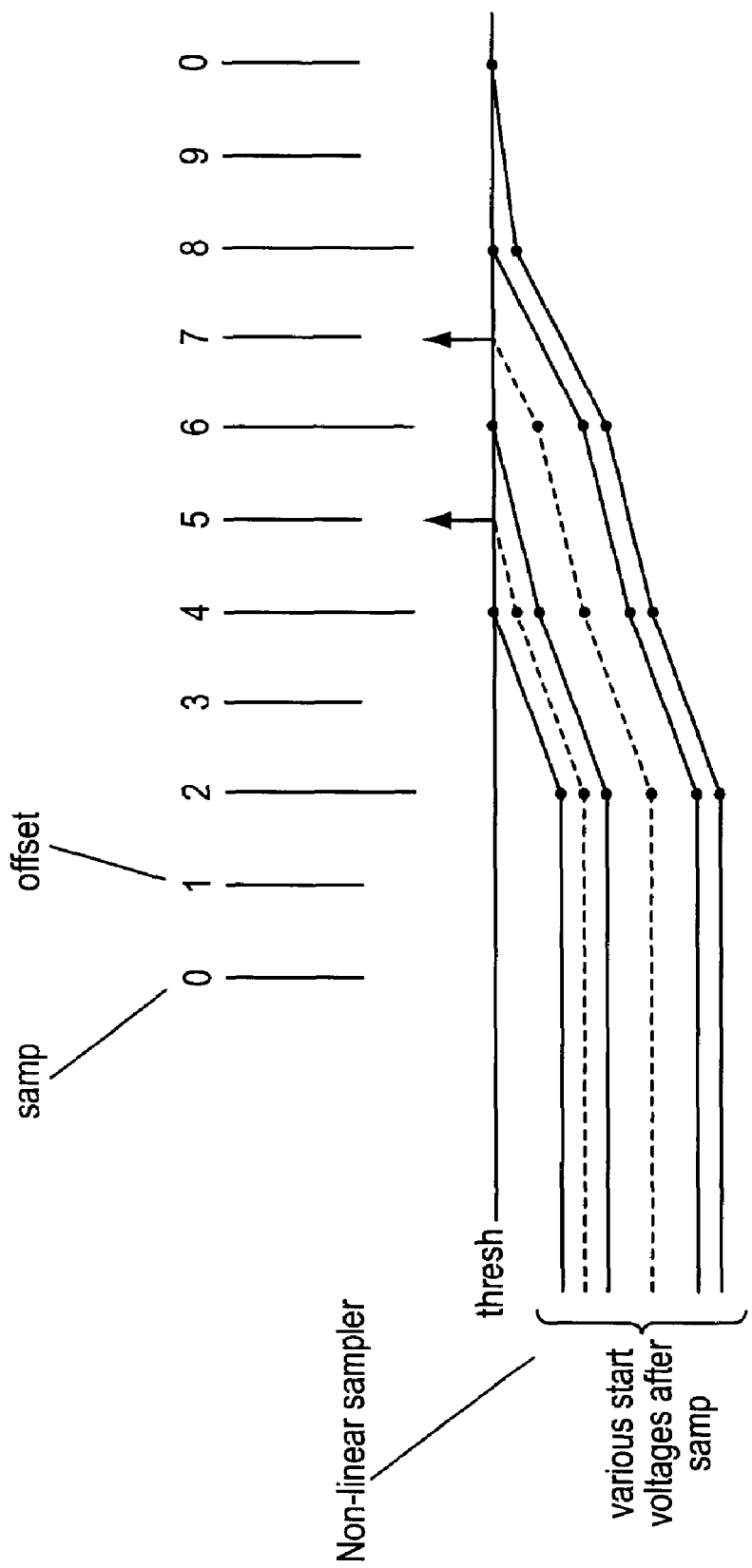
FIG. 8E shows the use of mid-ramp corrections.

FIG. 8D shows a spread phase sampler circuit 490 for use with the interleaved embodiment of FIG. 8C. The spread phase sampler 490 permits precise tuning of the analog signal sampling circuit. As described above, the closing of the sampling window is a critical operation in the ADC. To make closing of the window more precise and tunable, the circuit of FIG. 8D is used. Instead of a single sampling transistor such as that shown in FIG. 3A, the sampling transistor 492 is separated into a number of smaller transistors that are connected in parallel. Each of the smaller transistors has its gate connected to a gate-drive transistor whose gate, in turn, is connected to a tap of the rotary oscillator. Each tap that is connected to one of the gates is phase-wise close to the gate of the adjacent tap. A particular one of the smaller transistors has adjustable timing which is implemented by a selectable rotary clock tap for the gate of the gate-drive transistor for the particular transistor, allowing digital fine-tuning of the closing of the sampling window. The arrangement shown in FIG. 8D creates a more controlled turn off of the composite sampling transistor 492 and avoids the non-linearities of a single sampling transistor.

Figure 8F:
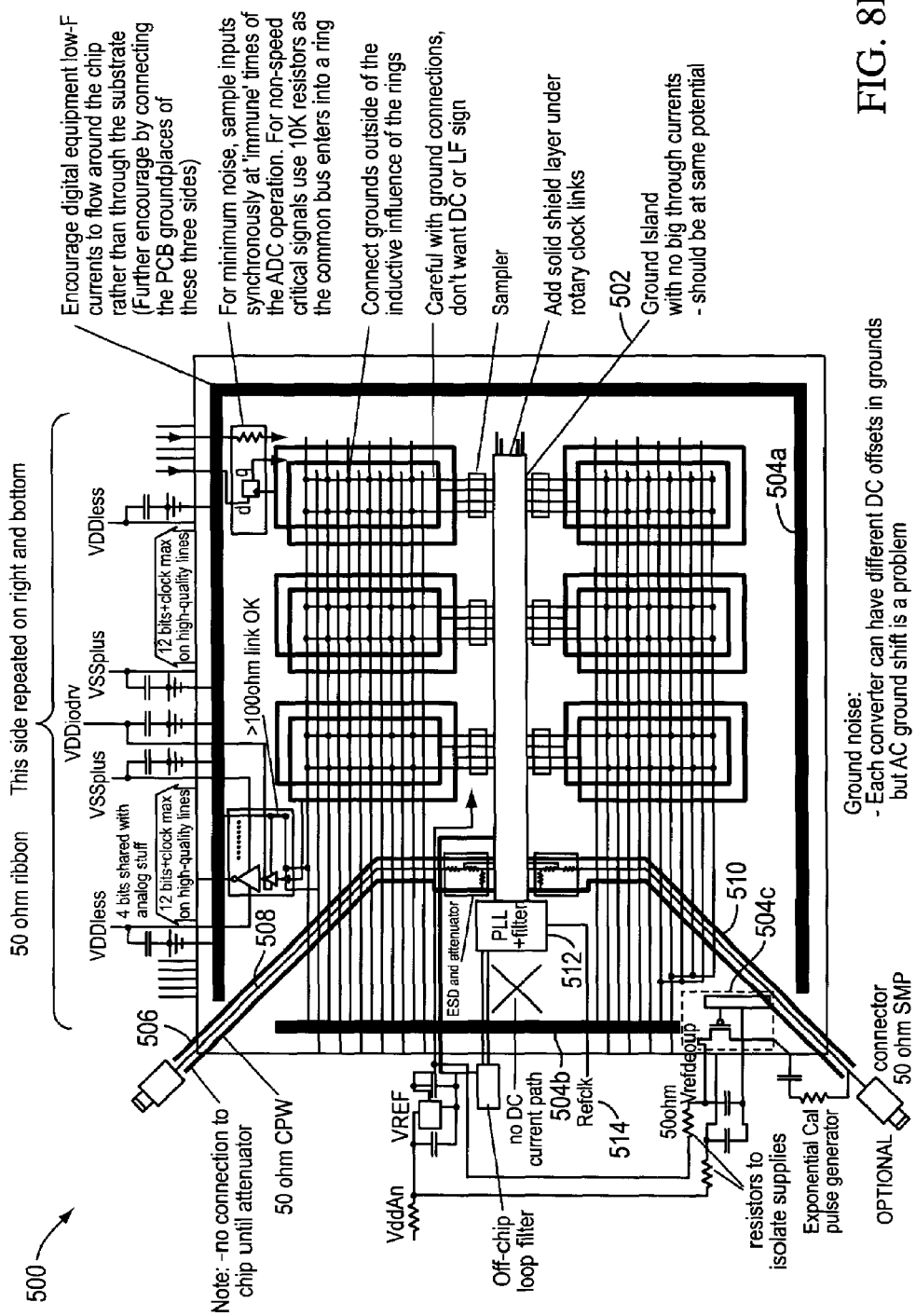
FIG. 8F shows an arrangement of various analog and digital grounds for a layout of an interleaved ADC architecture.

FIG. 8F shows an arrangement 500 of various analog and digital grounds for a layout of an interleaved ADC architecture. Care must be take to establish a grounding system that avoids mixing ground current of unrelated circuits. In the figure there is a large ground island 502 and a separate set of segments 504a, b that surround the periphery of the die. The large u-shaped portion of the ground ring 504a is used for digital currents. The second smallest segment 504b on the left side of the die is used for ground signal lines that traverse into the unit cells. Finally, there is small segment 504c that is used for the ground of the calibration circuitry. The input signal to be converted is introduced into the circuitry via a 50 ohm coaxial cable whose shield 506 connects to the large ground island 502 and whose center conductor 508 connects to the input attenuator near the large ground island. The calibration signal is introduced into the circuitry in a similar way, i.e., via a 50 ohm coaxial cable with its shield 510 grounded at the large ground island 502. The unit cells are connected via a synchronizing bus that runs over the large ground island. At the end of the synchronizing bus is a PLL 512 which is connected to a reference clock 514. This permit the rings to operate synchronously to the reference clock. The signal to be converted and the calibration signal are also bussed over the large ground island to samplers of each of the unit cells.

Figure 8G:
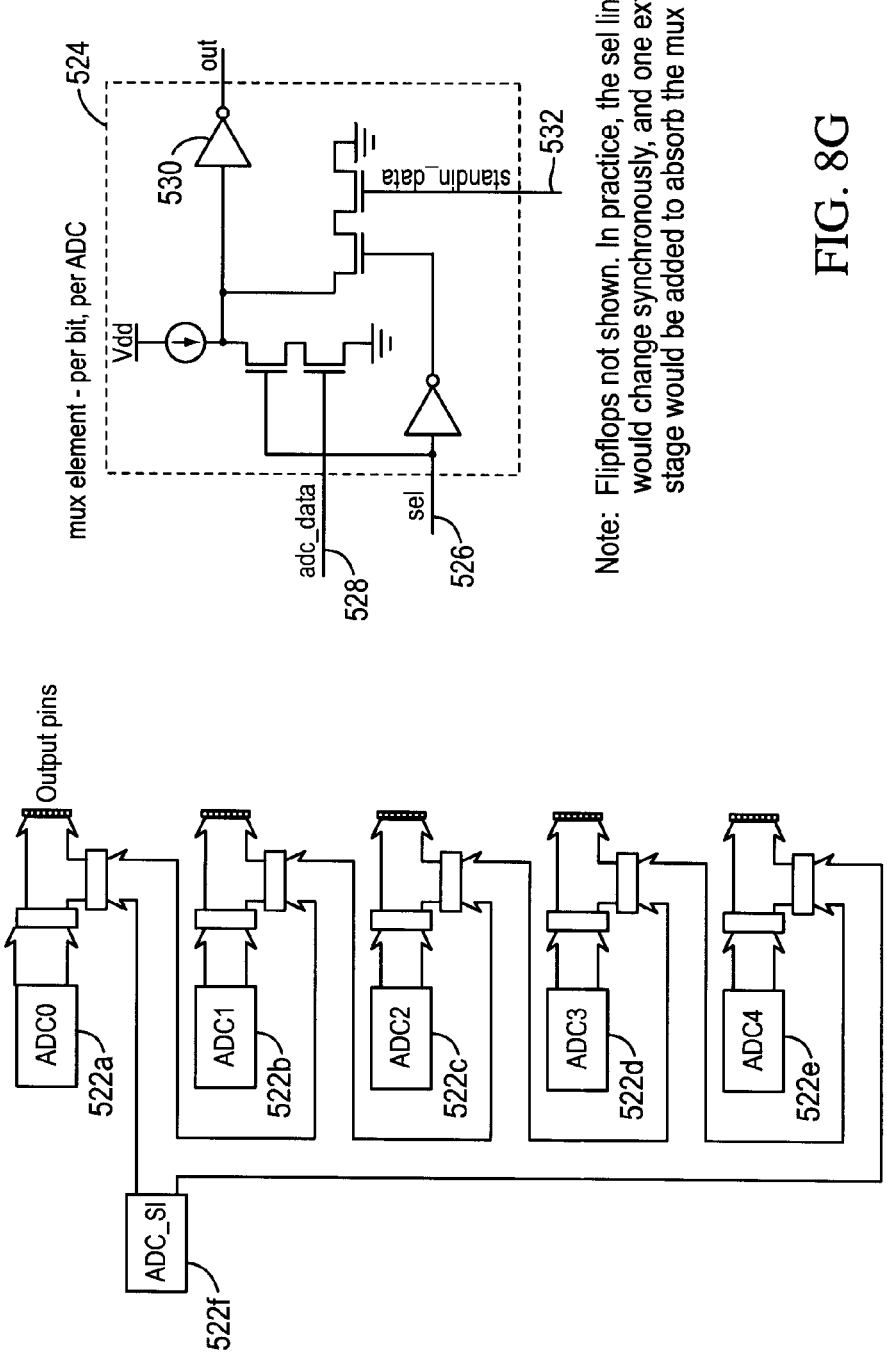
FIG. 8G shows an embodiment of the output multiplexing for an interleaved ADC architecture.

FIG. 8G shows an embodiment of the output multiplexing 520 for an interleaved ADC architecture. There are five unit cells ADC0-4 522a-e performing conversions at all times. One of the ADCs ADC_SI 522f is designated a stand-in cell and is capable of having its output multiplexed onto any of the other five ADC outputs. The multiplexer for each bit 524 is shown in the figure. When the select signal 526 is low, the adc_data 528 is blocked from the output buffer 530 and the stand_in data 532 is substituted.

One of the normal conversion units and the stand-in unit are synchronously switched after a sampling occurs. This means that there is at least one sample that has not been transmitted on the output pins after the switch occurs. Therefore, there is a delay changing the output multiplexer. The delay must allow the last sample of a switched out unit cell to be propagated on the output.

Figure 8H:
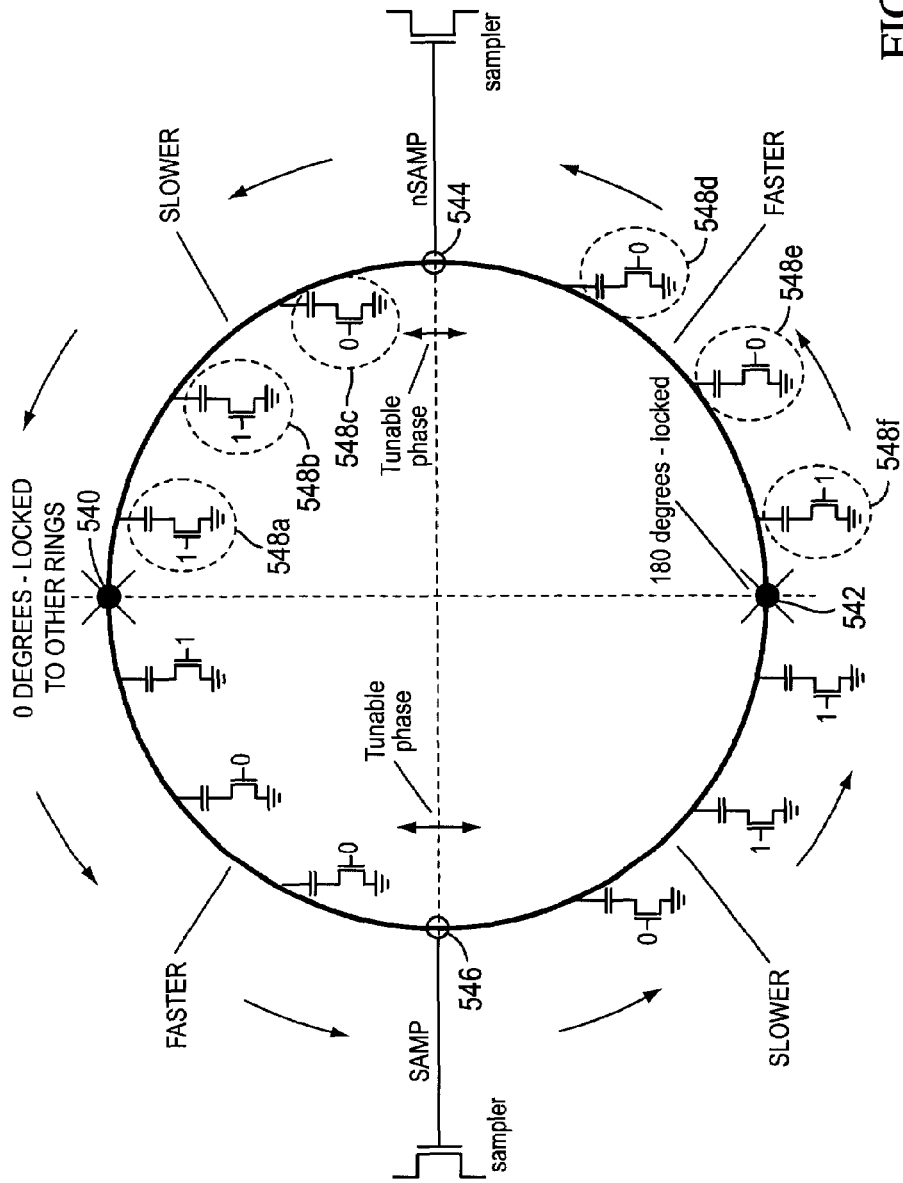
FIG. 8H shows a way of tuning rotary clocks in the individual unit cells so that the interleaved sampling can be precisely controlled.

FIG. 8H shows a way of tuning rotary clocks in the individual unit cells so that the interleaved sampling can be precisely controlled. FIG. 8C shows the rotary oscillators of the unit cells interconnected so as to injection-lock the oscillators. However, the injection-locked oscillators may need to be tuned to precisely align the sampling point in a cell. This is accomplished by recognizing that there are tap points (0 and 180 degrees are shown, 540, 542) on the oscillator that are essentially fixed in phase (the taps that interconnect the oscillator to an adjacent oscillator), but that the potions of the oscillator ring can be sped up or slowed down without disturbing the timing of these fixed phase taps. If the sample points are displaced, say at the 90 and 270 degree positions as shown 544, 546, from the locked points, switched capacitors 548*a-c* are used to speed up a portion of the ring between a locked point (say 0 degrees) and sample point (say 90 degrees), thereby moving the sample point closer in time to the locked point and by slowing down (via 548*d-f*) the portion of the ring between the sample point (90 degrees) and the other locked point (180 degrees), so as to not disturb the timing of the locked point (180 degrees). Similarly, if the sample point is nominally at 270 degrees and it is desired to move the sample point closed to the 180 degree point, the portion between the 180 and 270 is sped up and the portion between 270 and 0 is slowed down so as to not disturb the 0 degree lock point. The switched capacitors 548*a-f* are digitally controlled, as shown.

Interleaving

An interleaved ADC design in which many of the ADC blocks are staggered in phase in order to obtain a higher effective sample rate of the input present the opportunity for an alternative to a resistive attenuator circuit. In an interleaved converter (where the inputs are highly oversampled), a termination impedance can be approximated by switched capacitor techniques. A capacitor, during its initial charging from zero volts, presents an impedance that is nearly linear. This impedance Z is approximately T/C where T is the time spent charging over the small linear portion of the RC exponential. As a numerical example, if the sample time is 125 pS, then a capacitance of 2.5 pF gives an input impedance of 50 ohms. This concept is attractive at very high interleaved sample rates. In FIG. 4A, the dump signal can be activated at the end of the ramp time and prior to sampling for each converter working off the input signal to assure that the charging of the input capacitance starts at zero volts. Note that the termination 'impedance' need not be 50 ohms. A mismatch with an impedance of greater than 50 ohms gives a voltage boost at the input (because of the positive mismatch) This can be exploited for lowest power for a given ADC input voltage. A back-terminated driver that feeds the ADC is able to drive with smaller swing and less power when the ADC is 'terminated' at higher-than characteristic impedance and the back-terminated driver is able to absorb the reflections.

Use of Bipolar Transistors

Figure 9:
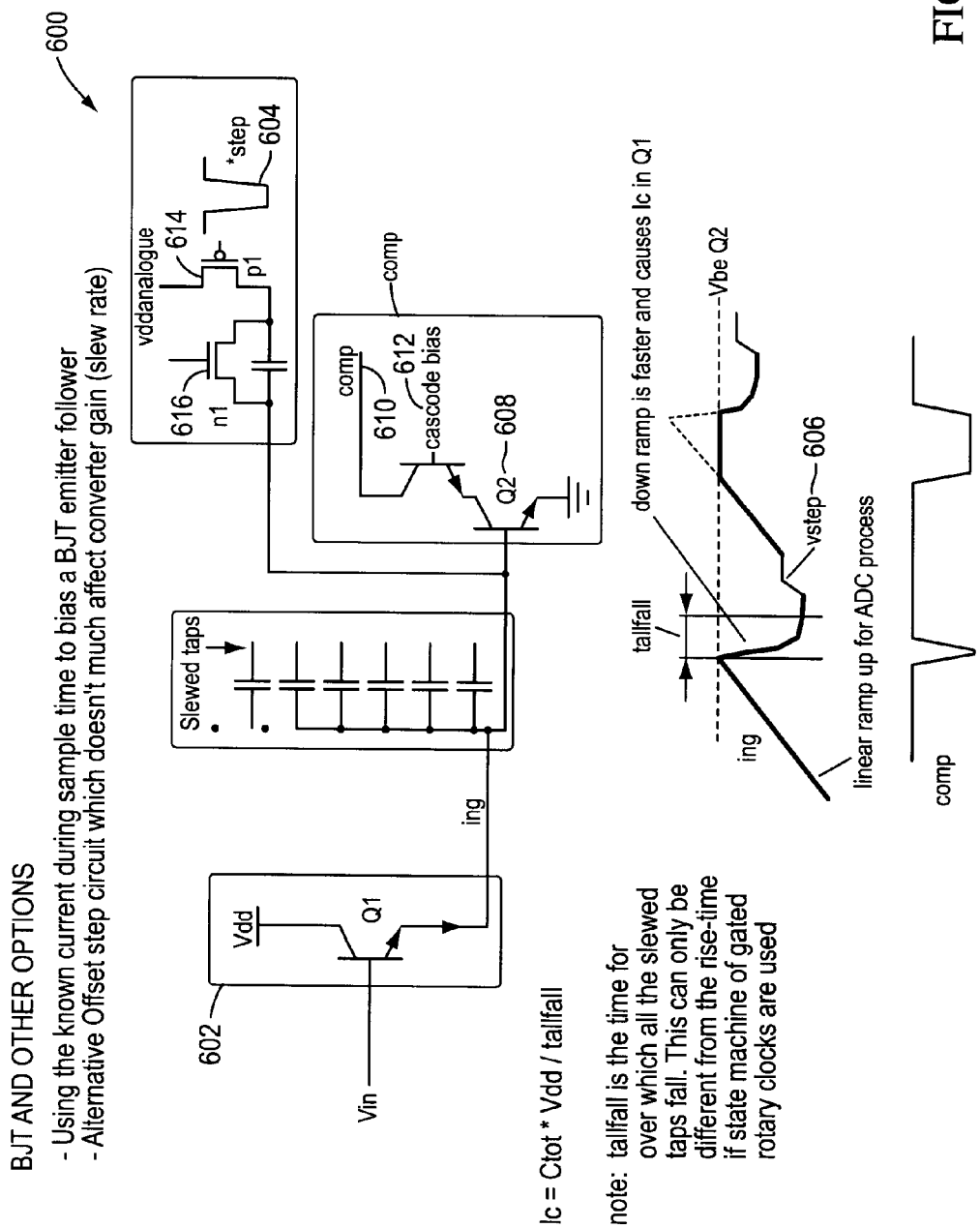
FIG. 9 illustrates the use of BJTs in the circuitry of the present invention.

An alternative to CMOS is the use of bipolar transistors. FIG. 9 illustrates the use of BJTs in the circuitry of the present invention. An NPN bipolar transistor 602 is arranged as an emitter follower which uses the slope of the ramp as a current source. Sampling ends when the step pulse 604 arrives. This produces a small voltage step vstep 606, which turns off Q1 602, because the input slew rate is much less than the slew rate of the ramp which follows. The comparator Q1 uses the Vbe of the bipolar transistor Q2 608 to determine when the linear ramp exceeds the threshold, at which point the comp 610 signal falls. A cascode biasing scheme 612 is used for transistor Q2 608. The step signal 604 that is applied to the step circuit is a short negative going pulse produced by transistor P1 614. Because P1 614 turns off after the pulse, the capacitance is not seen by the circuit during the ramp time. The short pulse 604 also has the beneficial effect of lifting the ramp which helps to reduce deadtime. Transistor N1 616 is used to clear the capacitor during the sample time.

Figure 10:
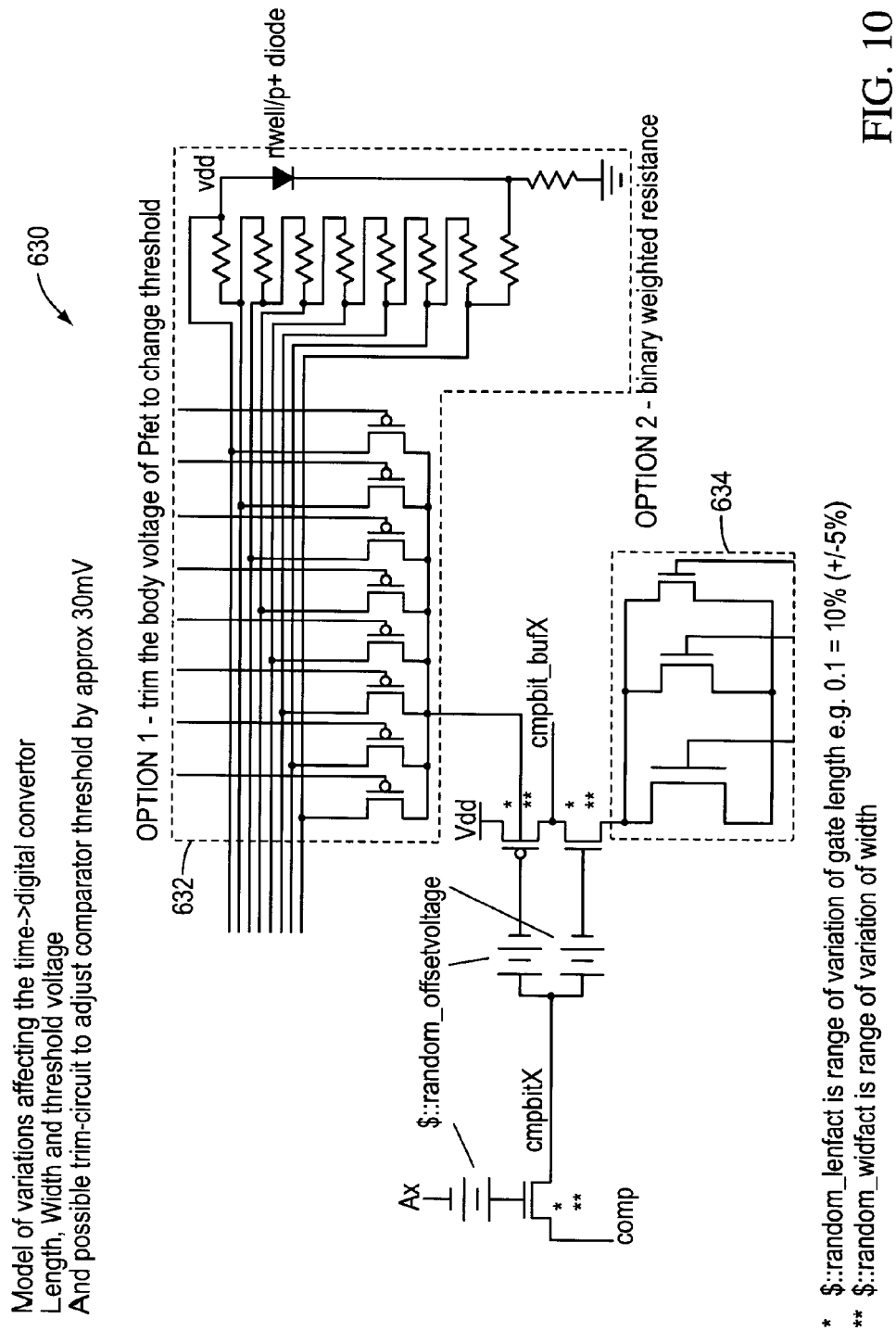
FIG. 10 illustrates model variations that affect the time-to-digital converter.

FIG. 10 illustrates model variations that affect the TDC. These model variations which affect the accuracy of the TDC include length and width of the sampling transistor and buffer and the threshold voltage of the buffer. The length variation is about ±5%. Also shown in FIG. 10 is one way of trimming the parameters of the model to control the threshold voltage of sampling transistors in the TDC. In option 1 632, the body voltage of the PFET is trimmed to control the threshold voltage. In option 2 634, a resistance (preferably, binary weighted) is added to the NFET. Adjustments in the range of about 30 mVolts are possible.

Figure 11B:
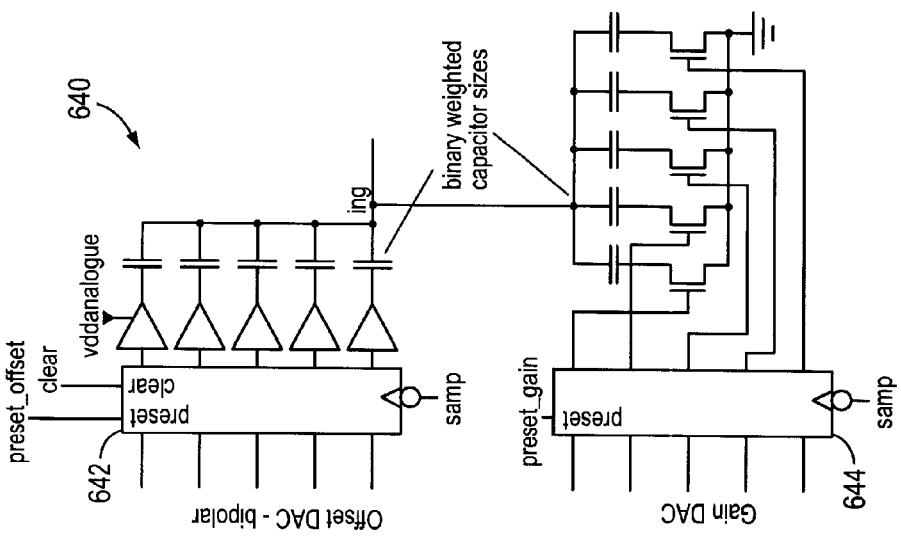
FIGS. 11A and 11B illustrate the calibration DACs and their operation in the present invention with a four-rotation converter.
Figure 11A:
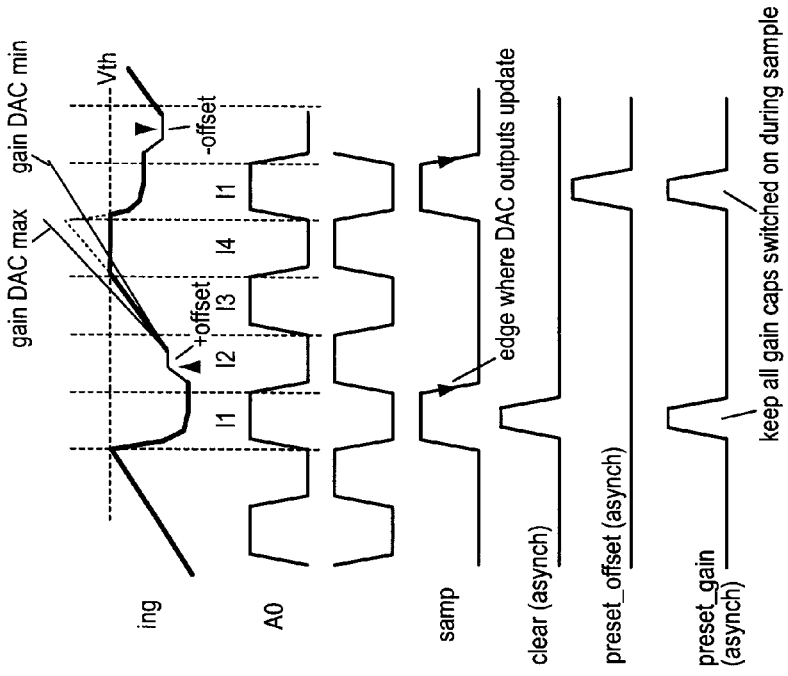

FIGS. 11A and 11B illustrate the calibration DACs and their operation in the present invention with a four-rotation converter. As mentioned above, a four-rotation converter has four intervals I1-I4 during which the sampling and the TDC operations are performed. In the example shown in FIG. 11B, the samp signal occurs in I1, as well as a clear, a preset_offset, and a preset_gain signals. These signals affect the Offset DAC and Scaling (Gain) DAC shown in FIG. 11A and these two DACs control the offset voltage and rate of the ramp, respectively, on the ing node. The offset DAC 642 is cleared, in FIG. 11B, and the Scaling DAC 644 is preset, in FIG. 11B, during the sample interval so as to not affect the sample. The DACs 642, 644 are then updated (on the edges) at the end of the sample interval to apply an offset and a scaling to the ramp that follows. The Offset DAC 642 can be bipolar, as shown in FIG. 11B, by either clearing, via the clear signal, or presetting, via the preset_offset, all of the outputs during the sample time to set the sign.

Figure 12:
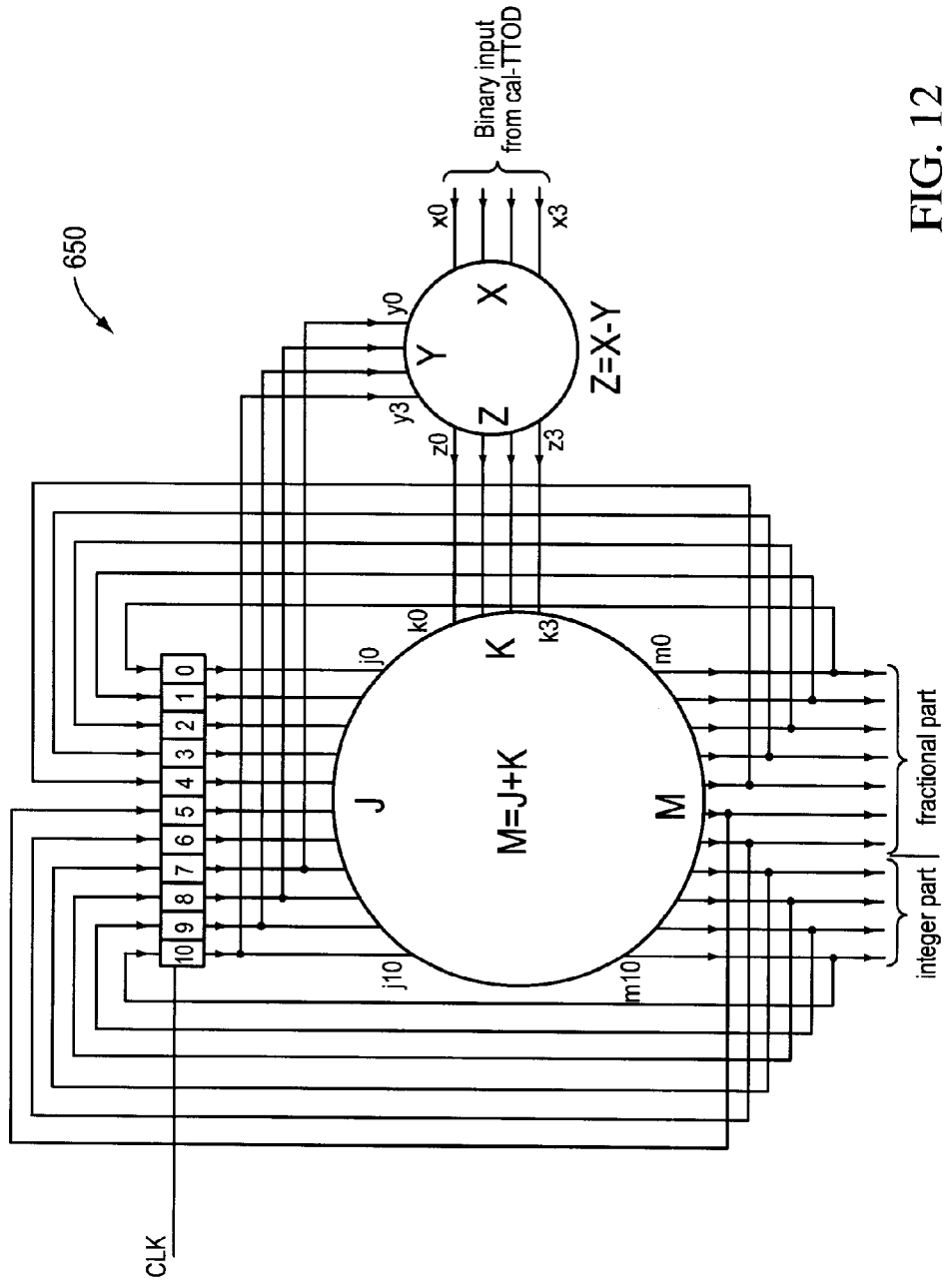
FIG. 12 illustrates a digital filter used to create the binary output from the Cal-TDC.

FIG. 12 illustrates a digital filter 650 used to create the binary output from the Calibration TDC (CTDC). Results from the CTDC are essentially error measurements. The error code when the calibration fragment is presented with a zero calibration voltage shows the size of the offset error. The error code when the fragment is presented with the maximum calibration voltage shows the size of the error in the scale factor. The error measurements cannot be acted upon directly as feedback to the calibration DACs, because the measurements are noisy due to a single fragment being used. Therefore, a long-running average of the error measurements is accumulated separately for the offset and gain errors to filter and attenuate the noise. This produces a stable error measurement with more resolution than the native converter has. To calibrate all of the fragments making up the converter, the fragment selected for calibration is changed regularly and multiple digital filters are used to average the endpoint errors of each fragment independently (or in interests of simplicity, all results are accumulated together). Below is a suitable algorithm in C code, which can be translated in Verilog easily to produce an exponential (RC like) filter.

```
int filterlen = 128;  //for example - pick binary number
int filtered;
long accumulator =0;
for (;;) {
    newval = readfragment( );       // from cal-ttod
    filtered = accumulator / filterlen;   // filtered result
    accumulator += (newval - filtered);   //accumulator has integer
                                          // and fractional part
}
```

Figure 13:
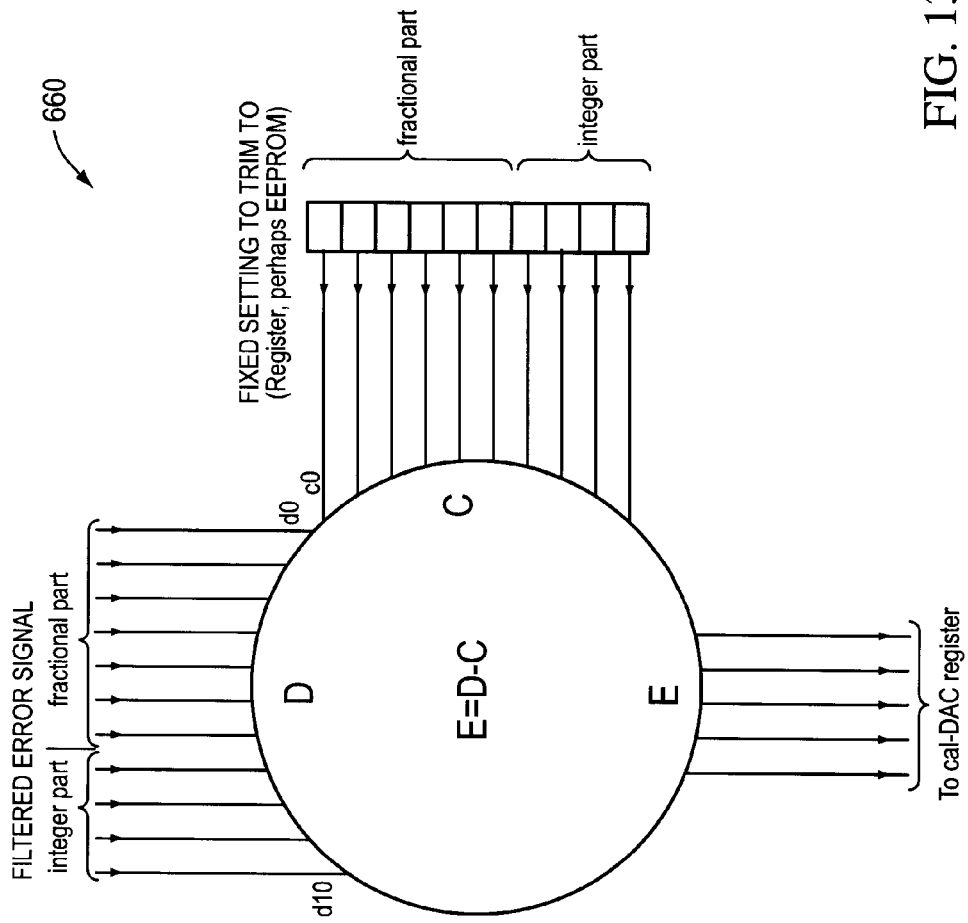
FIG. 13 illustrates the digital compare and feedback for offset and scale control.

FIG. 13 illustrates the digital compare and feedback for offset and scale control. Digital control circuits 660 act upon the pair(s) of filtered results to drive the Offset DAC and Scale DAC values respectively to achieve a steady mid-range code in the averaging filter. There is the option of trimming the converter as a whole or having different DACs for each fragment.

Midrange Trim(s)

Even with the endpoints of the converter trimmed, there is a likelihood of a 'bow' in the transfer characteristic. For multi-rotation converters where a counter counts up clock cycles for MSB, it is convenient to use the CTDC (duplication section in this case) to get the error-measurement result each time a complete cycle completes, i.e., at minimum mid-span corresponding to 0 volt input in a signed-input converter which used four rotations (two complete clock cycles) to convert. Through control of the timing and setting of scale DAC bits, the ramp rate can be boosted (or by reverse logic slowed down by not releasing the scale capacitors) to correct for a bump in the transfer characteristic regardless of the reason it might occur. This system does not preclude a more complex self-trim of perhaps all the codes and where the TDC section is also tuned until the correct codes are found.

Overhead of Fragmentation

The overhead of the fragmentation system can be made quite low. The total size of the all the components to achieve a low noise converter is already so large that they would ordinarily be constructed by parallel connection of FET stripes and capacitor unit cells. Obviously, there is some area wastage, by a factor of 1.333 for a 3 fragment design, as only two fragments are usefully doing conversions. The size of the digital filters is very reasonable in DSM CMOS.

FIG. 14 illustrates a thermometer decoder 680 in accordance with an embodiment of the present invention.

Thermometer->Binary Converter (Bubble Correction)

The flash-like output stage is a thermometer code (it could also be a circular code in another embodiment where the comp signal drives the gates of the FETs and the clocks drove the sources of the TTOD FETs), and as such suffers from the possibility of 'bubbles' in the code, which are places in the thermometer code with false transitions. For example, assuming the ideal thermometer code is '11111100' (from lsb to msb) for an input signal approaching the full scale of a 3-bit ADC, an erroneous result such as '11110100', where the 4th bit from the right has a 0 instead of a 1, can occur. This is typically a result of threshold voltage mismatch between transistors making up the TTOD. If the input voltage increases a little further then the 'bubble' is likely to disappear as the comparator with the mismatched threshold trips with the slightly higher input voltage. The possibility of bubbles in the thermometer code complicates the conversion of the code into binary. Bubbles are typically present only around the transition-code region of the outputs; farther away from the transition there are large unbroken strings of 1's and 0's. The approach taken to deal with bubbles here is simply to "Count the 1's"; a low-power scheme is shown in FIG. 14, using a combination of 'ones counters,', grouping and table lookups. In the example given below, an 8-bit converter (255 thermometer codes) and a 4-code subgroup is assumed.

Counting the number of 1's in the thermometer code can be done with a sequential (shift register) technique, although this is too time consuming. Instead, the task is broken down into smaller tasks. First, the thermometer code are grouped into sets of say, 4 bits (shown in FIG. 14), which can quickly be checked for the "all ones" condition. If the "all ones" condition is not present, then the 4 bits is examined further. Local output signals "4ones" 682 transitions true when all members of the group are high and for each such active output, a 4 (decimal) should be added to the final binary number. For the remaining bits to count, a special circuit 684, operates to count the ones. Enabling logic examines a 4-bit code group to the left of a current 4-bit group to determine if there is a "4ones" code to the left and the current 4-bit group does not have a "4ones" condition present ("look left and enable"). If these conditions are satisfied, the signal "localen" is activated in the current group and the group to the right of the local group. These count the potentially 'bubbly' areas and can be extended if required.

While it might seem sufficient to check just the 4 bits to the immediate right of the 4-bit group with the transition, this does not allow for many bubbles, e.g., a code such as 1111.1110.1000 represents just a single bubble and would not be counted properly. Instead, two such sets of 4 bits are 'ones-counted'. (An assumption is made that there will be no bubbles in the groups that are three or more to the right of the last "4ones" group; they are assumed all-zero.) To take an example, suppose the thermometer code is '1111.1111.1110.0111.0000.0000'. The system outlined above finds a "4ones" condition to the left of the current group (which is underlined). This activates the one's counter for the current group and the group to the immediate right of the current group (shown with a double underline). The one's count for the current group is +3 and for the group to the right is +3.

| Thermometer Code | Group Values | Sum of Group Values |
|---|---|---|
| 0000.0000.0000.0000 | 0 + 0 + 0 +0 | 0 |
| 1000.0000.0000.0000 | 1 + 0 + 0 +0 | 1 |
| 1100.0000.0000.0000 | 2 + 0 + 0 +0 | 2 |
| 1110.0000.0000.0000 | 3 + 0 + 0 +0 | 3 |
| 1111.0000.0000.0000 | 4 + 0 + 0 +0 | 4 |
| 1111.1000.1110.0000 | 4 + 1 + 3 | 8 |
| 1111.1100.1110.0000 | 4 + 2 + 3 | 9 |
| 1111.1110.1110.0000 | 4 + 3 + 3 | 10 |
| 1111.1110.1111.0000 | illegal code | — |
| 1111.1111.1110.0000 | 4 + 4 + 3 | 11 |

Note, in the chart, that for the sake of a simplicity, the code 1111.1110.1111.0000 is an illegal code. A "4ones" code to the right side of a bubble, as shown, is not allowed unless additional decoding is employed. This restriction insures that the "4ones" outputs themselves are bubble-free. In a group-4 system, it means the tolerances must be such that a '0' bubble in the zeros does not occur more than 4 bits left of the main string of zeros. Also note that the right-hand most '0' is always low to force the converter to handle codes in the range of 0 . . . 255 and not 0 to 256, which would require an extra bit in the output.

Final Conditional Increment (Implementation)

The upper 6 bits of the converter are emitted by a table lookup, an NMOS only array using a precharged low-swing bus, and sense-amp type receiver. The localized 'ones-counters' produce a combined output between 0 and 6 binary. A table lookup can be enabled based upon the position of the rightmost '4ones' signal. Note that there are only 255 comparators, so the code does not overflow during addition. If there is a carry from the 2-bits added, the circuit simply selects the NEXT element of table code instead of incrementing the high-order 6 bits (effectively the same thing). The table code has been shown as binary encoded, though Grey coding would be beneficial from an average power standpoint in the transmitter circuitry. The exact number is unimportant, but binary-type numbers work best. For example, it is possible to have groups of 8 codes, and then use pairs of 4-counters to count the 1's in the bubbly regions.

Power Saving Measures

As was mentioned above, power (precharge dynamic power) can be saved if only a short-strip of zeros is recorded (the case where the comparator self-resets back to high). So long as the strip of zeros is more than a few group widths then the logic described above operates as expected. For groups within the second (right-hand band) of '1's' in this low-power mode, there will never be a set which the localen signal is active because for each group there is no left-hand group emitting '4ones' signal. As a consequence, output code is unaffected by the power-saving 'return to VDD quick' scheme for comp.

Figure 15A:
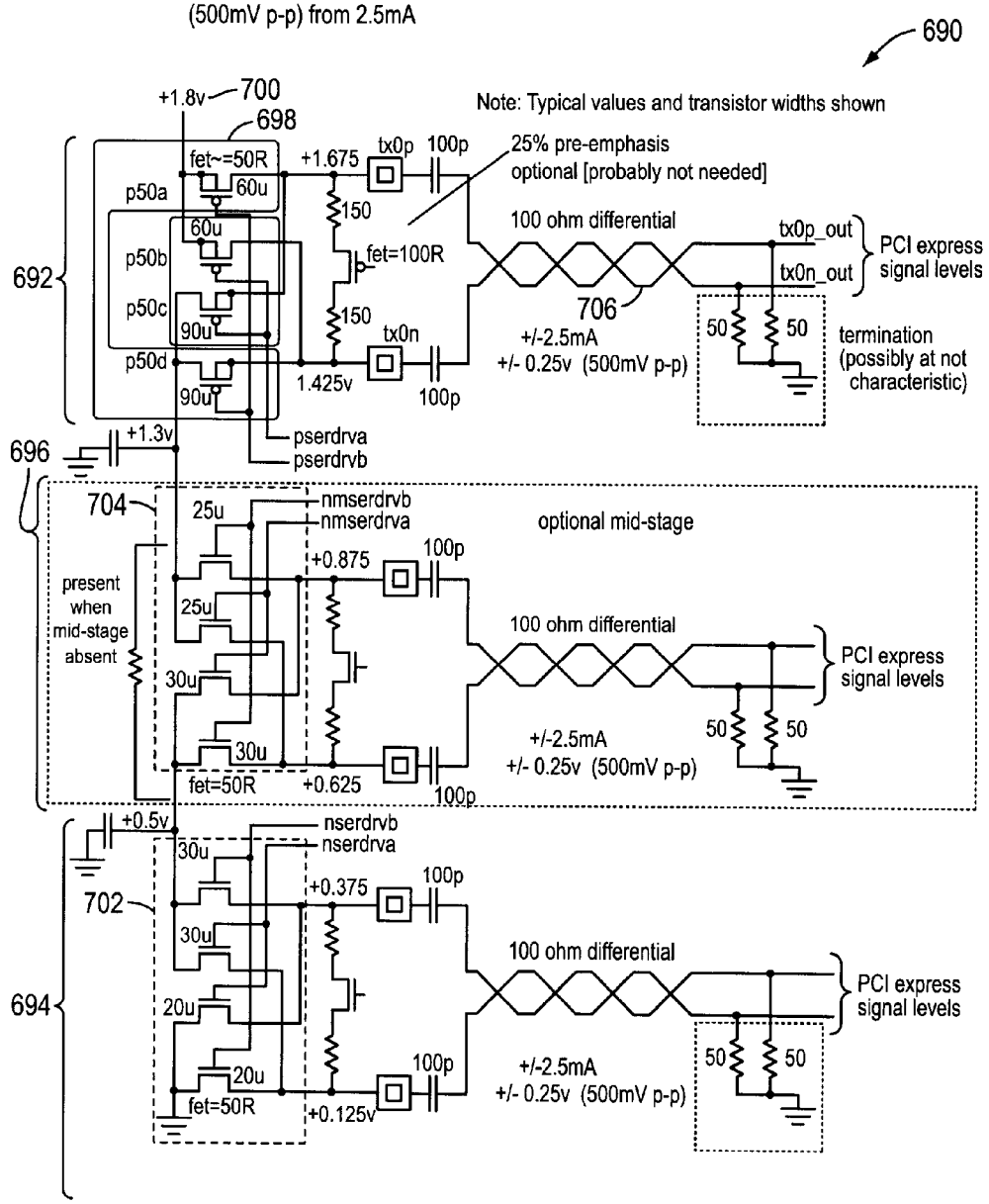
FIG. 15A illustrates a SERDES transmitter in accordance with an embodiment of the present invention.

FIG. 15A illustrates a SERDES transmitter described in copending application U.S. 60/716,552, entitled SERIALIZER/ DESERIALIZER DEVICE, which application is incorporated by reference into the present application. A brief description of the SERDES device follows. There are three SERDES channels 692, 694, 696 shown, though the mid-stage channel 694 is optional. The transmitter (e.g., 698) for each channel is designed to transmit a differential positive or negative voltage on a 100 ohm differential pair. The figure shows how a full-bridge FET switch can drive a push-pull differential signal with small swings, i.e., without the need of a full VDD swing. The circuits 698 are double pull-double through (DPDT) analog switches whose series resistance is set to suit the transmission-line medium's characteristic impedance. Choosing the transistor sizes to have nominally 50 ohms on-resistance provides a 'back-termination' resistance to the transmission-line and this is a very important feature to the second source of power saving, that coming from the receiver implementation. The same supply current passes through all channels which are effectively 'in-series', splitting the supply voltage VDD (1.8 v shown 700) among them. Although not shown, active regulators can control the intermediate voltages and shunt-type regulators operating between the different supply rails would still keep the currents shared.

To stack two circuits on a 1.8 v CMOS process, PFETs 698 are chosen to switch the top-side and NFETs 702 to switch the bottom sides. The figure shows a third 'middle' channel 704, which uses NFETs, but with the option of having the higher-voltage FET operate as a source-follower (again sized for approximately Z0/2 characteristic resistance).

The SERDES transmitter differential voltage is 500 mV p-p (±250 mV) in accordance with PCI-Express Mobile signal levels. Current in the differential pair of conductors 706 is ±2.5 mA. The transistors that establish the positive or negative differential voltage are coupled to the line capacitively, so that the average DC voltage level on the line is zero. An optional pre-emphasis circuit is provided.

Transistors p50*a* and p50*d* (in 698) each have a gate connected to pserdrvb. Transistors p50*b* and p50*c* (in 698) each have a gate connected to pserdrva. When pserdrvb is on (low), transistors p50*a* and p50*d* drive the transmission line with a differential voltage on tx0*p* that is more positive than tx0*n* and equal to approximately 250 mV. When pserdrva is on (low), transistors p50*b* and p50*c* drive the transmission line with a differential voltage on tx0*p* that is more negative than tx0*n* and equal to approximately 250 mV.

Note that for the transmitter circuit driving an AC-coupled transmission line the DC power consumption falls to zero if the output codes don't change. This encourages the use of Grey coding in the output bits rather than binary for the transmitter data source. Stacking the transmitters 'in series' saves power by running three channels from the same current, but has the problem that the DC levels of each output are very different. The capacitor coupling eliminates the DC component to make each output identical in signal level at the transmission-line medium.

Receiver

Figure 15B:
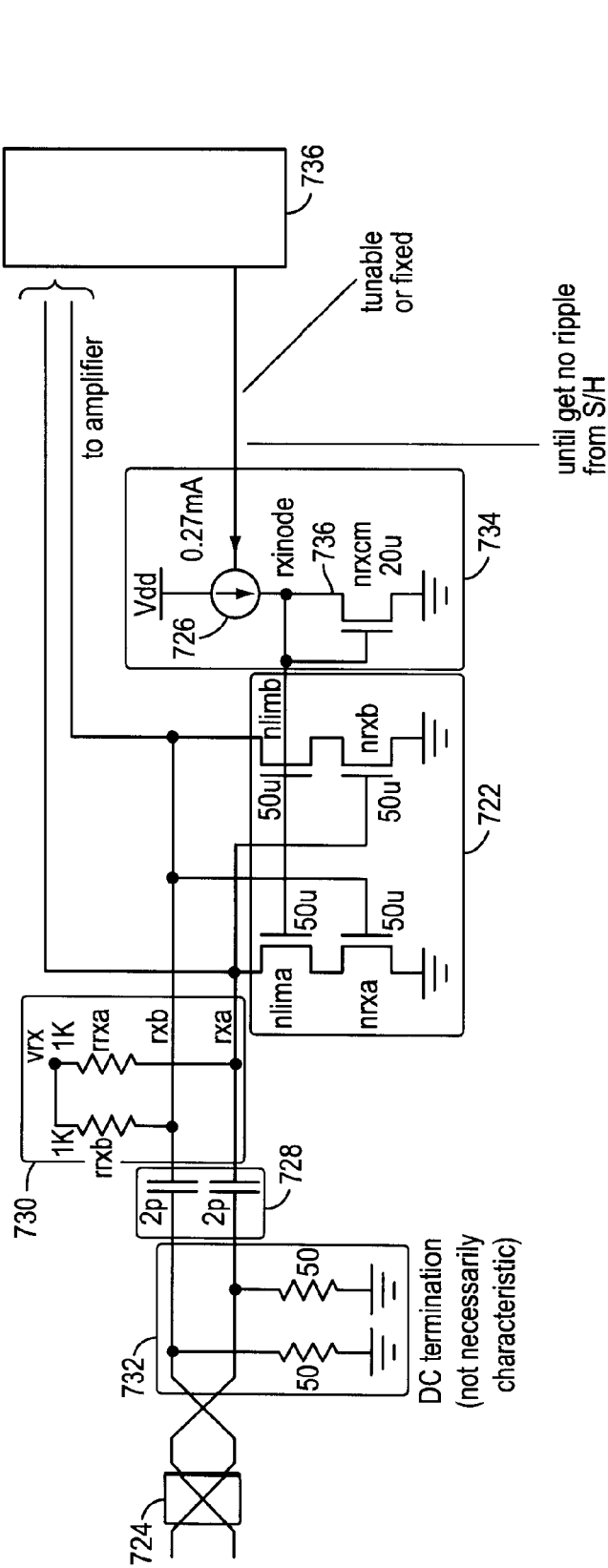
FIG. 15B illustrates a SERDES receiver in accordance with an embodiment of the present invention.

FIG. 15B illustrates a SERDES receiver 720 in accordance with the present invention. For each of the channels described above, there is a SERDES receiver 720 such as the one shown in FIG. 3A. The receiver, as a low-power design outlined here, is suitable as an IP block or as an interface chip. The receiver combines the functions of termination and a receive amplifier.

The SERDES receiver in an embodiment of the present invention includes a level-triggered latch 722 that differentially senses a voltage change on the differential pair 724 of conductors and holds the last detected state, a current source 726 for the latch, a pair of capacitors 728 for coupling the latch to the differential pair of conductors, a pair of pullups 730 connected to the latch, and a pair of DC terminators 732 whose value may not necessarily be that of the characteristic impedance of the differential conductor pair 724.

The receiver is designed to allow for AC coupling but does not need any kind of special DC balanced coding scheme and has full channel capacity. This is different from an 8b/10b scheme where the medium has to be designed to pass very high fidelity signals over a range of the bit-rate/5 to the bit-rate/2, making the effective bandwidth needed much more than 2:1 if margin is given for the simplistic RC coupling nature of the filtering. The circuit of the present invention operates by simply ignoring the low-frequency droop (which occurs as a consequence of having a potentially DC output scheme) using an RC filter and level triggered latch. An optional approximate doubling of voltage through high-impedance termination can help to save more power.

The level triggered latch 722 has an apparent threshold of zero-differential because the latch is similar to a differential amplifier. In terms of a received signal, the latch begins to move from its bistable state when the positive (+) and negative (−) inputs are not the same potential. Beyond this threshold, the latch tends to amplify the imbalance and help the swing toward the other bistable state. The 'droopy' nature of the signals at the receiver termination resistors, though appearing unacceptable for a conventional receiver, is of no concern here, as no circuit in the present invention directly senses these signals relative to a particular fixed ground or voltage reference through a DC connection.

Ideal latch 722 operation occurs where the received signal at transition coincides with the self-bias 'flip-voltages' (that is, the bistable voltages which the latch would retain if the input were disconnected). For a frequency-dependent lossy medium, the expected increasing swing measured beyond the transition time is largely absorbed by the highpass filter on the front end.

The current source 726 includes a programmable reference source 734 with a transistor nrxcm 736, which is diode-connected. The gate voltage of transistor nrxcm 736 sets the current in transistors nrxa and nrxb via transistors nlima and nlimb of the latch 722. The sensitivity of the latch 722 is set by the amount of current in the latch. When a positive voltage change occurs on the differential pair of conductors, a positive going pulse is produced on rxb compared to rxa. This causes transistor nrxa to turn on and transistor nrxb to turn off. Because the gate of nrxa is connected to the drain of nlimb and the gate of nrxb is connected to the drain of nlimb, the latch 722 holds on the line the last sensed change on the differential pair of conductors. When a negative voltage change occurs on the differential pair of conductors, a negative going pulse is produced on rxb compared to rxa. This pulse turns on transistor nrxb and turns off nxra, holding a new state on the differential pair of conductors.

The pair of capacitors 728 that couple the latch to the differential pair 724 of conductors and the pullup resistors 730 sets an RC time constant that is longer than a single bit time on the line. This permits more than the coupling of the wavefront of the change on the line to the latch and allows the latch to have an effect on the line.

Pre-emphasis is not strictly necessary here even if the channel has a lot of frequency dependent attenuation. With the correct choice of the RC time constants, only transitions are acted upon by the latch not the actual level of the inputs. Also, there is little memory of previous bits that is longer than a bit time. In fact, the latch tends to counteract any rise of signal level beyond the first transition, automatically compensating, to some extent, for dispersion. It is very important to note that the circuit is not a differentiator and not subject to high-f noise sensitivity. As stated above, all of the time constants are on the order of or longer than one bit time. In the example circuits given, the RC time constant of the transmitter circuit is about 100 pF☐50☐=5 ns and the time-constant of the latch is 1k☐ ☐2 pF=2 ns. The signals at rxa and rxb are substantially faithful reproductions of the signals transmitted on the transmission-lines but with substantially all DC and low-frequency components removed. Higher-than-threshold swings (overdrive) of the input stage are also acceptable and the circuit behaves properly, but it is best to adaptively adjust the threshold for optimum noise immunity.

Adaptive Termination

An improved implementation self-trims on a bit-by-bit (or longer) basis to adjust the input "threshold" of the level-triggered latch. Given that the current bias in the latch 722 effectively sets the 'flip-voltages' of the latch and the 'threshold' is exactly half of this 'flip-voltage' difference (the signal level which needs to be overcome to change the input state), there is a mechanism to alter the threshold. Ideally, the input signal flips at exactly double this minimum. To determine when the correct threshold is achieved, a 'ripple detector' circuit 736 acts as a synchronous demodulator detector with an output corresponding +ve or −ve differentially to the overshoot or undershoot relative to twice the threshold. When operating at the correct threshold (bias current sets this) there is nearly zero output from the synchronous demodulator/detector and the overshoot and undershoot are approximately equal.

A feature of this circuit is zero static power in the transmitter. Unlike the schemes which prohibit DC content at the source, in the present invention the transmission-line current quickly and beneficially falls to zero when a continuous string of zeros or ones is sent.

Single-Ended Implementation

The example given has been for a differential signaling format. An equivalent single-ended system is straightforward and can potentially increase bandwidth or reduce pin count. Most of the signal integrity advantages attributable to differential systems are achieved here by AC coupling and low-frequency rejection of the highpass filter(s). To refute the generally held belief that differential is the only way to achieve low noise, it should be noted that Low-noise RF sources have historically always been single-ended while the noise immunity is achieved via the frequency selectivity of the RF circuit. Commercial Ultra-low AM and PM noise frequency synthesizers universally use 50 ohm coaxial single-ended cable and connectors.

A single pole RC highpass filter is shown, but a multi-pole RC or other kind of filter can be used. Low frequency noise is totally unimportant. Again, note that this is not a differentiator, the time-constant is generally not much less than 1 bit time or higher.

Figure 15C:
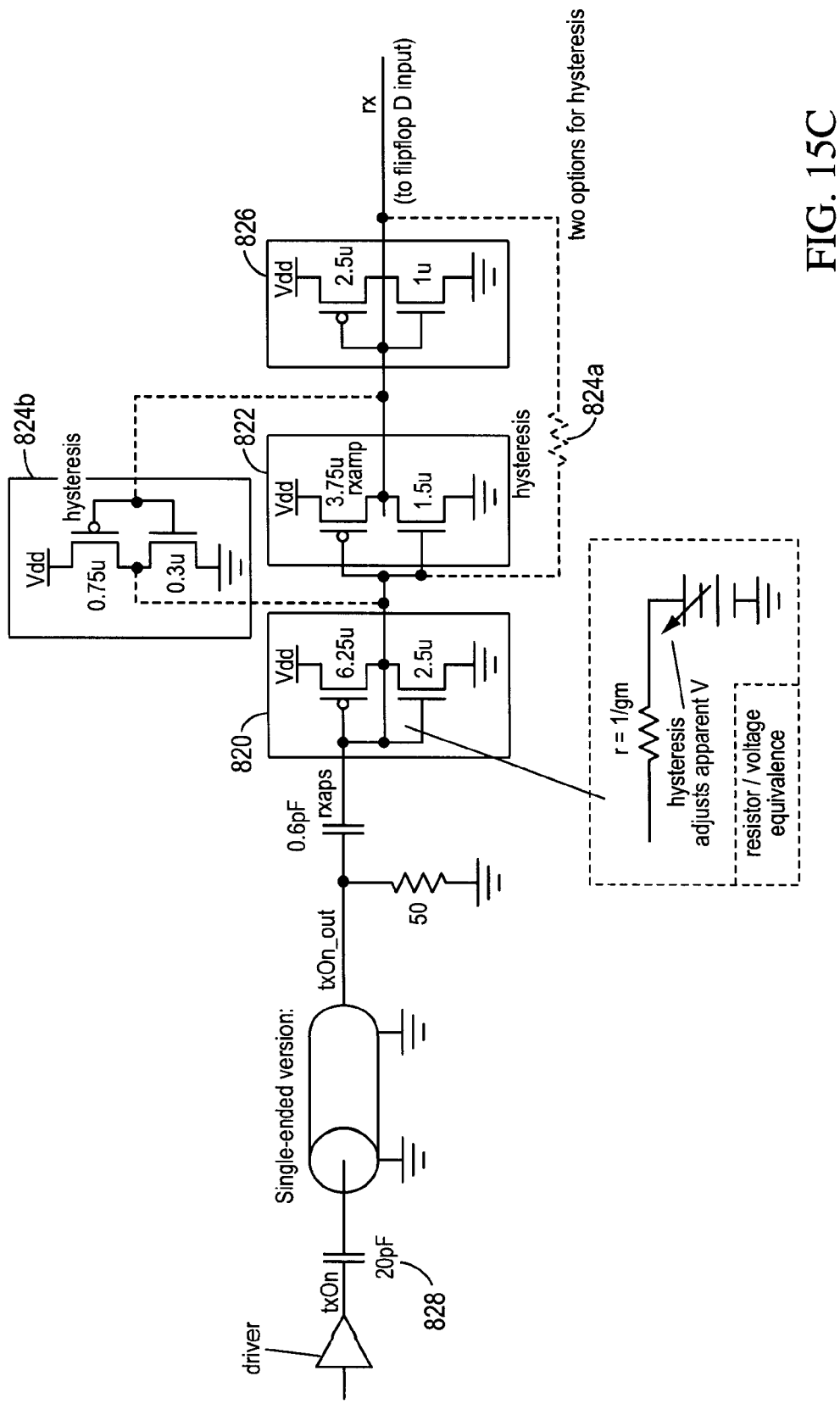
FIG. 15C shows the circuitry for a single-ended receiver.

FIG. 15C shows the circuitry needed for single-ended receiver. In the preferred implementation, a design without resistors and utilizing matched transistors has four main parts, (i) an active resistance device 820, (ii) a first inverting transconductance amplification element 822, (iii) a feedback path for hysteresis 824a, b, and (iv) second inverting transconductance amplification element 826. The second inverting transconductance amplification element 826 is optional and helps to bring the received signals to full logic levels. An active resistance device 820, such as a self-biased CMOS inverter (the output of the inverter is connected to the input), is used to implement the input "resistor." The resistor works with the input coupling capacitor 828 (probably on-chip) to form a single pole highpass filter. A self-biased CMOS inverter (such sa 820) has a stable voltage point that is approximately ½ VDD, but the resistance looking into the common output/feedback node is $1/g_m$ of the devices, where $g_m$ is the transconductance of the transistor. This resistance is typically 550 ohms with the transistor sizes shown. Therefore, the highpass filter has a pole at 1/RC=1/(550×0.6 pF)☐0.5 GHz. In one embodiment, the first and second inverting transconductance amplification elements 822, 826 are first and second CMOS inverters. The first CMOS inverter 822 has a standard inverter configuration with fairly large transistors. The feedback transistors 824b in the feedback path, smaller in size than those in the first inverter, have a standard inverter configuration and create hysteresis around the threshold of the self-biased inverter. The second inverter 826 is configured to boost the rxampl signal to a full swing logic at the rx output in order to drive a flip-flop D input (not shown). The self-bias and input filter also help to reject power supply noise.

Although the present invention has been described in considerable detail with reference to certain preferred versions thereof, other versions are possible. Therefore, the spirit and scope of the appended claims should not be limited to the description of the preferred versions contained herein.

What is claimed is:

1. A system for converting an analog signal to a digital signal, the system comprising:
    a multiphase oscillator having a period of oscillation and providing a plurality of phase signals, each oscillating at the period of the multiphase oscillator;
    a sample and hold circuit for capturing during a sampling interval an analog signal in response to a phase signal of the multiphase oscillator and for holding the sampled analog signal at the end of the sampling interval;
    a ramp generator connected to the output of the sample and hold circuit at a ramp node, the ramp generator operative to generate a ramp signal that starts at the voltage of the held analog signal;
    a comparator that provides a transition in an output signal when the ramp signal exceeds the reference voltage during a conversion interval that follows the sampling interval; and
    a time-to-digital converter connected to the output of the comparator, the time-to-digital converter operative, during the conversion interval, to sample, using phase signals of the multiphase oscillator, the comparator output signal and convert the comparator output signal to a multibit digital signal.

2. A system for converting as recited in claim 1, wherein the multiphase oscillator is a rotary traveling wave oscillator.

3. A system for converting as recited in claim 1, wherein the sample and hold circuit includes an NMOS transistor having a gate, source and drain and a channel defined between the source and drain, the gate being connected to the phase signal of the multiphase oscillator, the channel being connected between the analog signal and the ramp node.

4. A system for converting as recited in claim 1, wherein the sample and hold circuit includes:
an input attenuator connected between the analog signal and a first reference voltage and having first and second attenuated signal output;
a capacitor for holding a sampled analog signal and having one electrode connected to the first reference voltage;
a sampling transistor having a gate, source and drain and a channel defined between the source and drain, the channel of the sampling transistor being connected between the second signal output of the input attenuator and the other electrode of holding capacitor;
a precharge/discharge circuit connected between the first and second supply voltages and having an output connected to the gate of the sampling transistor and an input connected a signal defining the sampling interval, the precharge/discharge circuit pulling the gate of the sampling transistor towards a second supply voltage during the sampling interval and discharging the gate of the sampling transistor to the first supply voltage otherwise; and
a source follower circuit having an enable input connected to a signal from the multi-phase oscillator, the signal being slightly earlier in phase compared to the sampling interval signal, the source follower circuit being connected between the first signal output of the input attenuator and the gate of the sampling transistor so that the gate of the sampling transistor follows the voltage of the first output when the source follower circuit is enabled.

5. A system for converting as recited in claim 1,
wherein the analog signal has a slew rate; and
further comprising an auxiliary sample and hold circuit for sampling an indication of the slew rate of the analog signal and holding the sampled slew rate for use in correcting the sampled and held analog signal.

6. A system for converting as recited in claim 5, wherein the auxiliary sample and hold circuit includes:
an RC circuit for providing at an output node a differentiated version of the analog signal;
an auxiliary sample and hold circuit connected to the RC circuit output node and operative to capture the differentiated analog signal during the sampling interval and to hold the sampled differentiated analog signal at the and of the sampling interval; and
selection circuitry connected to the output of the auxiliary sample and hold circuit and operative to enable selection of either a positive or negative version of the sampled differentiated analog signal, said positive or negative signal being used to correct the sampled and held analog signal.

7. A system for converting as recited in claim 1, wherein the ramp generator includes a plurality of capacitors each having a first plate connected to a common node and a second plate connected to one of the phase signals of the multiphase oscillator, the common node of the plurality of capacitors being connected to the ramp node.

8. A system for converting as recited in claim 1, wherein the ramp generator includes a current source connected to source current into the ramp node.

9. A system for converting as recited in claim 8, wherein the current source includes:
a reference current source; and
a current mirror transistor into which the reference current source is reflected, the current mirror transistor driving current into the ramp node.

10. A system for converting as recited in claim 1, wherein the comparator includes an NMOS transistor having a gate, source and drain, and a channel defined between the source and drain, the gate being connected to the ramp node, the channel being connected between the output of the comparator and a reference voltage node.

11. A system for converting as recited in claim 1, wherein the comparator includes first, second, and third NMOS transistors each having a gate, source and drain and a channel defined between the source and drain, the channels of the first, second and third NMOS transistors being connected in series between a first reference voltage and a second reference voltage, the gate of the first transistor being connected to a phase signal of the multiphase oscillator, the gate of the third transistor being connected to the complement of the phase signal connected to the gate of the first transistor, the gate of the second transistor being connected to the ramp node, the output of the comparator being the drain of the second transistor.

12. A system for converting as recited in claim 1, wherein the time-to-digital converter includes a plurality of NMOS transistors each having a gate, source, and drain, and a channel defined between the source and drain, each channel being connected between the comparator output and a bit of the digital signal, each gate being connected to one of the phase signals of the multiphase oscillator.

13. A system for converting as recited in claim 1, further comprising an input attenuator circuit connected to a primary analog signal to attenuate the primary analog signal for use by the sample and hold circuit.

14. A system for converting as recited in claim 1,
wherein the sample and hold circuit is formed from a plurality of sample and hold fragments;
wherein the ramp generator is formed from a plurality of corresponding ramp generator fragments;
wherein the comparator is formed from a plurality of corresponding comparator fragments; and
further comprising a calibration circuit for calibrating the converter during the operation of the converter, the calibration circuit calibrating one of the plurality of sample and hold and corresponding ramp generator and comparator fragments while the other sample and hold and corresponding ramp generator and comparator fragments are used in the operation of the sample and hold circuit.

15. A system for converting as recited in claim 14,
wherein each of the fragments has at least an offset circuit and a scaling circuit, the offset circuit being operative in response to a calibration input to change the starting voltage of the ramp, and the scaling circuit being operative in response to a calibration input to change the rate of rise of the ramp; and
wherein the calibration circuit includes:
a first reference voltage source for providing a voltage used in calibrating the offset of the system;
a second reference voltage source for providing a voltage used in calibrating the scaling of the system;
a controller for providing calibration signals that select one of the fragments for calibration and select the other fragments for operation and that select either the first or second reference voltage for use in the calibration,
a calibration time-to-digital converter that is connected to the selected fragment of the comparator and operative to provide a digital signal that represents the voltage of a selected reference voltage source for the selected fragment;

an offset DAC that is connected to the calibration time-to-digital converter to receive the digital signal and is operative to provide a calibration input to the offset circuit; and a scaling DAC that is connected to the calibration time-to-digital converter to receive the digital signal and operative to provide a calibration input to the scaling circuit.

16. A system for converting as recited in claim 1, wherein the multiphase oscillator is a rotary oscillator with switching elements that maintain a traveling wave on the oscillator.

17. An analog to digital converter system comprising:

a plurality N of converter units, each unit being a converting system according to claim 1, wherein the multiphase oscillator of each unit is a rotary traveling wave oscillator, each rotary traveling wave oscillator is interconnected with at least one neighboring oscillator so that each unit operates with the same frequency and phase, each converter unit receives the analog signal to be converted, each converter has control inputs that permit it to be selected for normal operation or calibration, and wherein each converter unit has a conversion rate of R and an equal size multibit digital signal;

control circuitry for selecting one of the converter units for calibration and the remaining units for normal operation, the number of units N−1 selected for normal operation causing the conversion rate to be (N−1)*R, each conversion having the particular number of bits, the control circuitry being operative to provide the multibit digital signal from each conversion;

a startup circuit connected to a reference clock and to each of the oscillators to cause each oscillator to rotate in the same direction; and a phase locked loop connected to the reference clock to lock each of the oscillators to the reference clock.

18. An analog to digital converter system as recited in claim 17, wherein each converter unit includes calibration circuitry and a set of calibration controls that operate the calibration circuitry;

further comprising a calibration generator that provides an analog calibration signal to each of the converter units;

wherein the control circuitry is operative to select one of the converter units for calibration, to generate the analog calibration signal, and to adjust calibration controls of the selected converter unit to calibrate the unit.

19. An analog to digital converter system as recited in claim 18, wherein the calibration circuitry includes a ramp offset DAC.

20. An analog to digital converter system as recited in claim 18, wherein the calibration circuitry includes a ramp gain DAC.

21. A method for converting an analog signal to a digital signal, the method comprising:

sampling and holding the analog signal in response to one of a number of phase signals of a multiphase oscillator; and after holding the analog signal, generating a ramp signal starting at the voltage of the held analog signal, comparing the ramp signal to a voltage reference and providing a transition of a comparison signal when the ramp signal exceeds the voltage reference, and converting the comparison signal to a multi-bit digital signal by sampling the comparison signal with phases of the multiphase oscillator.

22. A method for converting as recited in claim 21, wherein the multi-bit digital signal is a thermometer code; and further comprising converting the multi-bit signal to a binary coded signal.

23. A method for converting as recited in claim 21, wherein the steps of sampling and holding and ramp generating are performed by circuitry composed of a plurality of fragments and each fragment has an offset and scale input; and wherein performing the calibration operation includes:

selecting out one of the plurality of circuitry fragments for calibration;

selecting one of a first voltage reference and second voltage reference signal;

detecting an error between the circuitry fragment and the selected voltage reference signal; and applying the error to one of the offset input and scale input of the circuitry fragment, depending on the selected voltage reference signal, to reduce the error.

* * * * *